(12) United States Patent
Satoh et al.

(10) Patent No.: US 11,614,686 B2
(45) Date of Patent: *Mar. 28, 2023

(54) RESIST COMPOSITION AND PATTERNING PROCESS

(71) Applicant: Shin-Etsu Chemical Co., Ltd., Tokyo (JP)

(72) Inventors: Hironori Satoh, Joetsu (JP); Tsukasa Watanabe, Joetsu (JP); Seiichiro Tachibana, Joetsu (JP); Satoshi Watanabe, Joetsu (JP); Tsutomu Ogihara, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 705 days.

This patent is subject to a terminal disclaimer.

(21) Appl. No.: 16/274,416

(22) Filed: Feb. 13, 2019

(65) Prior Publication Data

US 2019/0258160 A1 Aug. 22, 2019

(30) Foreign Application Priority Data

Feb. 22, 2018 (JP) .............................. JP2018-029264

(51) Int. Cl.
*G03F 7/004* (2006.01)
*G03F 7/20* (2006.01)
(Continued)

(52) U.S. Cl.
CPC .......... *G03F 7/0042* (2013.01); *G03F 7/0045* (2013.01); *G03F 7/0755* (2013.01);
(Continued)

(58) Field of Classification Search
CPC .... G03F 7/0042; G03F 7/0045; G03F 7/0755; G03F 7/0757; G03F 7/325; G03F 7/20; G03F 7/2004
See application file for complete search history.

(56) References Cited

U.S. PATENT DOCUMENTS

| 5,534,312 A | 7/1996 | Hill et al. |
| 5,554,664 A * | 9/1996 | Lamanna .................. C08F 2/50 |
| | | 522/31 |

(Continued)

FOREIGN PATENT DOCUMENTS

| JP | 2005-505691 A | 2/2005 |
| JP | 2012-185484 A | 9/2012 |

(Continued)

OTHER PUBLICATIONS

Office Action dated Dec. 23, 2019, issued in counterpart TW Application No. 108105532 (8 pages).

(Continued)

*Primary Examiner* — Martin J Angebranndt
(74) *Attorney, Agent, or Firm* — WHDA, LLP

(57) ABSTRACT

A resist composition is provided comprising (A) a metal compound having formula (A-1), a hydrolysate or hydrolytic condensate thereof, or the reaction product of the metal compound, hydrolysate or hydrolytic condensate thereof with a di- or trihydric alcohol having formula (A-2), and (B) a sensitizer containing a compound having formula (B-1). The resist composition is adapted to change a solubility in developer upon exposure to high-energy radiation, has high resolution and sensitivity, and forms a pattern of good profile with minimal edge roughness after exposure.

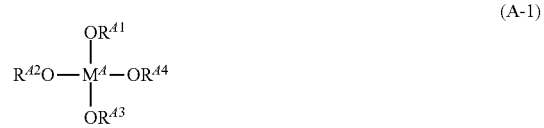

(A-1)

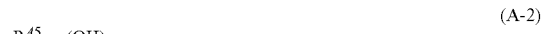

(A-2)

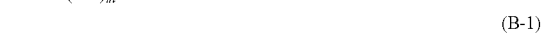

(B-1)

10 Claims, 3 Drawing Sheets

(51) Int. Cl.
*G03F 7/075* (2006.01)
*G03F 7/32* (2006.01)
(52) U.S. Cl.
CPC ............ *G03F 7/0757* (2013.01); *G03F 7/325* (2013.01); *G03F 7/2004* (2013.01)

(56) References Cited

U.S. PATENT DOCUMENTS

| | | | |
|---|---|---|---|
| 6,849,305 | B2 | 2/2005 | Bravo-Vasquez et al. |
| 7,537,880 | B2* | 5/2009 | Harada ................. G03F 7/0397 |
| | | | 430/270.1 |
| 8,759,220 | B1* | 6/2014 | Ogihara .................. G03F 7/094 |
| | | | 438/694 |
| 9,274,425 | B2 | 3/2016 | Hatakeyama et al. |
| 11,231,649 | B2* | 1/2022 | Watanabe ............ G03F 7/0382 |
| 2004/0248032 | A1* | 12/2004 | Zampini ................ C08G 77/24 |
| | | | 430/270.1 |
| 2009/0136869 | A1* | 5/2009 | Ogihara ................ H01L 21/316 |
| | | | 430/270.1 |
| 2010/0086872 | A1* | 4/2010 | Ogihara ..................... G03F 7/11 |
| | | | 430/323 |
| 2012/0208127 | A1 | 8/2012 | Hatakeyama |
| 2013/0005150 | A1 | 1/2013 | Ogihara et al. |
| 2014/0193975 | A1* | 7/2014 | Ogihara ..................... G03F 7/36 |
| | | | 438/702 |
| 2014/0273447 | A1* | 9/2014 | Ogihara ..................... G03F 7/00 |
| | | | 438/671 |
| 2014/0273448 | A1* | 9/2014 | Ogihara ..................... G03F 7/11 |
| | | | 438/671 |
| 2014/0377957 | A1* | 12/2014 | Takeda ....................... G03F 7/11 |
| | | | 438/703 |
| 2015/0099228 | A1* | 4/2015 | Hatakeyama ............. G03F 7/30 |
| | | | 430/270.1 |
| 2015/0210829 | A1* | 7/2015 | Shibayama ............... C08K 5/42 |
| | | | 438/703 |
| 2016/0231652 | A1 | 8/2016 | Hatakeyama |
| 2017/0115565 | A1 | 4/2017 | Hatakeyama et al. |
| 2018/0088463 | A1* | 3/2018 | Hatakeyama ......... G03F 7/0382 |
| 2018/0101094 | A1* | 4/2018 | Hatakeyama ......... G03F 7/0045 |
| 2018/0267406 | A1* | 9/2018 | Nagai ................... C07C 309/19 |
| 2019/0113846 | A1* | 4/2019 | Hatakeyama ......... G03F 7/0397 |
| 2019/0227432 | A1 | 7/2019 | Shiratani |
| 2019/0258160 | A1 | 8/2019 | Satoh et al. |
| 2019/0354016 | A1* | 11/2019 | Watanabe ............. G03F 7/0382 |
| 2019/0354017 | A1* | 11/2019 | Watanabe ............... G03F 7/095 |

FOREIGN PATENT DOCUMENTS

| | | |
|---|---|---|
| JP | 2015-075500 A | 4/2015 |
| JP | 6119544 B2 | 4/2017 |
| KR | 10-2016-0098059 A | 8/2016 |
| TW | 201305737 A | 2/2013 |
| TW | 201716866 A | 5/2017 |
| WO | 2014/185435 A1 | 11/2014 |
| WO | 2016/140057 A1 | 9/2016 |
| WO | 2018/043506 A1 | 3/2018 |

OTHER PUBLICATIONS

Hinsberg et al., "Extendibility of Chemically Amplified Resists: Another Brick Wall?", SPIE, 2003, vol. 5039, pp. 1-14, cited in Specification (14 pages).
Kishikawa et al., "Assessment of trade-off between resist resolution and sensitivity for optimization of hyper-NA immersion lithography", SPIE, 2007, vol. 6520, pp. 65203L-1-65203L-9, cited in Specification (9 pages).
Jones et al., "Fabrication of nanoscale ZnO field effect transistors using the functional precursor zinc neodecanoate directly as a negative electron beam lithography resist", J. Vac. Sci. Technol. B, vol. 27, No. 6, 2009, pp. 3164-3168, cited in Specification (5 pages).
Office Action dated Jul. 21, 2020, issued in counterpart KR Application No. 10-2019-0019973, with English Translation. (11 page).
Office Action dated Oct. 5, 2021, issued in counterpart JP application No. 2019-022218, with English translation. (5 pages).

* cited by examiner

RESIST COMPOSITION AND PATTERNING PROCESS

CROSS-REFERENCE TO RELATED APPLICATION

This non-provisional application claims priority under 35 U.S.C. § 119(a) on Patent Application No. 2018-029264 filed in Japan on Feb. 22, 2018, the entire contents of which are hereby incorporated by reference.

TECHNICAL FIELD

This invention relates to a resist composition and a patterning process.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The current technology is approaching to the processing size which is reduced below 50 nm as minimum line width. When the processing size is so reduced, the thickness of resist film must be reduced below 100 nm, depending on the surface material of the substrate to be processed, because of such factors as the structural strength to maintain the pattern against the surface tension of developer and the adhesion strength to the substrate. On use of prior art chemically amplified resist materials, no significant degradation of line edge roughness (LER) does occur with a resist film having a thickness of 150 nm, but LER is materially exacerbated when the film thickness is reduced below 100 nm.

As the feature size is reduced, image blurs due to acid diffusion become a problem (see Non-Patent Document 1). To insure resolution for fine patterns with a size of 45 nm et seq., not only an improvement in dissolution contrast as intended in the prior art is requisite, but control of acid diffusion is also important (see Non-Patent Document 2). Since chemically amplified resist compositions are designed such that sensitivity and contrast are enhanced by acid diffusion, an attempt to minimize acid diffusion by reducing the temperature and/or time of post-exposure bake (PEB) results in drastic reductions of sensitivity and contrast.

Addition of an acid generator capable of generating a bulky acid is effective for suppressing acid diffusion. It is then proposed to copolymerize a polymer with an acid generator in the form of an onium salt having polymerizable olefin. With respect to the patterning of a resist film to a feature size of 16 nm et seq., it is believed impossible in the light of acid diffusion to form such a pattern from a chemically amplified resist film. It would be desirable to have a non-chemically amplified resist material.

A typical non-chemically amplified resist material is polymethyl methacrylate (PMMA). It is a positive resist material which increases solubility in organic solvent developer through the mechanism that the molecular weight decreases as a result of scission of the main chain upon exposure to EB or EUV. Due to the lack of cyclic structure, it has the drawbacks of poor etch resistance and substantial outgassing during exposure.

Hydrogensilsesquioxane (HSQ) is a negative resist material which turns insoluble in alkaline developer through crosslinking by condensation reaction of silanol generated upon exposure to EB or EUV. Also chlorine-substituted calixarene functions as negative resist material. Since these negative resist materials have a small molecular size prior to crosslinking and are free of blur by acid diffusion, they exhibit reduced edge roughness and very high resolution. They are thus used as a pattern transfer material for representing the resolution limit of the exposure tool. However, these materials are insufficient in sensitivity, with further improvements being needed.

The EB writing of a resist film encounters a problem that the point of writing is shifted by electrostatic charges on the resist film. It is proposed to overlay the resist film with an antistatic film to prevent the resist film from being charged. Undesirably coating of the antistatic film adds to the cost of the overall process.

It was impossible to use metal-containing materials as the photoresist material for the semiconductor lithography because of a possible malfunction of semiconductor devices as a result of metal atoms migrating to the substrate. However, it is known in the application other than the semiconductor, for example, to use a metal compound as the resist material for LCD (see Non-Patent Document 3) or zinc neodecanoate as the patterning material for forming transparent electrode of ZnO. Patent Document 1 shows pattern-forming examples using complexes of silicon, titanium, zirconium, tantalum, barium, strontium, and hafnium with acetylacetone ligands. Patent Document 2 discloses a pattern forming method using salts of copper, chromium, cerium, yttrium, barium, and aluminum with carboxyl and amino-containing ligands. Once a pattern is formed, it is converted into a pattern of metal oxide by heat treatment at 300° C.

Patent Document 3 discloses exemplary pattern formation using a positive resist material comprising a partial condensate of titanium, zirconium or hafnium alkoxide coordinated with a diol or triol. This material can form a pattern at a high resolution and minimal edge roughness, but is still insufficient in sensitivity. Further improvements are needed.

CITATION LIST

Patent Document 1: JP-A 2005-505691 (U.S. Pat. No. 6,849,305)
Patent Document 2: U.S. Pat. No. 5,534,312
Patent Document 3: JP 6119544 (U.S. Pat. No. 9,274,425)
Non-Patent Document 1: SPIE Vol. 5039 p1 (2003)
Non-Patent Document 2: SPIE Vol. 6520 p65203L-1 (2007)
Non-Patent Document 3: J. Vac. Sci. Technol. B27(6), November/December p3164 (2009)

DISCLOSURE OF INVENTION

An object of the invention is to provide a resist composition which has both high resolution and sensitivity, and forms a pattern with a satisfactory profile and minimal LER after exposure and development, and a patterning process using the same.

The inventors have found that a resist composition comprising a metal compound of specific structure and a metal salt sensitizer exhibits an improved dissolution contrast in organic solvent development after EB or EUV exposure and thus forms a pattern of satisfactory profile.

In one aspect, the invention provides a resist composition adapted to change a solubility in developer upon exposure to high-energy radiation, comprising (A) at least one compound selected from a metal compound having the formula (A-1), a hydrolysate of the metal compound having formula (A-1), a hydrolytic condensate of the metal compound having formula (A-1), and the reaction product of the metal compound having formula (A-1), hydrolysate or hydrolytic condensate thereof with a di- or trihydric alcohol having the formula (A-2):

wherein $M^A$ is Ti, Zr or Hf, $R^{A1}$ to $R^{A4}$ are each independently a $C_1$-$C_{20}$ monovalent organic group optionally having a hydroxyl group, a pair of $R^{A1}$ and $R^{A2}$ may bond together to form a ring with the O and $M^A$ to which they are attached, a pair of $R^{A1}$ and $R^{A2}$ or $R^{A3}$ and $R^{A4}$ may bond together to form a spiro-ring with the O and $M^A$ to which they are attached, $R^{A5}$ is a $C_2$-$C_{20}$ m-valent organic group, m is 2 or 3, and (B) a sensitizer containing a compound having the formula (B-1):

wherein $M^{n+}$ is a metal ion selected from the group consisting of Mg, Ca, Ce, Zn, Cu, In, Fe, Yb, Y, Tm, Sn, Ni, Sc, Hf, Nb, Ti, Zr, Ba, Ho, Tb, Lu, La, Ag, Eu, Dy, Gd, Rb, Sr, and Cs, $X^-$ is an alkylsulfonic acid anion, arylsulfonic acid anion, alkylsulfonimidic acid anion or alkylsulfonemethidic acid anion, each having at least one fluorine atom, and n is an integer of 1 to 4.

In a preferred embodiment, $X^-$ in formula (B-1) is an anion selected from the following formulae (B-2) to (B-4):

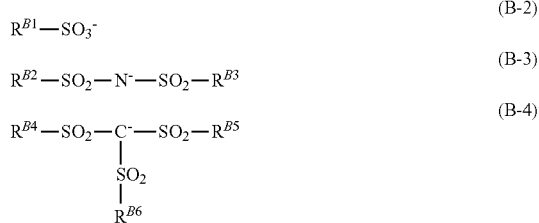

wherein $R^{B1}$ is a $C_5$-$C_{30}$ monovalent hydrocarbon group having at least one fluorine atom, which may contain halogen, thiol, ether, ester, carbonate, carbonyl, amide, amino, azide, carbamate, nitro, cyano, hydroxyl, carboxyl, sulfo, sulfonic acid ester, sultone moiety, lactone ring or lactam ring, $R^{B2}$, $R^{B3}$, $R^{B4}$, $R^{B5}$ and $R^{B6}$ are each independently fluorine, trifluoromethyl, pentafluoroethyl, trifluoroethyl, octafluorobutyl or nonafluorobutyl, $R^{B2}$ and $R^{B3}$ may bond together to form a ring with the $SO_2$ and N to which they are attached.

The resist composition may further comprise (C) at least one compound selected from a silane compound having the formula (C-1), a hydrolysate of the silane compound having formula (C-1), and a hydrolytic condensate of the silane compound having formula (C-1):

wherein $R^{C1}$ is hydrogen or a $C_1$-$C_{30}$ monovalent organic group free of iodine, $R^{C2}$ is $C_1$-$C_6$ alkyl, and p is an integer of 0 to 3.

The resist composition may further comprise (C) at least one compound selected from a silane compound having the formula (C-2), a hydrolysate of the silane compound having formula (C-2), and a hydrolytic condensate of the silane compound having formula (C-2):

wherein $R^{C3}$ is a $C_1$-$C_{30}$ monovalent organic group substituted with at least one iodine, $R^{C4}$ is $C_1$-$C_6$ alkyl, and q is an integer of 1 to 3.

The resist composition may further comprise (C) a hydrolytic condensate of at least one silane compound having the formula (C-1) and at least one silane compound having the formula (C-2):

wherein $R^{C1}$ is hydrogen or a $C_1$-$C_{30}$ monovalent organic group free of iodine, $R^{C2}$ is $C_1$-$C_6$ alkyl, $R^{C3}$ is a $C_1$-$C_{30}$ monovalent organic group substituted with at least one iodine, $R^{C4}$ is $C_1$-$C_6$ alkyl, p is an integer of 0 to 3, and q is an integer of 1 to 3.

In another aspect, the invention provides a pattern forming process comprising the steps of coating the resist composition defined above onto a substrate, prebaking the composition to form a resist film, exposing the resist film to high-energy radiation, baking, and developing the resist film in a developer.

Typically, the developer contains an organic solvent. Specifically, the developer contains at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Most often, the high-energy radiation is EUV of wavelength 3 to 15 nm or EB at an accelerating voltage of 1 to 150 kV.

Advantageous Effects of Invention

The resist composition has improved shelf stability in that resist properties remain unchanged even when it is in contact with the preparation apparatus. From a resist film of the resist composition, a fine size pattern of satisfactory profile having a high resolution and improved edge roughness is formed. Since the resist composition has an electroconductive function, it prevents any charge buildup during image writing. The resist composition is thus suited as the micropatterning material for fabrication of VLSIs and photomasks, and the patterning material in the EB and EUV lithography.

DESCRIPTION OF EMBODIMENTS

Figure 1:
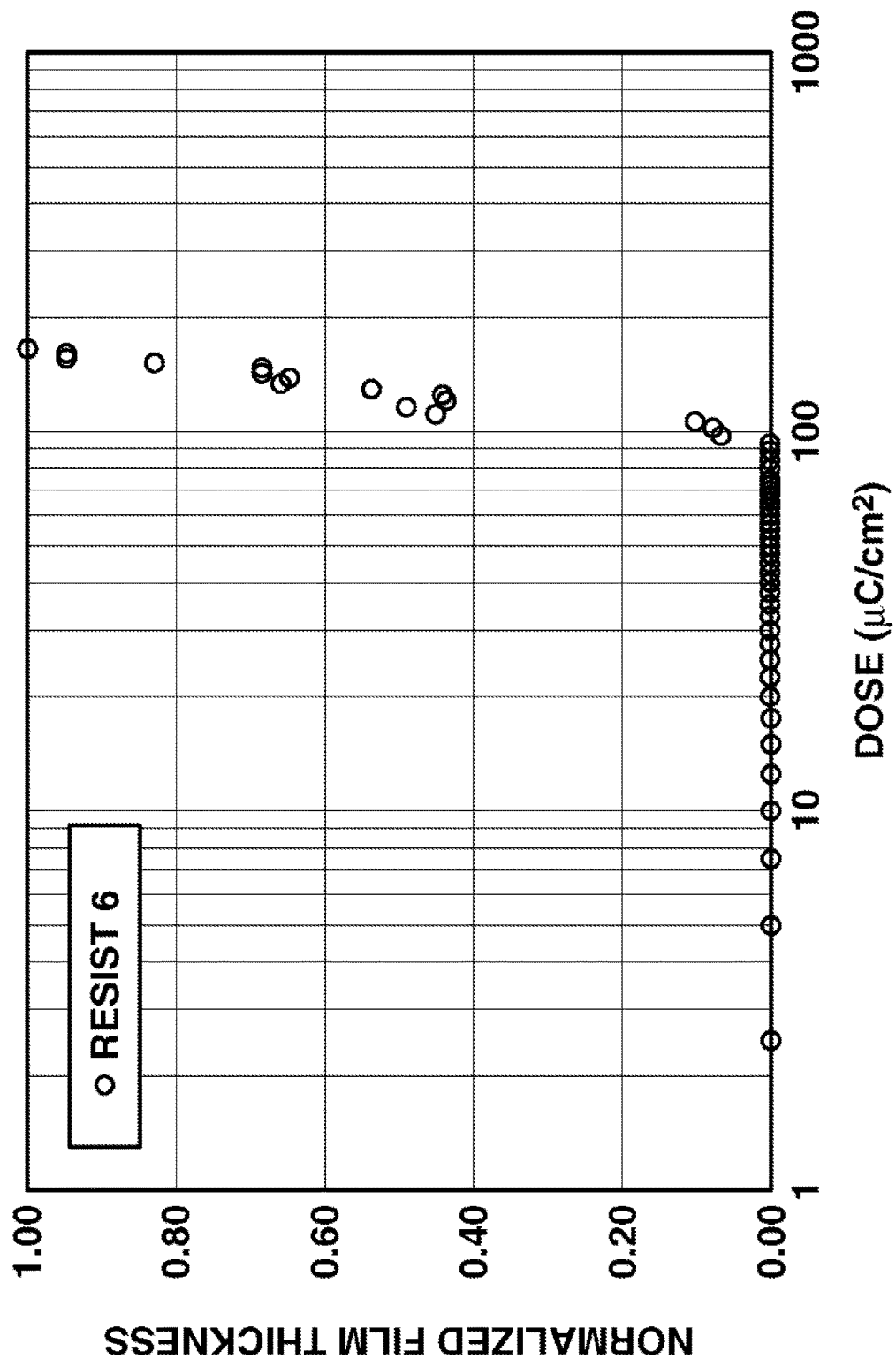
FIG. 1 is a diagram showing a contrast curve of Resist #6 in Example.

The terms "a" and "an" herein do not denote a limitation of quantity, but rather denote the presence of at least one of the referenced item. As used herein, the notation ($C_n$-$C_m$) means a group containing from n to m carbon atoms per group. Me stands for methyl, and Et for ethyl.

The abbreviations and acronyms have the following meaning.
UV: ultraviolet radiation
EUV: extreme ultraviolet
EB: electron beam
Mw: weight average molecular weight
PEB: post-exposure bake
LER: line edge roughness
LWR: line width roughness
(A) Metal Compound Component (A) in the resist composition is a metal compound that is a metal compound having the formula (A-1), a hydrolysate or hydrolytic condensate of the metal compound having formula (A-1) alone, or the reaction product of the metal compound having formula (A-1), hydrolysate or hydrolytic condensate thereof with a di- or trihydric alcohol having the formula (A-2). As used herein, the term "hydrolytic condensate" refers to a product obtained from condensation of a hydrolysate.

$$R^{A2}O-\underset{\underset{OR^{A3}}{|}}{\overset{\overset{OR^{A1}}{|}}{M^A}}-OR^{A4} \quad \text{(A-1)}$$

$$R^{A5}-(OH)_m \quad \text{(A-2)}$$

In formula (A-1), $M^A$ is titanium (Ti), zirconium (Zr) or hafnium (Hf). $R^{A1}$ to $R^{A4}$ are each independently a $C_1$-$C_{20}$ monovalent organic group which may or may not have one hydroxyl group. A pair of $R^{A1}$ and $R^{A2}$ may bond together to form a ring with the O and $M^A$ to which they are attached. A pair of $R^{A1}$ and $R^{A2}$ or $R^{A3}$ and $R^{A4}$ may bond together to form a spiro-ring with the O and $M^A$ to which they are attached.

The monovalent organic groups may be straight, branched or cyclic. Examples include monovalent saturated hydrocarbon groups such as methyl, ethyl, n-propyl, isopropyl, cyclopropyl, n-butyl, isobutyl, sec-butyl, tert-butyl, cyclobutyl, n-pentyl, isopentyl, sec-pentyl, tert-pentyl, neopentyl, cyclopentyl, n-hexyl, cyclohexyl, n-heptyl, cycloheptyl, n-octyl, cyclooctyl, n-nonyl, cyclononyl, n-decyl, cyclodecyl, adamantyl and norbornyl; monovalent unsaturated hydrocarbon groups such as cyclohexenyl, cyclohexenylmethyl, cyclohexenylethyl, cycloheptenyl, and cyclopentadienyl; aryl groups such as phenyl, tolyl, xylyl, methoxyphenyl, and naphthyl; aralkyl groups such as benzyl, phenethyl, and methoxybenzyl; and monovalent heterocyclic groups such as tetrahydrofurfuryl.

The organic group may have one hydroxyl group. The hydroxy-containing organic groups are preferably groups having a tertiary alcohol structure.

Examples of the metal compound having formula (A-1) wherein $M^A$ is titanium include titanium methoxide, titanium ethoxide, titanium propoxide, titanium isopropoxide, titanium butoxide, titanium pentoxide, titanium hexyloxide, titanium cyclopentoxide, titanium cyclohexyloxide, titanium allyloxide, titanium phenoxide, titanium methoxyethoxide, titanium ethoxyethoxide, titanium 2-ethyl-1,3-hexane dioleate, titanium 2-ethylhexoxide, titanium tetrahydrofurfuryloxide, titanium bis(triethanolaminate)diisopropoxide, titanium dipropoxybisethylacetoacetate, titanium dibutoxybisethylacetacetate, titanium dipropoxybis(2,4-pentanedionate), and titanium dibutoxybis(2,4-pentanedionate).

Examples of the metal compound having formula (A-1) wherein $M^A$ is zirconium include methoxyzirconium, ethoxyzirconium, propoxyzirconium, butoxyzirconium, phenoxyzirconium, zirconium dibutoxide bis(2,4-pentanedionate), and zirconium dipropoxide bis(2,2,6,6-tetramethyl-3,5-heptanedionate).

Examples of the metal compound having formula (A-1) wherein $M^A$ is hafnium include hafnium methoxide, hafnium ethoxide, hafnium propoxide, hafnium butoxide, hafnium pentoxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxybisethylacetacetate, hafnium dibutoxybisethylacetacetate, hafnium dipropoxybis(2,4-pentanedionate), and hafnium dibutoxybis(2,4-pentanedionate).

In formula (A-2), $R^{A5}$ is a $C_2$-$C_{20}$ m-valent organic group, and m is 2 or 3. The m-valent organic groups are preferably $C_2$-$C_{20}$ hydrocarbon groups from which a number m of hydrogen atoms have been eliminated. The m-valent organic groups may be straight, branched or cyclic and examples include those groups derived from aliphatic hydrocarbons such as alkanes, alkenes and alkynes, and aromatic hydrocarbons. Preferred are those groups derived from alkanes such as ethane, propane, butane, pentane, hexane, heptane, octane, nonane, decane, undecane, dodecane, tridecane, tetradecane, pentadecane, hexadecane, heptadecane, octadecane, nonadecane, and icosane.

Examples of the di- or trihydric alcohol having formula (A-2) are given below, but not limited thereto.

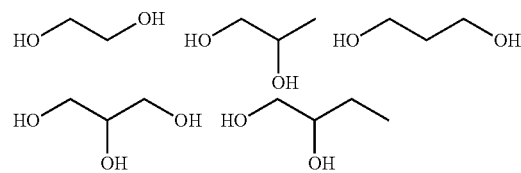

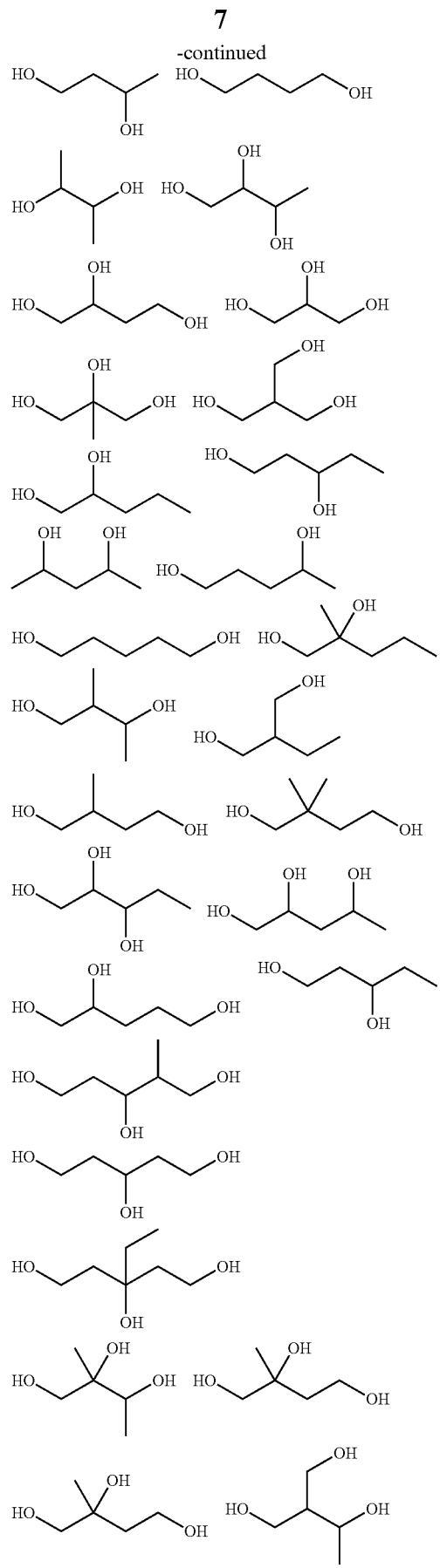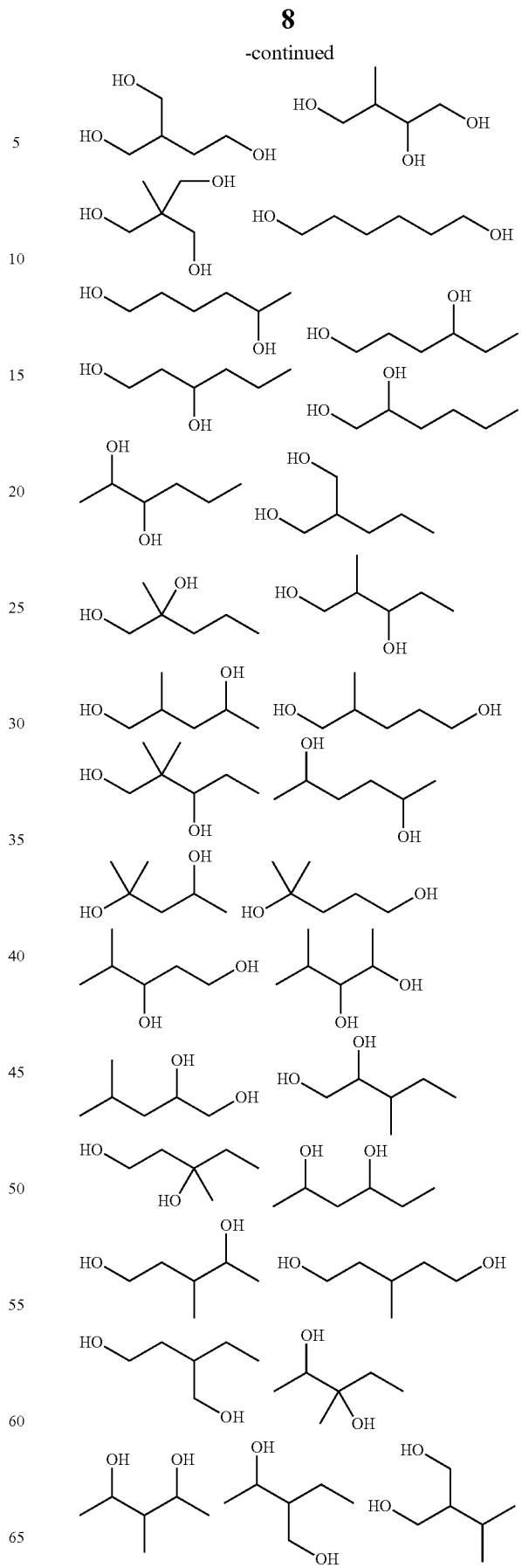

-continued
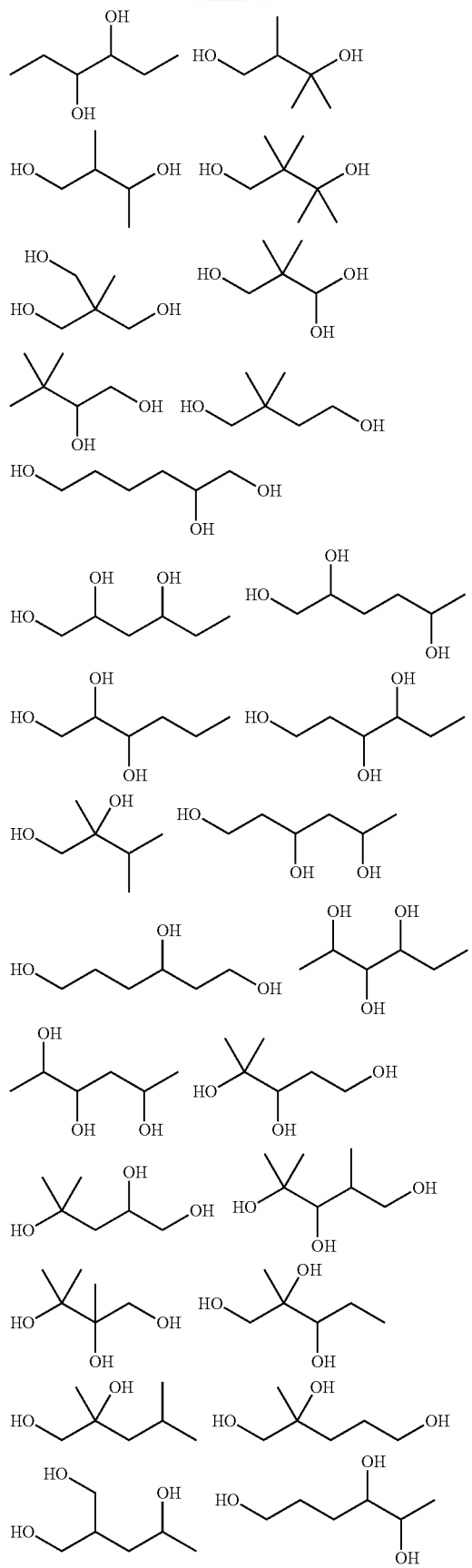
-continued
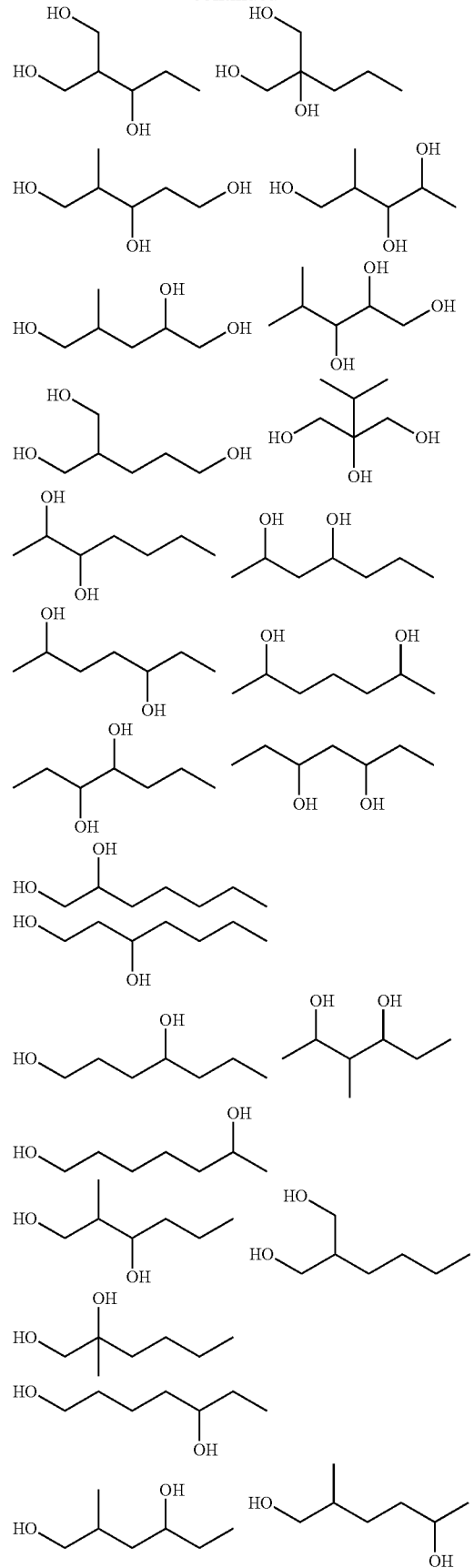

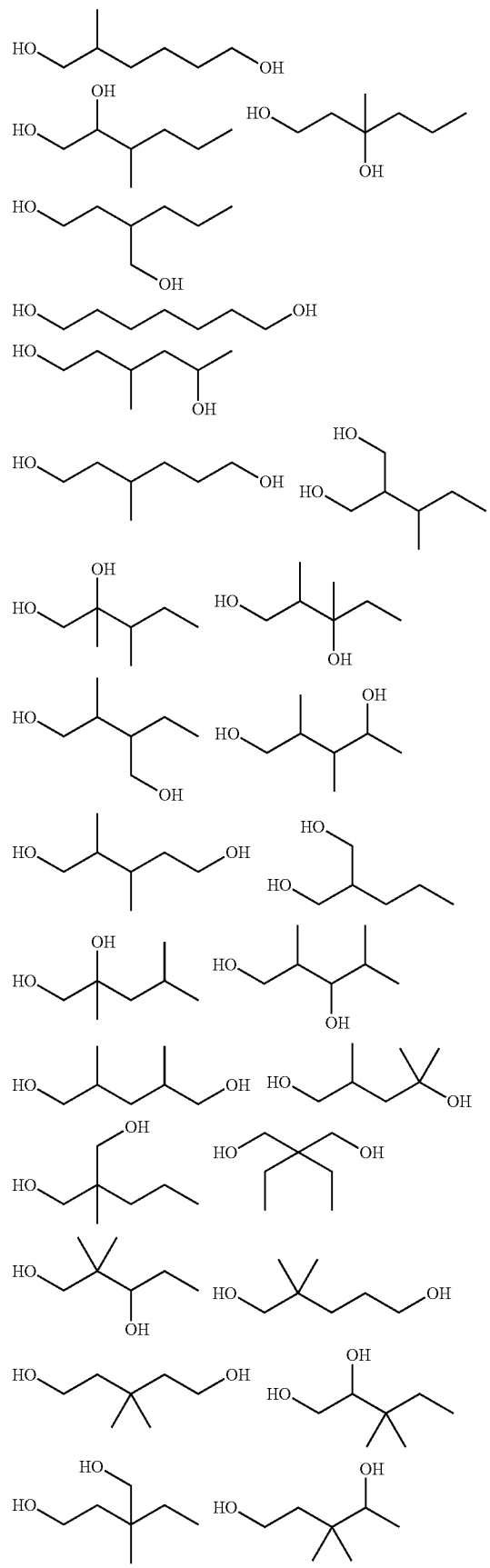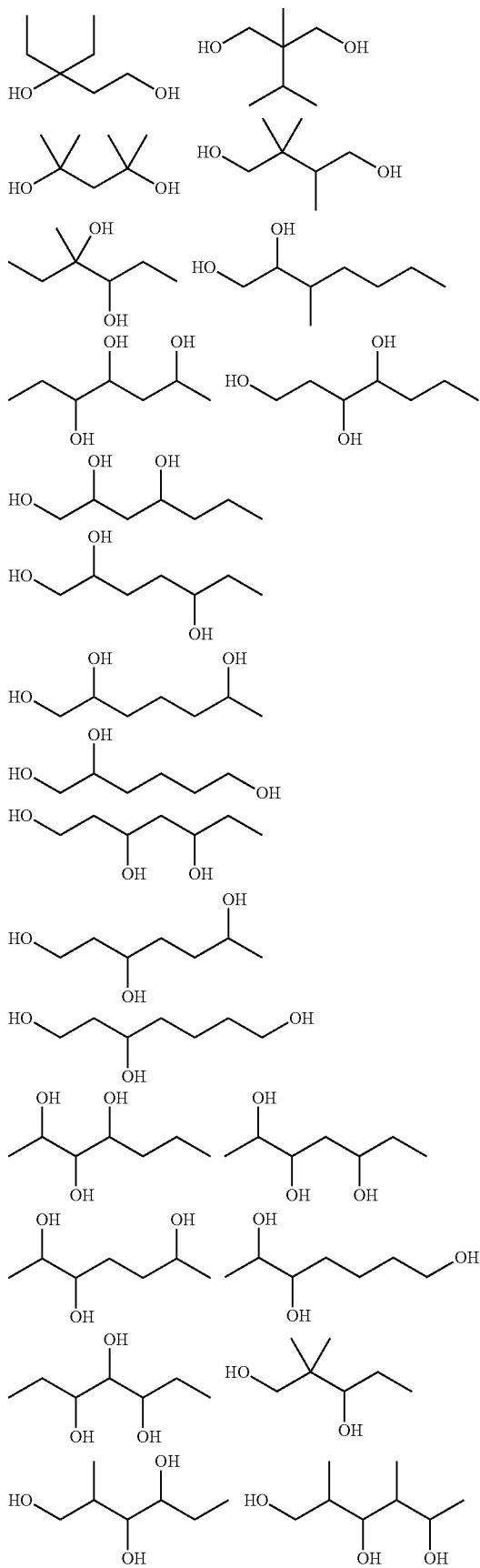

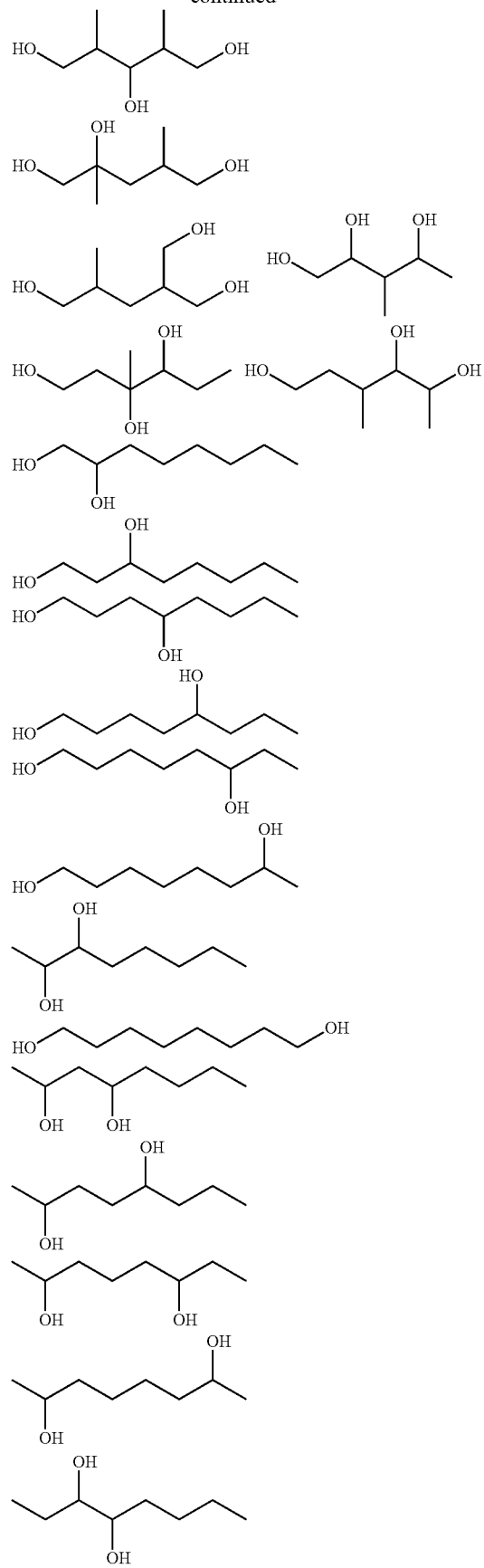
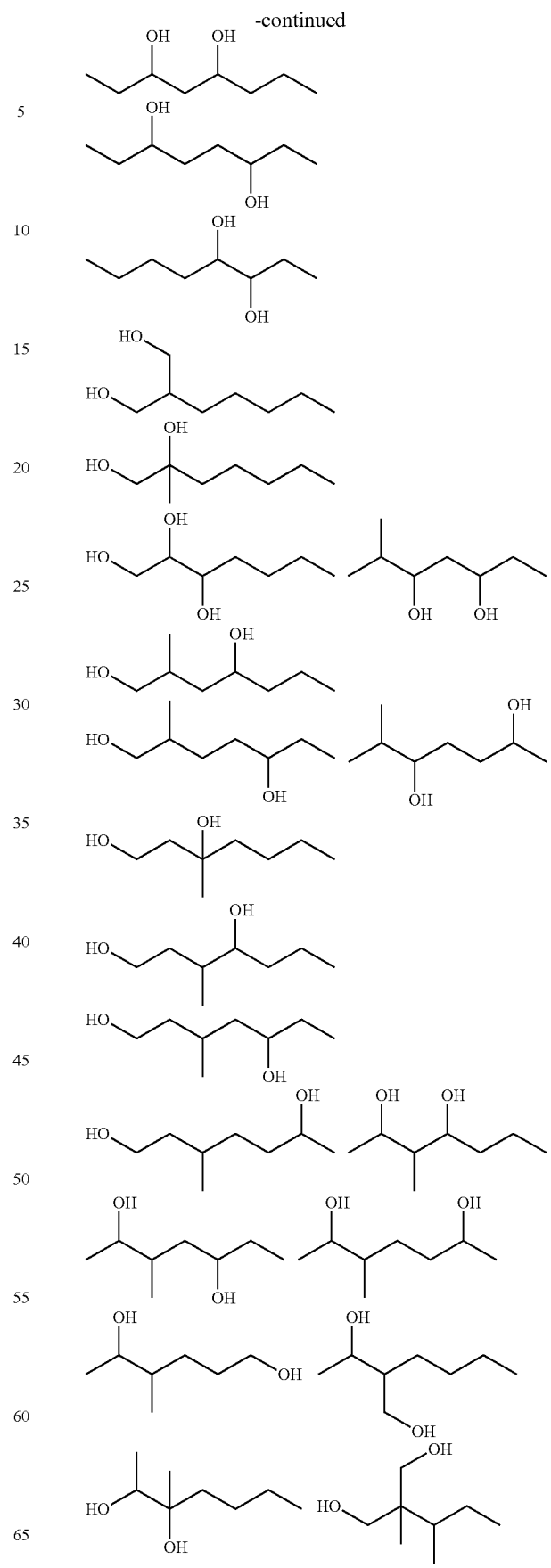

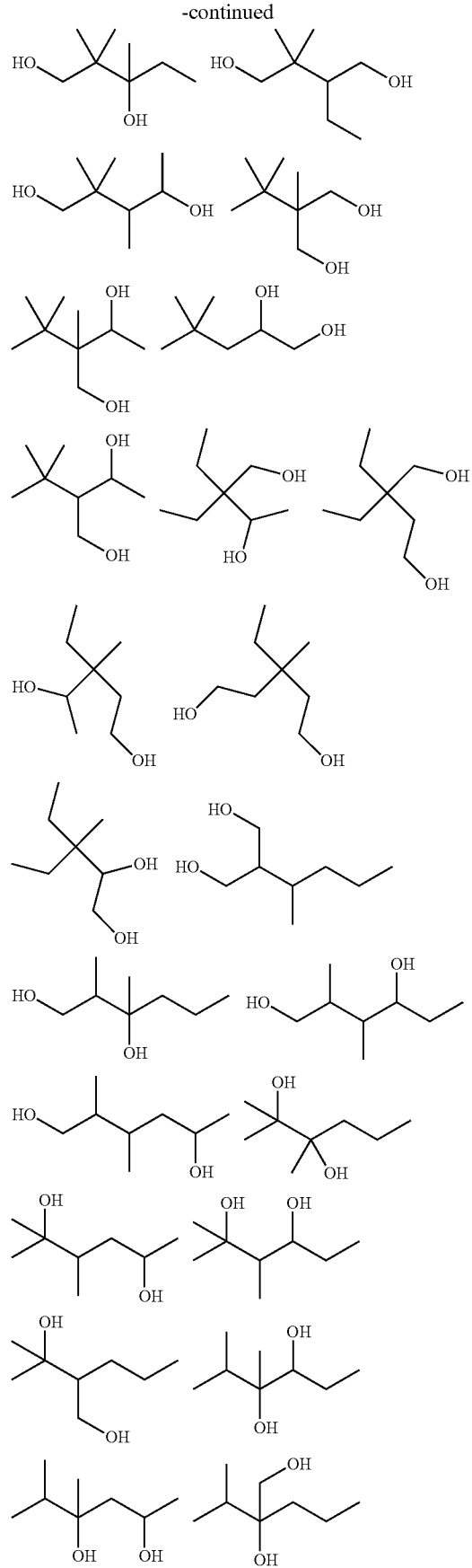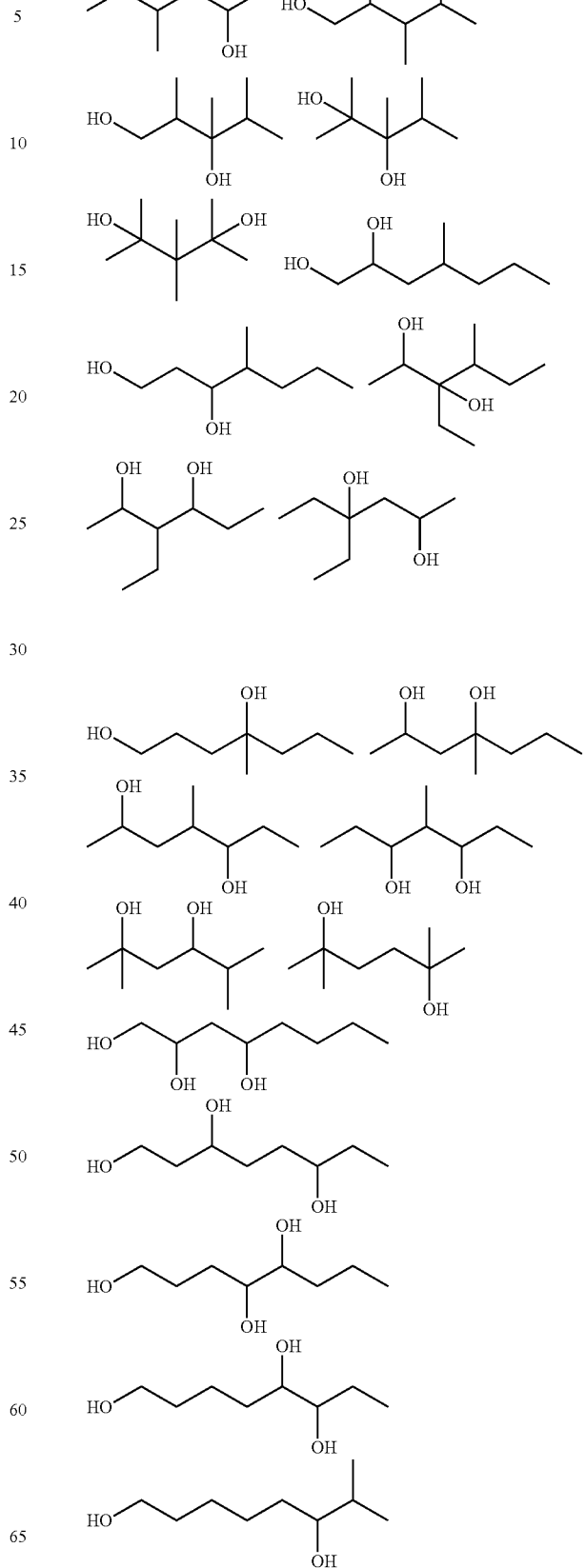

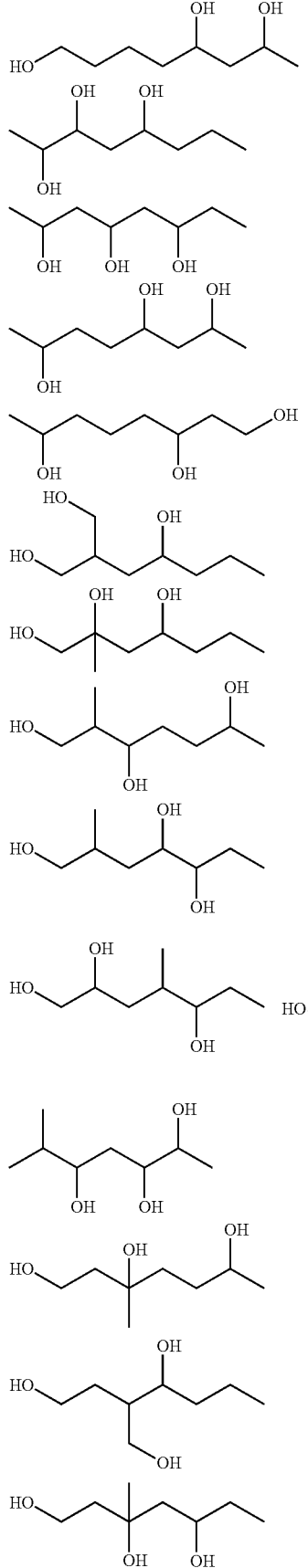
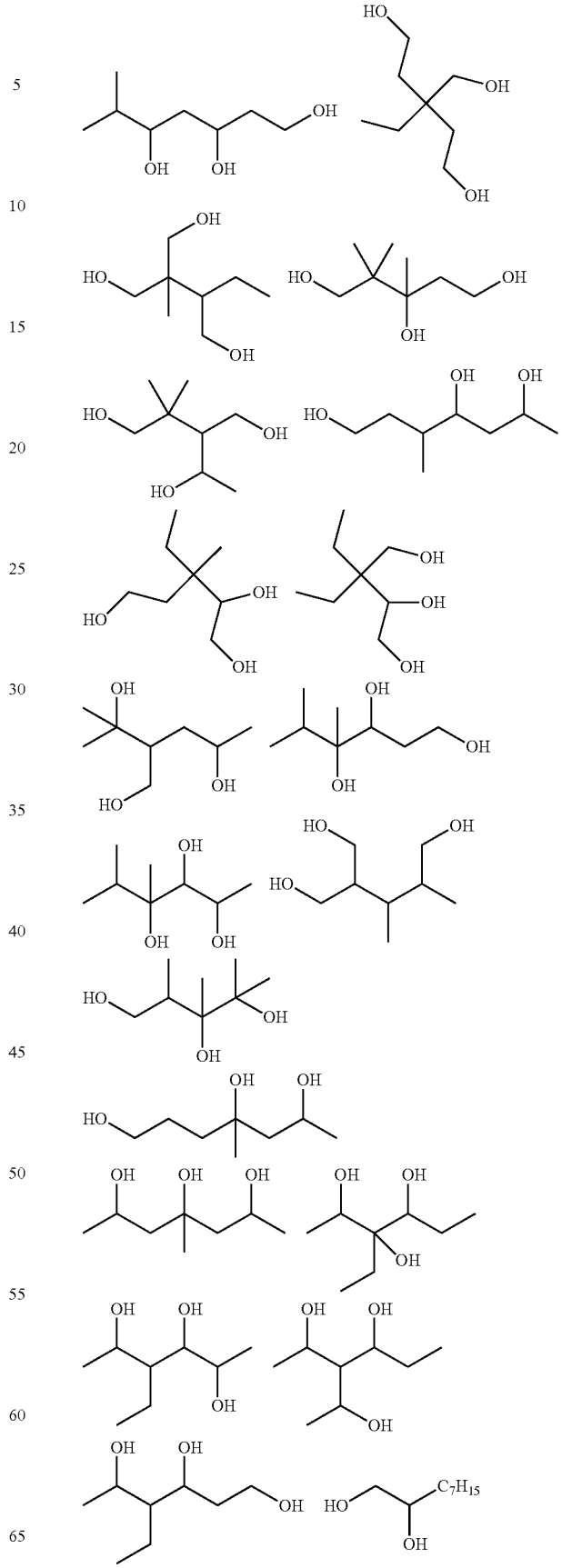

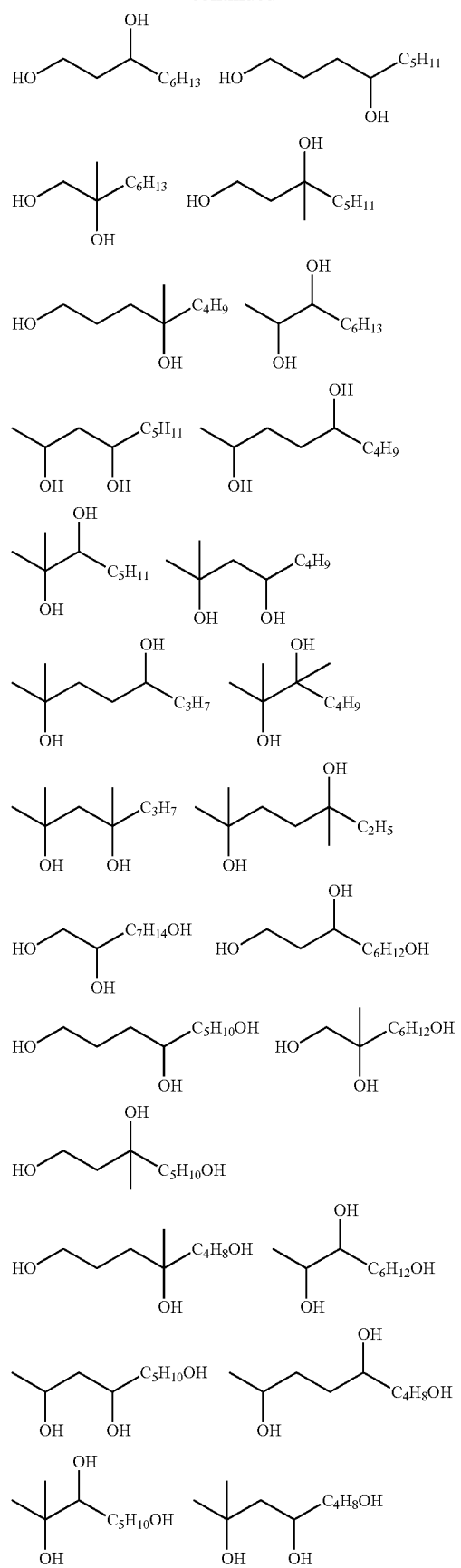
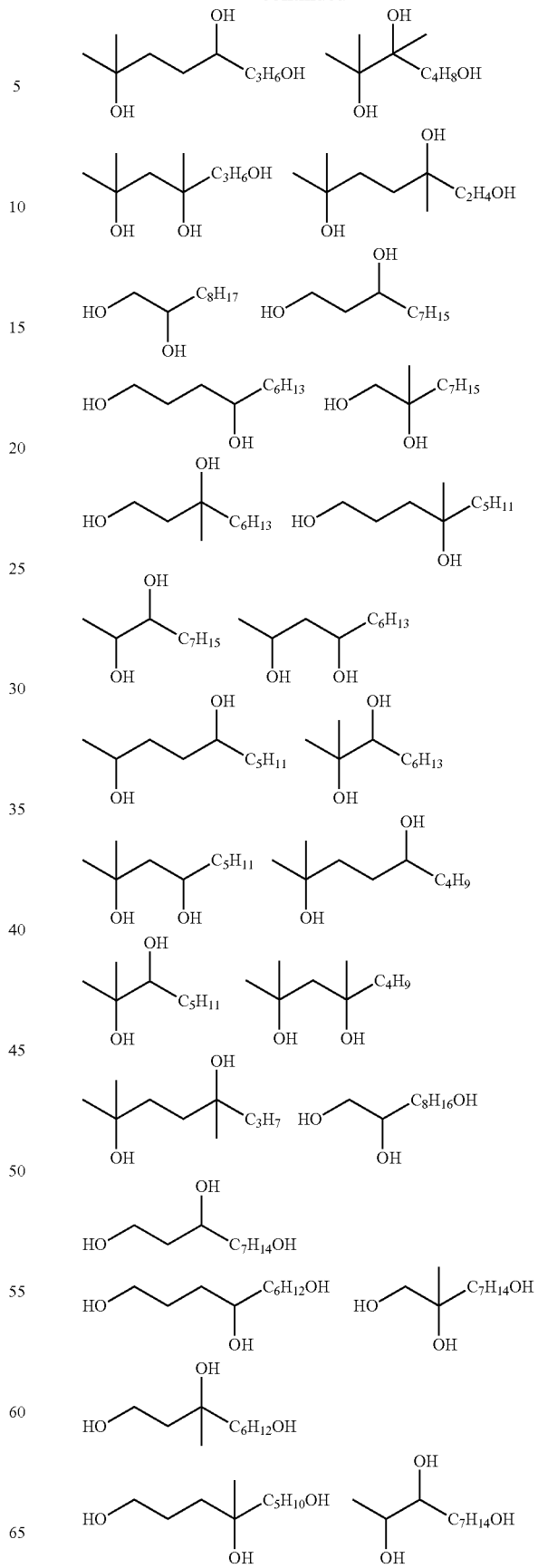

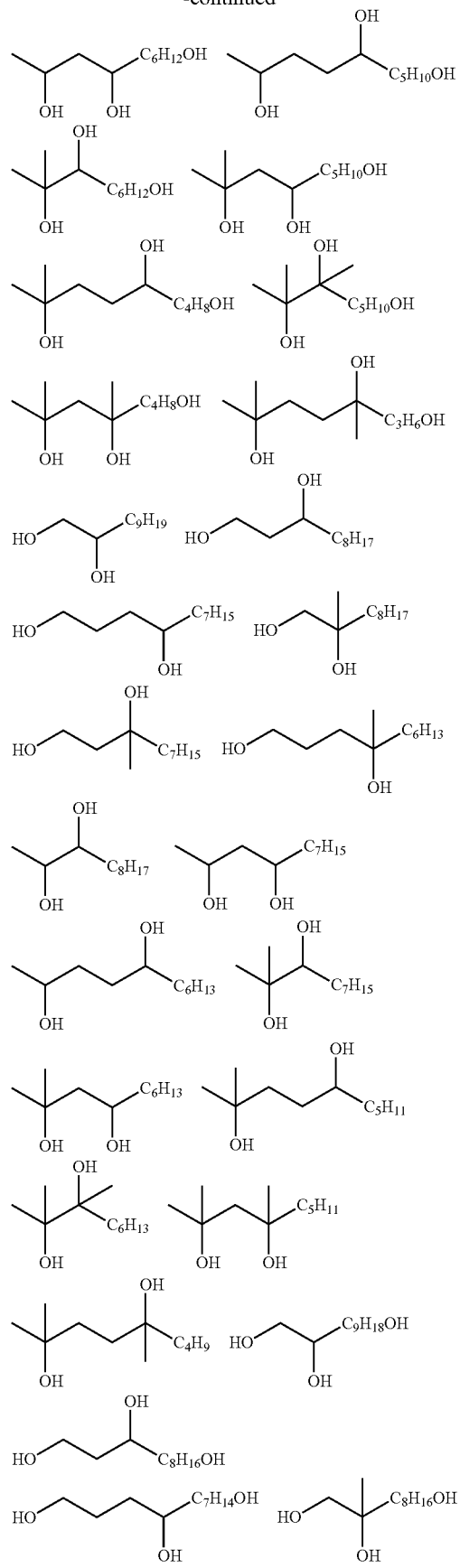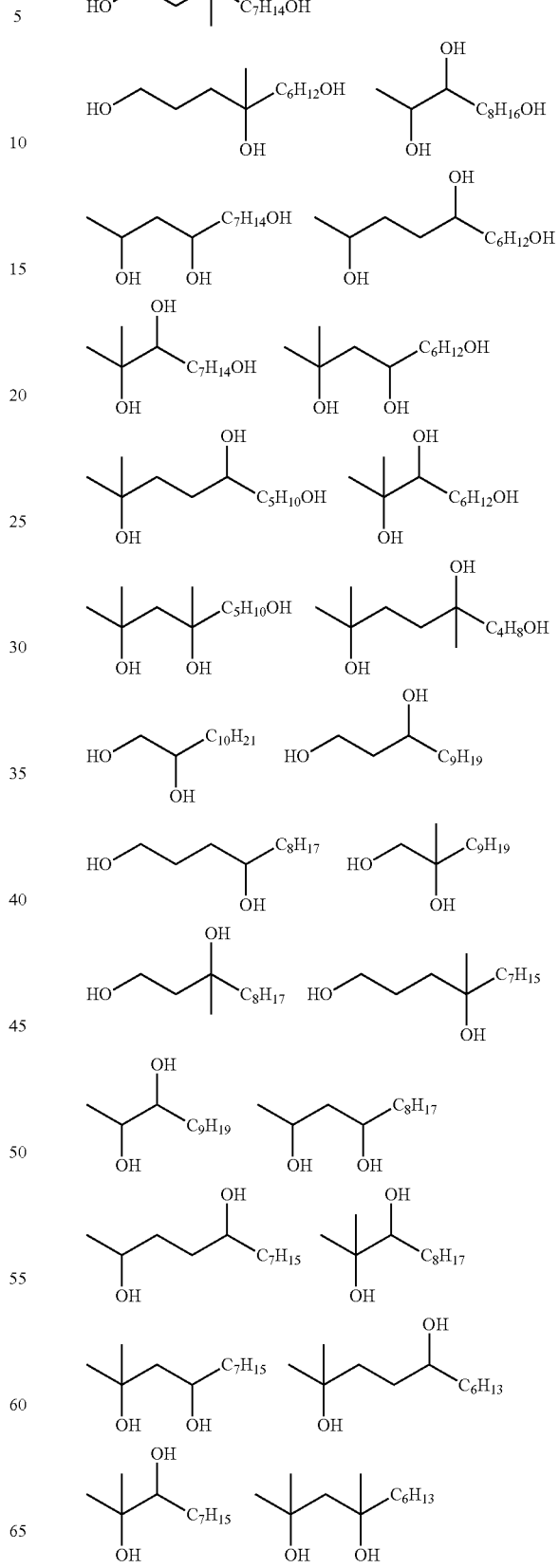

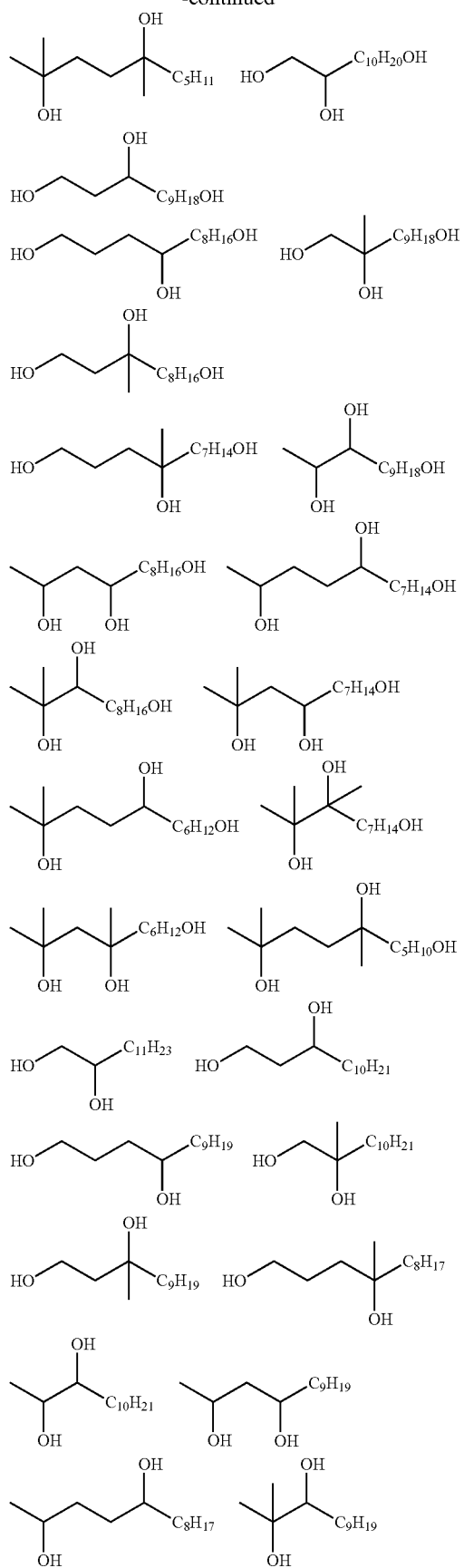
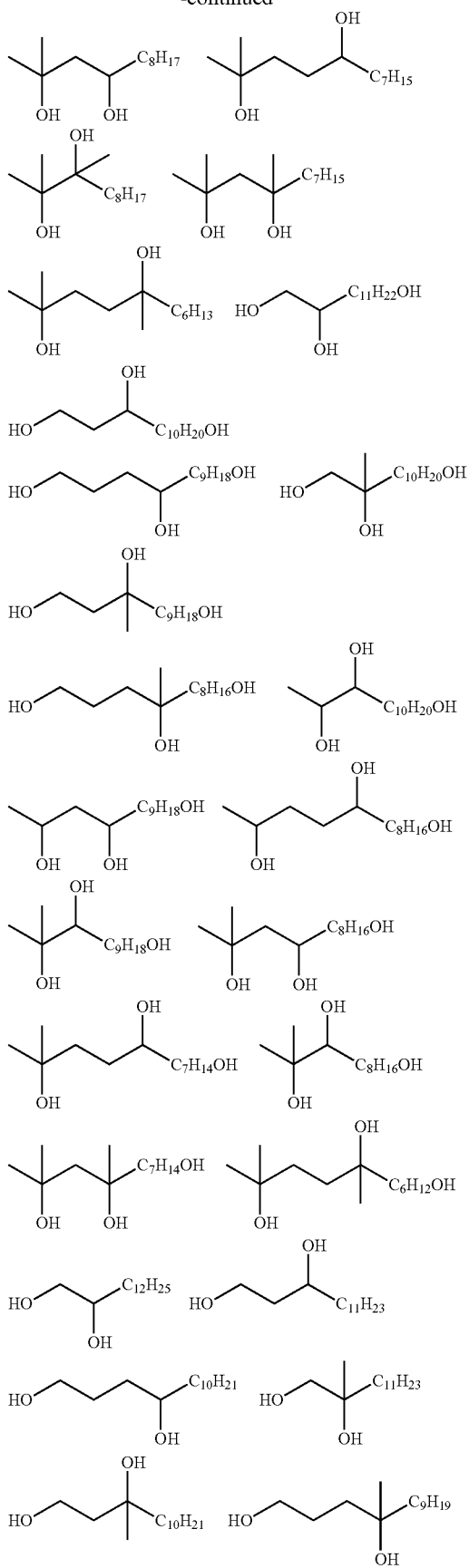

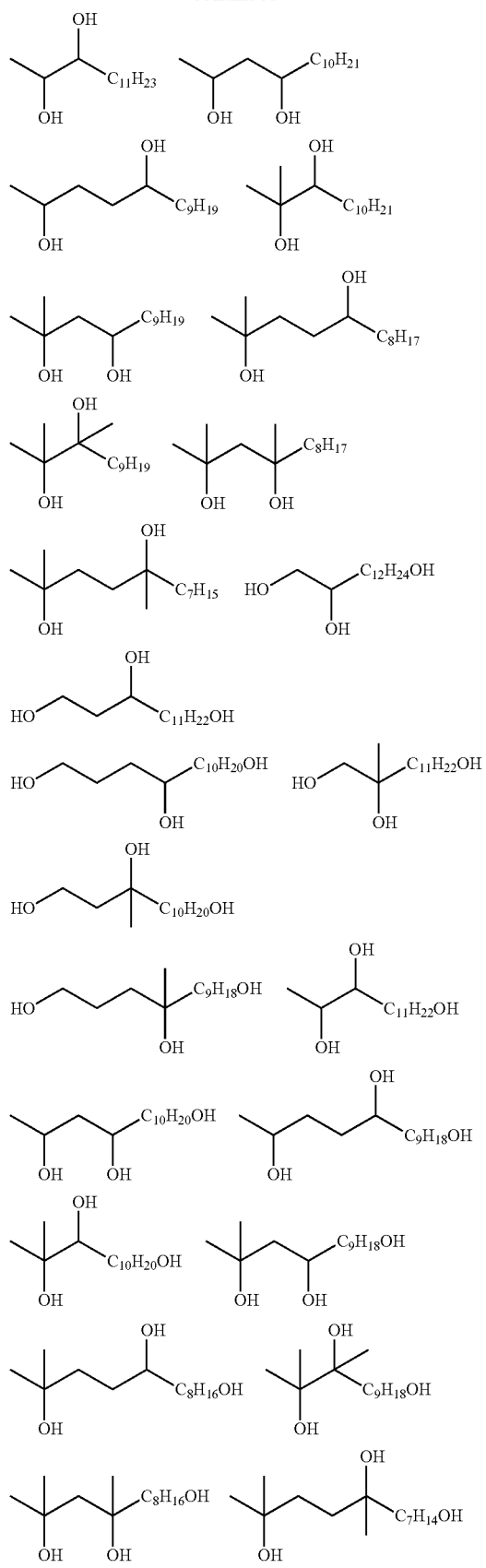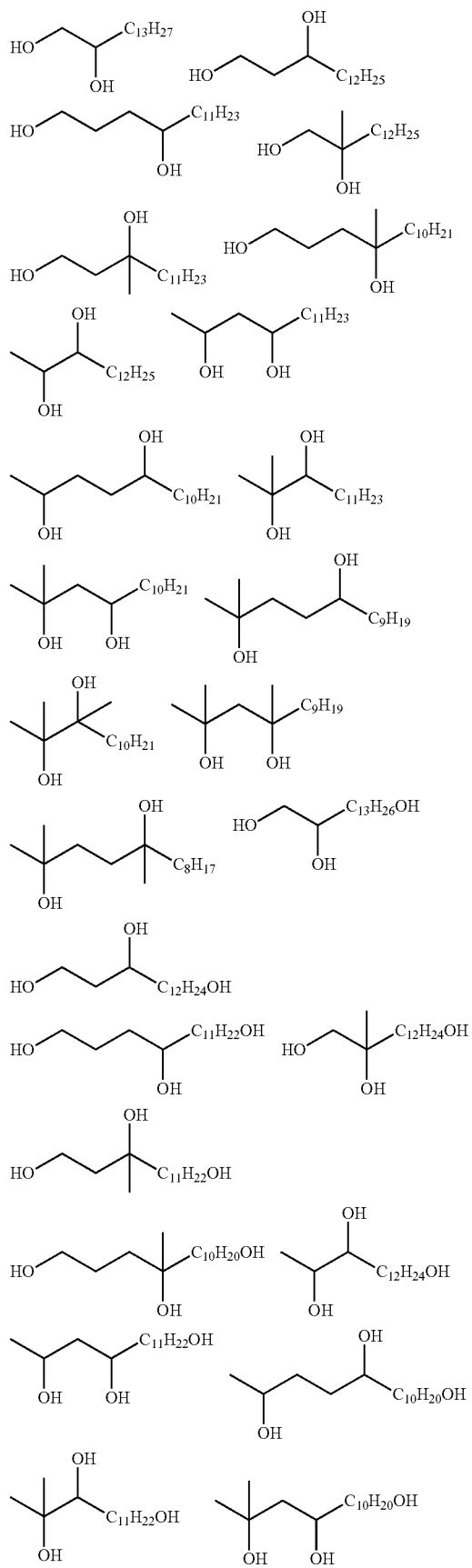

27
-continued
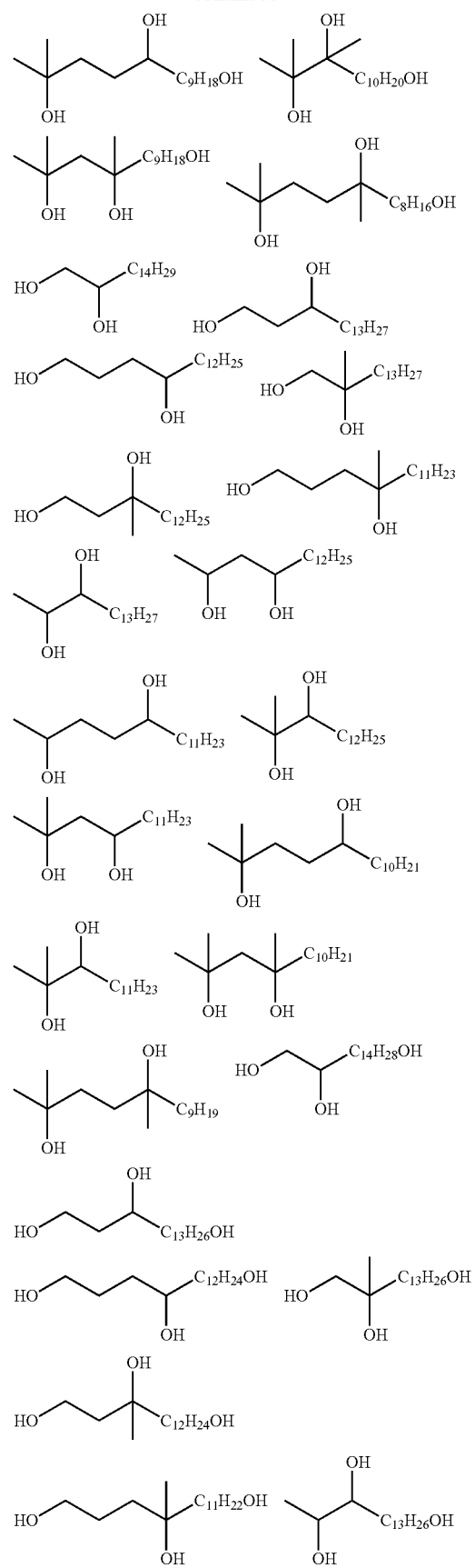
28
-continued
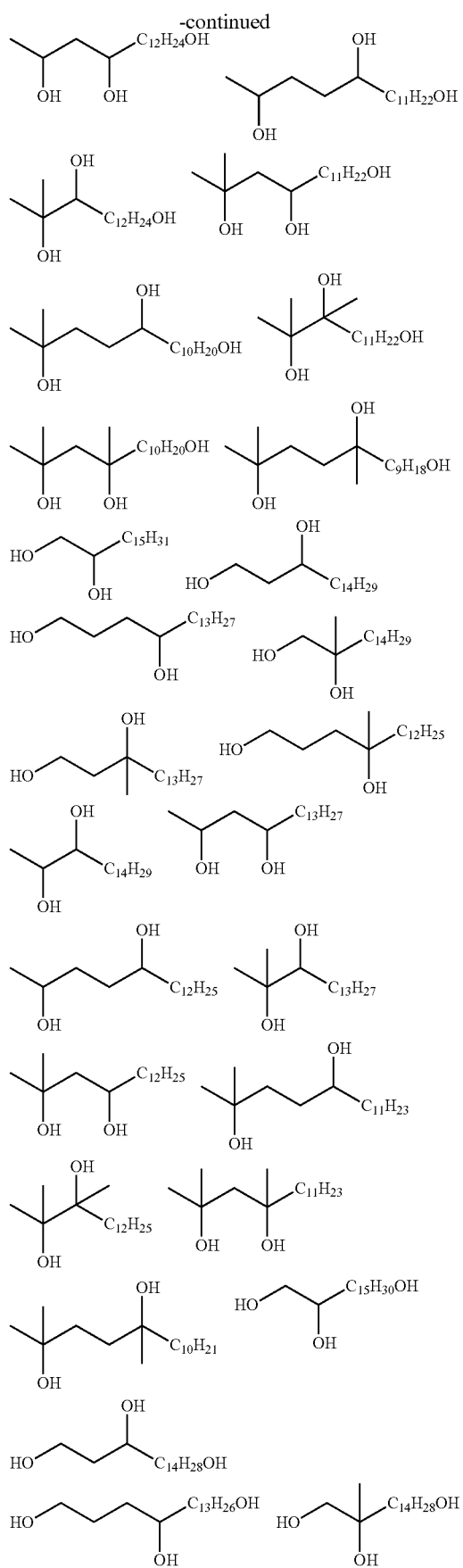

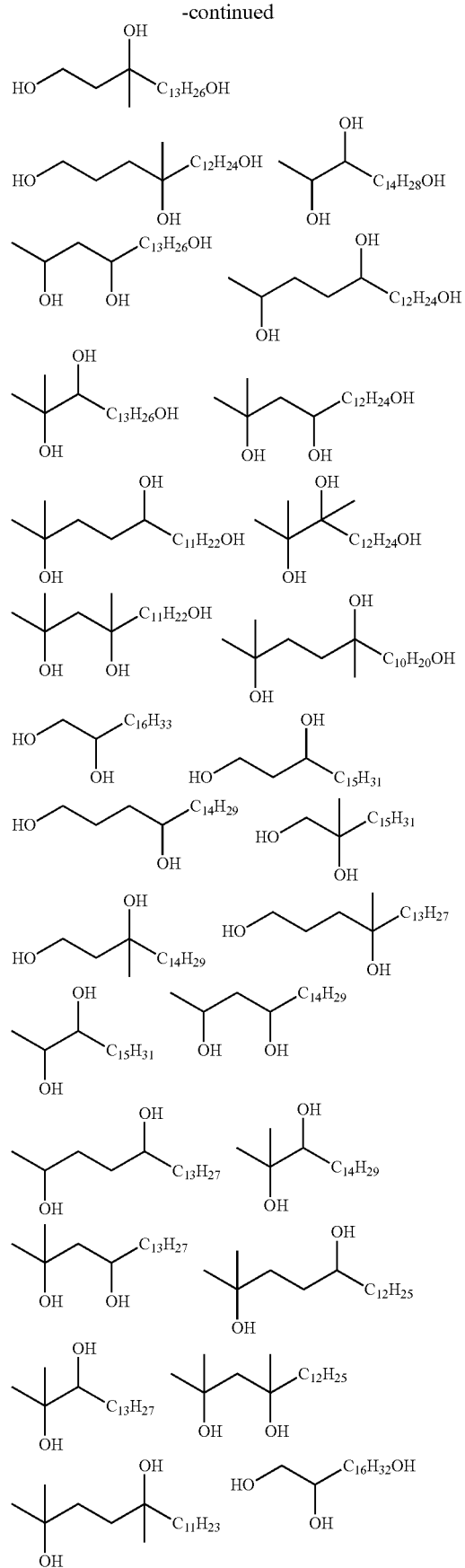
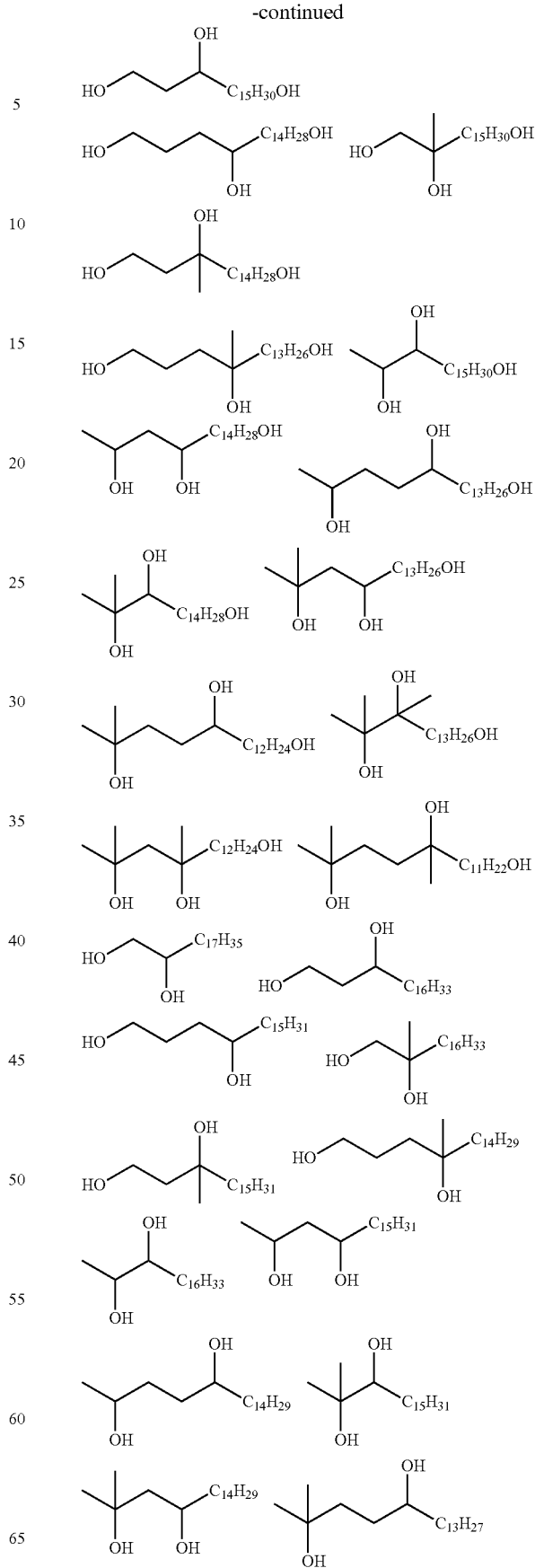

-continued
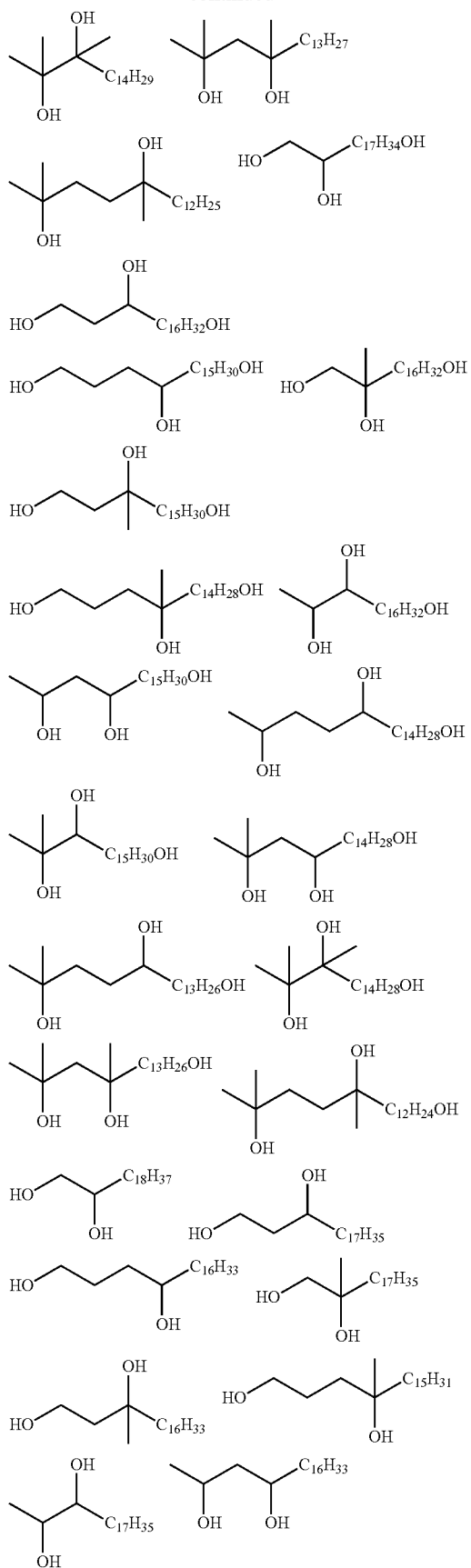
-continued
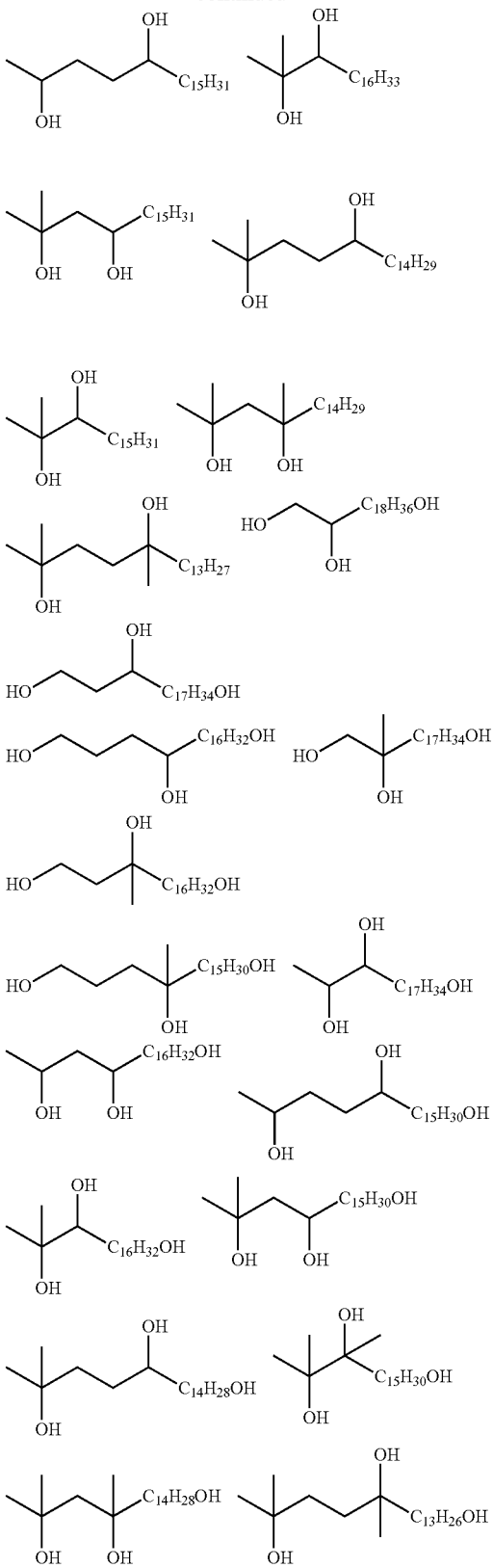
Of the di- and trihydric alcohols having formula (A-2), those of tertiary alcohol structure are preferred. Most preferred examples are given below.

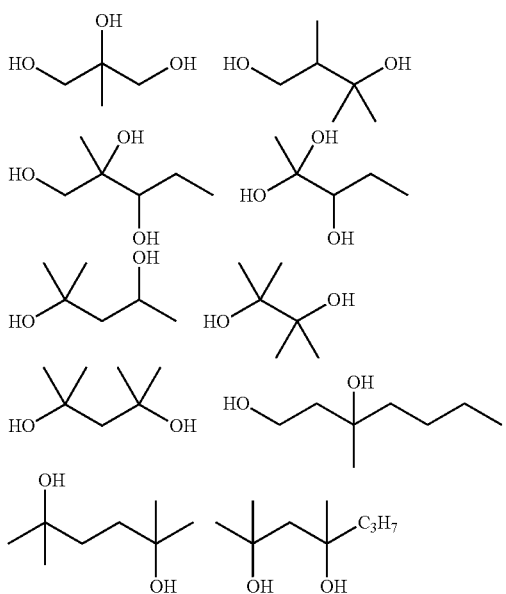

It is preferred from the standpoint of shelf stability of the resist composition that either one or both of the metal compound having formula (A-1) and the di- or trihydric alcohol having formula (A-2) have at least one tertiary alcohol structure. When an organic group has a carbon atom bonded to a metal atom via an oxygen atom, the organic group differs in solubility in solvent or stability to heat, depending on the surrounding skeleton structure. Also, the solubility of the metal compound in a solvent, especially organic solvent increases in the order that the skeleton structure that the carbon atom in the organic group or the carbon atom in the alcohol to be reacted assumes is a primary, secondary and tertiary alcohol structure. If a tertiary alcohol structure is incorporated, then the solubility of the metal compound in organic solvent is improved, whereby precipitation of the metal compound is prevented. The pyrolytic temperature of the metal compound decreases in the order that the skeleton structure that the carbon atom assumes is a primary, secondary and tertiary alcohol structure. If a tertiary alcohol structure is incorporated, then film deposition is possible at a temperature in the range of 100 to 350° C. which is compatible with the general process for the fabrication of semiconductor devices.

The hydrolysate or hydrolytic condensate obtained from the metal compound having formula (A-1) alone, or the reaction product thereof with the di- or trihydric alcohol having formula (A-2) may be prepared from hydrolysis or hydrolysis and condensation (referred to as hydrolytic condensation, hereinafter) of the metal compound having formula (A-1) alone, or a mixture of a hydrolysate or hydrolytic condensate of the metal compound having formula (A-1) alone and the di- or trihydric alcohol having formula (A-2), in the presence or absence of an acid or alkali catalyst.

The acid catalyst used herein may be at least one compound selected from among inorganic acids, aliphatic sulfonic acids, aromatic sulfonic acids, aliphatic carboxylic acids, and aromatic carboxylic acids. Suitable acid catalysts include hydrofluoric acid, hydrochloric acid, hydrobromic acid, sulfuric acid, nitric acid, perchloric acid, phosphoric acid, methanesulfonic acid, benzenesulfonic acid, toluenesulfonic acid, formic acid, acetic acid, propionic acid, oxalic acid, malonic acid, maleic acid, fumaric acid, and benzoic acid. The acid catalyst is preferably used in an amount of $10^{-6}$ to 10 moles, more preferably $10^{-5}$ to 5 moles, even more preferably $10^{-4}$ to 1 mole per mole of the metal compound.

Suitable alkaline catalysts include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetramine, aniline, N,N-dimethylaniline, pyridine, N,N-dimethylethanolamine, N,N-diethylethanolamine, N-(β-aminoethyl)ethanolamine, N-methylethanolamine, N-methyldiethanolamine, N-ethylethanolamine, N-n-butylethanolamine, N-n-butyldiethanolamine, N-tert-butylethanolamine, N-tert-butyldiethanolamine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The alkaline catalyst is preferably used in an amount of $10^{-6}$ to 10 moles, more preferably $10^{-5}$ to 5 moles, even more preferably $10^{-4}$ to 1 mole per mole of the metal compound.

The amount of water used when the desired compound is obtained from hydrolysis or hydrolytic condensation of the reactant(s) is preferably 0.01 to 10 moles, more preferably 0.05 to 5 moles, even more preferably 0.1 to 3 moles per mole of hydrolyzable substituent group on the reactant(s). As long as the amount of water is up to 10 moles, the procedure is economical because the reactor is not of extra size, and preferable because the stability of the metal compound is not adversely affected.

One exemplary procedure is by adding the reactant(s) to an aqueous solution of the catalyst to start hydrolytic condensation reaction. Prior to the reaction, an organic solvent may be added to the catalyst aqueous solution and/or the reactant(s) may be diluted with an organic solvent. The reaction temperature is preferably 0 to 200° C., more preferably 5 to 150° C. The reaction time is preferably 0.5 to 24 hours, more preferably 1 to 12 hours. In one preferred procedure, the reaction system is maintained at a temperature of 5 to 150° C. during dropwise addition of the reactant(s) and aged at 20 to 150° C. for 1 to 12 hours.

Another procedure is by adding water or water-containing organic solvent to the reactant(s) or an organic solvent containing the reactant(s) to start hydrolytic reaction. Prior to the reaction, the catalyst may be added to the reactant(s) or the organic solvent containing the reactant(s), or water or water-containing organic solvent. The reaction temperature is preferably 0 to 200° C., more preferably 5 to 150° C. In one preferred procedure, the reaction system is maintained at a temperature of 5 to 150° C. during dropwise addition of the reactant(s) and aged at 20 to 150° C. for 1 to 12 hours.

Examples of the organic solvent which can be added to the catalyst aqueous solution or with which the metal compound can be diluted include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl pentyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, acetylacetone, methyl acetoacetate, ethyl acetoacetate, propyl acetoacetate, butyl acetoacetate, methyl pivaloylacetate, methyl isobutyroylacetate, methyl caproylacetate, methyl lauroylacetate, 1,2-ethanediol, 1,2-propanediol, 1,2-butanediol, 1,2-pentanediol, 2,3-butanediol, 2,3-pentanediol, glycerol, diethylene glycol, hexylene glycol, and mixtures thereof.

The organic solvent is preferably used in an amount of 0 to 1,000 mL, more preferably 0 to 500 mL per mole of the metal compound. As long as the amount of the organic solvent is up to 1,000 mL, the procedure is economical because the reactor is not of extra size.

Thereafter, the catalyst is neutralized if necessary. The amount of alkali or acid used for neutralization is preferably 0.1 to 2 equivalents relative to the acid or alkali catalyst. Any compound may be used as long as the reaction solution becomes neutral.

Subsequently, the alcohol or by-product formed during hydrolytic condensation reaction are preferably removed from the reaction solution. For by-product removal, the reaction solution is heated at a temperature under a pressure. The heating temperature is preferably 0 to 200° C., more preferably 10 to 150° C., even more preferably 15 to 150° C., depending on the type of the organic solvent added and the by-product formed during reaction. The pressure is preferably up to atmospheric, more preferably up to 80 kPa, even more preferably up to 50 kPa in absolute pressure, depending on the type of the organic solvent and by-product to be removed, vacuum unit, condensation unit, and heating temperature. Although it is difficult to predetermine the amount of by-product to be removed accurately, it is desirable to remove at least about 80% by weight of the by-product formed.

After the by-product is removed, a final solvent is added to the reaction solution. Preferred examples of the solvent include butanediol monomethyl ether, propylene glycol monomethyl ether, ethylene glycol monoethyl ether, butanediol monoethyl ether, propylene glycol monoethyl ether, ethylene glycol monoethyl ether, butanediol monopropyl ether, propylene glycol monopropyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monobutyl ether, 1-butanol, 2-butanol, 2-methyl-1-propanol, 4-methyl-2-pentanol, acetone, tetrahydrofuran, toluene, hexane, ethyl acetate, cyclohexanone, methyl pentyl ketone, propylene glycol dimethyl ether, diethylene glycol dimethyl ether, dipentyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

The molecular weight of the hydrolytic condensate of the metal compound having formula (A-1) or the reaction product thereof with the di- or trihydric alcohol having formula (A-2) may be adjusted by selecting a particular metal compound and controlling the reaction conditions during hydrolytic condensation. The hydrolytic condensate or reaction product preferably has a weight average molecular weight (Mw) of up to 100,000, more preferably 200 to 50,000, even more preferably 300 to 30,000. As long as Mw is up to 100,000, neither foreign particles nor coating spots form. As used herein, Mw is measured versus polystyrene standards by gel permeation chromatography (GPC) using an RI detector and tetrahydrofuran (THF) eluent.

The resist composition using the above-defined component (A) has improved shelf stability, that is, its properties remain unchanged over a long period of time. It may be processed to form a fine size pattern of satisfactory profile. A resist film formed from the resist composition may be heated at a relatively low temperature for the purpose of reaction promotion. Component (A) may be used alone or in combination of two or more.

(B) Sensitizer

The resist composition also comprises (B) a sensitizer containing a compound or metal salt having the formula (B-1). By virtue of the sensitizer, the resist composition is improved in sensitivity.

$$M^{n+}(X^-)_n \quad (B-1)$$

In formula (B-1), $M^{n+}$ is a metal ion selected from the group consisting of Mg, Ca, Ce, Zn, Cu, In, Fe, Yb, Y, Tm, Sn, Ni, Sc, Hf, Nb, Ti, Zr, Ba, Ho, Tb, Lu, La, Ag, Eu, Dy, Gd, Rb, Sr, and Cs. $X^-$ is an alkylsulfonic acid anion, arylsulfonic acid anion, alkylsulfonimidic acid anion or alkylsulfonemethidic acid anion, each having at least one fluorine atom, and n is an integer of 1 to 4 (1≤n≤4).

$X^-$ is preferably an anion selected from the following formulae (B-2) to (B-4).

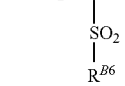

In formula (B-2), $R^{B1}$ is a $C_5$-$C_{30}$ monovalent hydrocarbon group having at least one fluorine atom, which may contain another halogen atom, thiol, ether, ester, carbonate, carbonyl, amide, amino, azide, carbamate, nitro, cyano, hydroxyl, carboxyl, sulfo, sulfonic acid ester, sultone moiety, lactone ring or lactam ring.

The monovalent hydrocarbon group may be straight, branched or cyclic. Examples include $C_5$-$C_{30}$ alkyl, alkenyl and alkynyl groups, $C_6$-$C_{30}$ aryl groups, and $C_6$-$C_{30}$ aralkyl groups.

Examples of the sulfonic acid ion having formula (B-2) are given below, but not limited thereto.

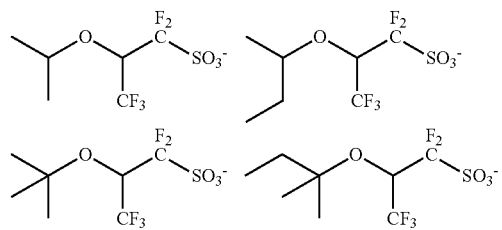

-continued
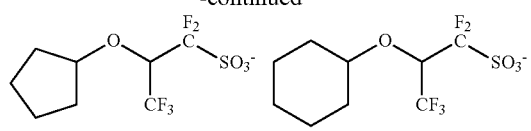
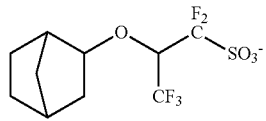
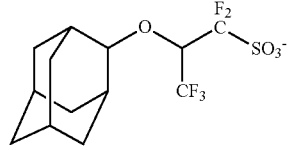
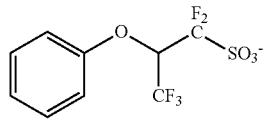
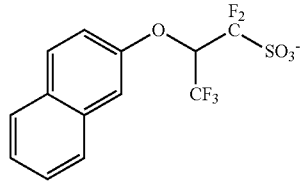
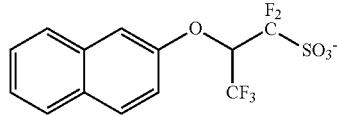
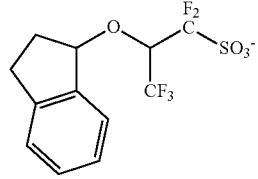
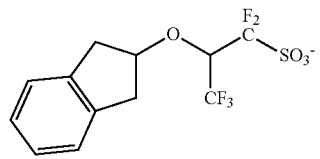
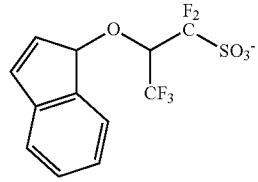
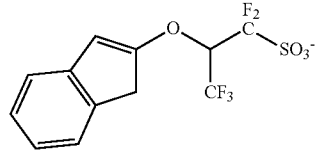
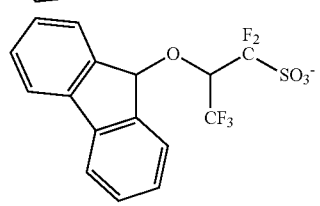
-continued
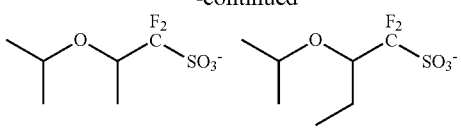
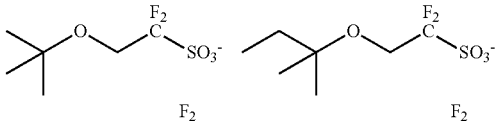
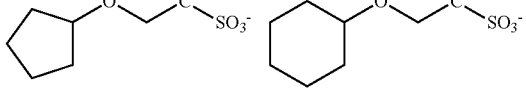
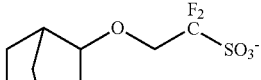
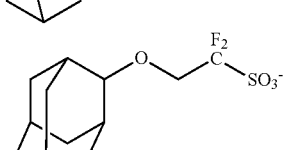
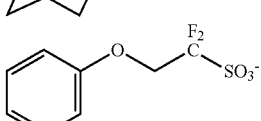
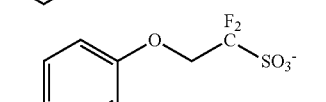
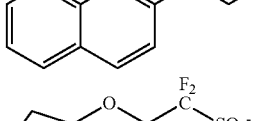
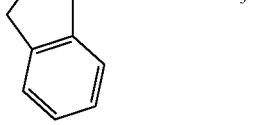
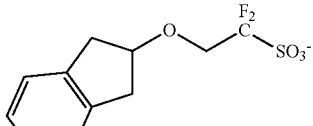
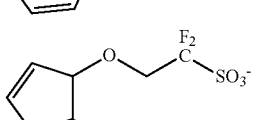
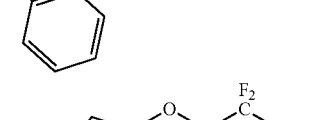

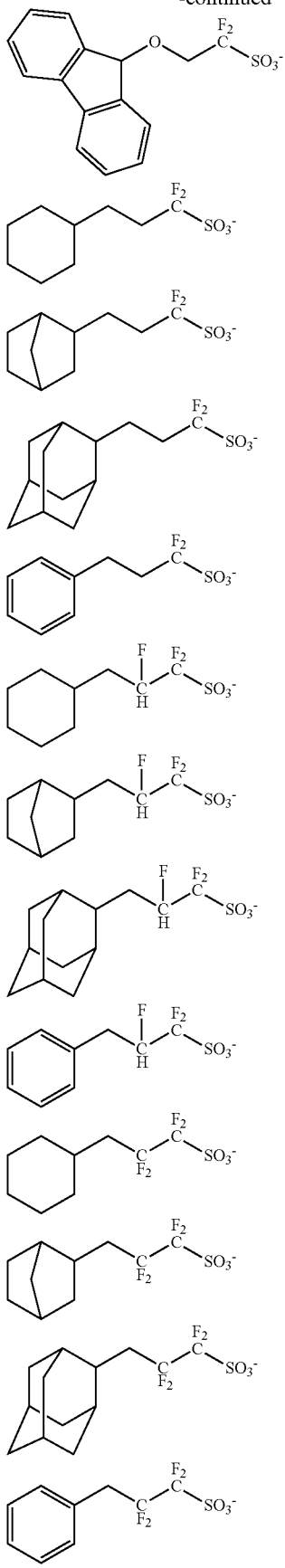
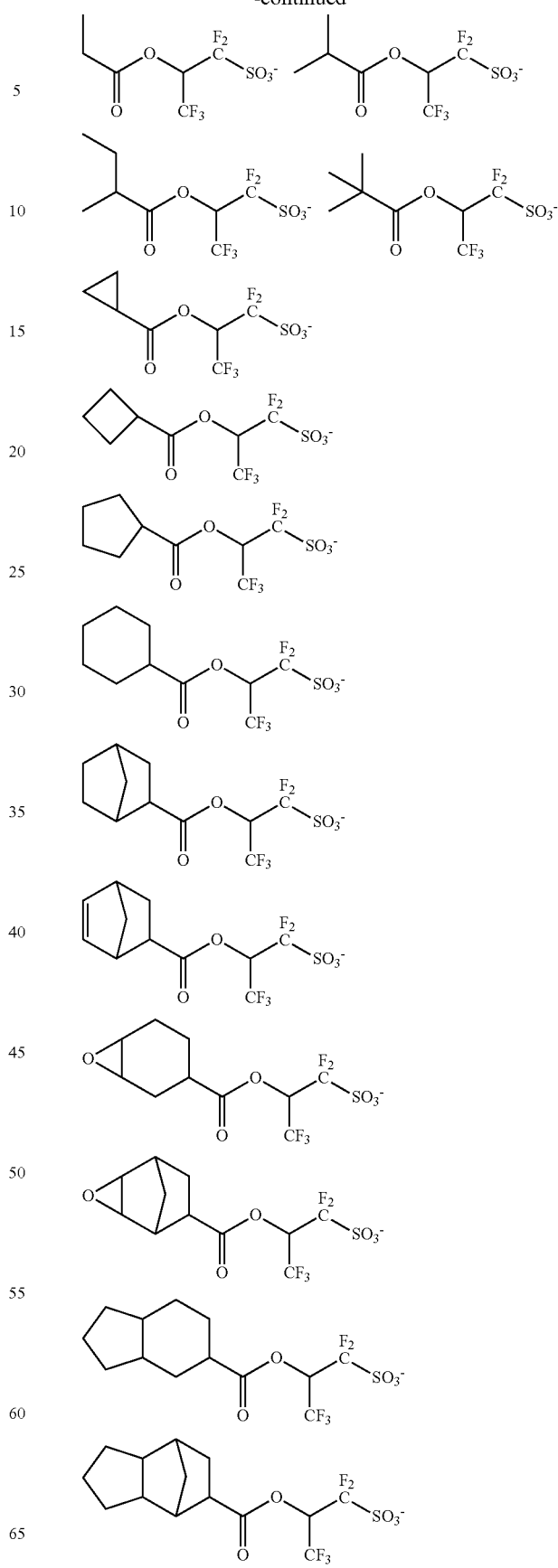

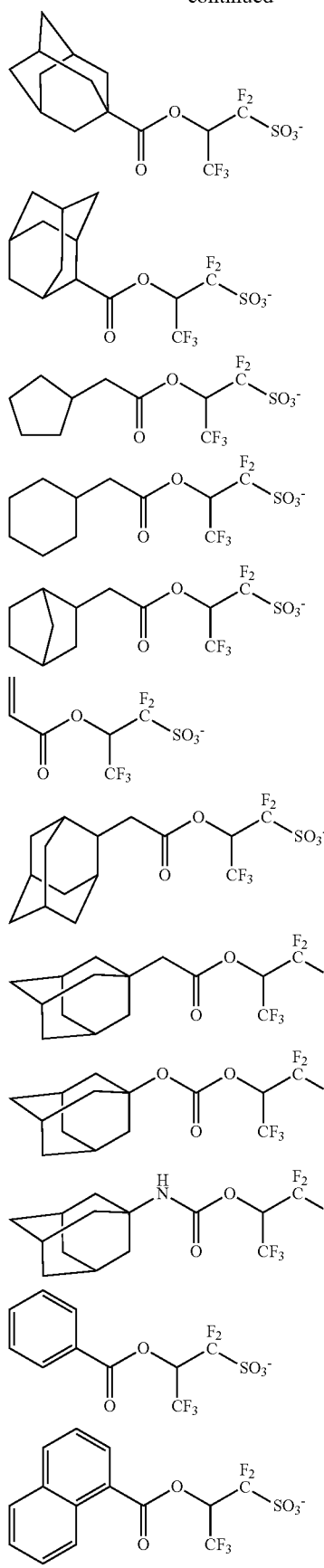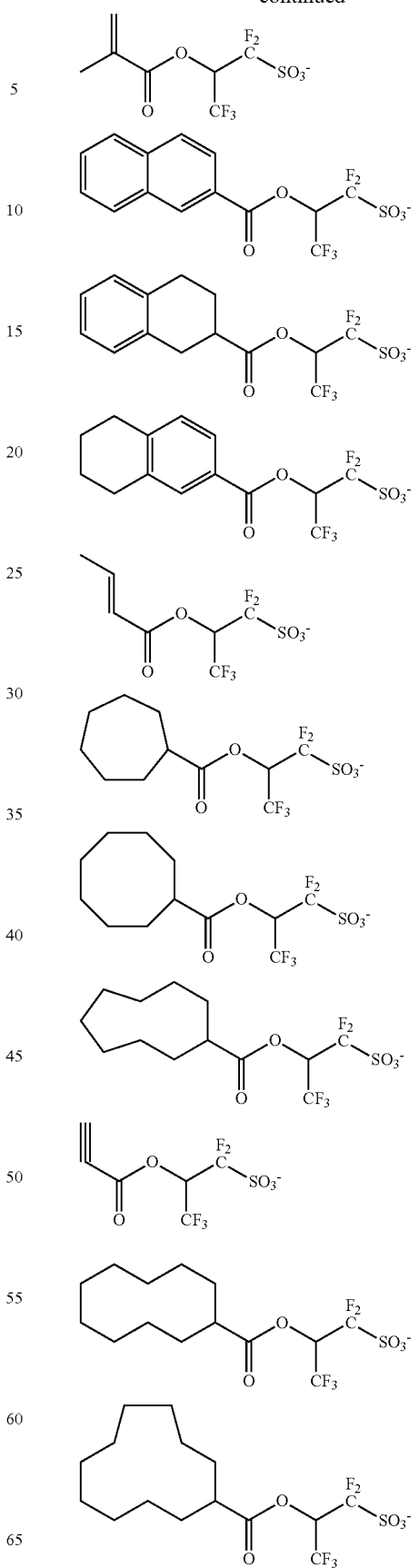

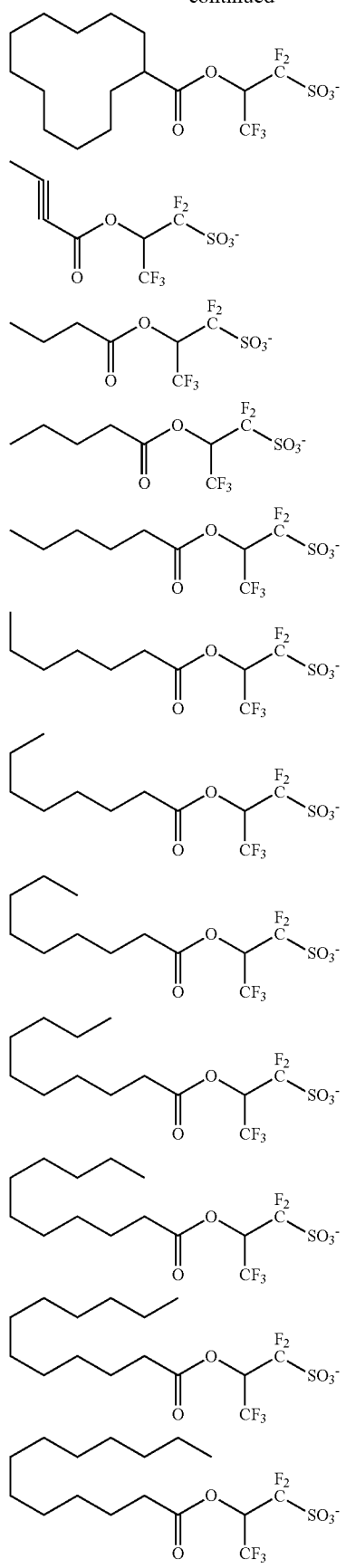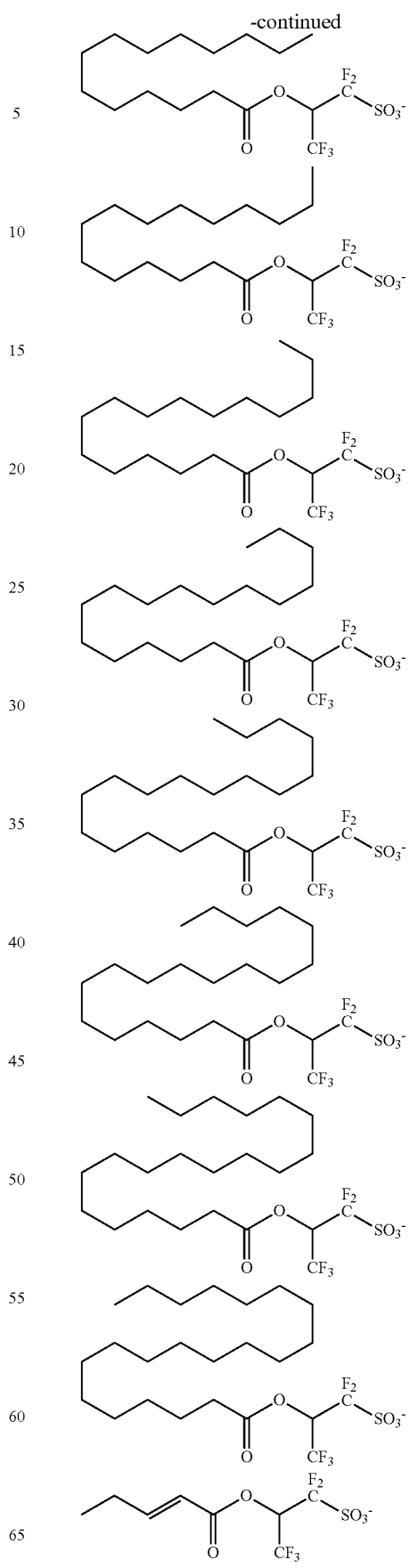

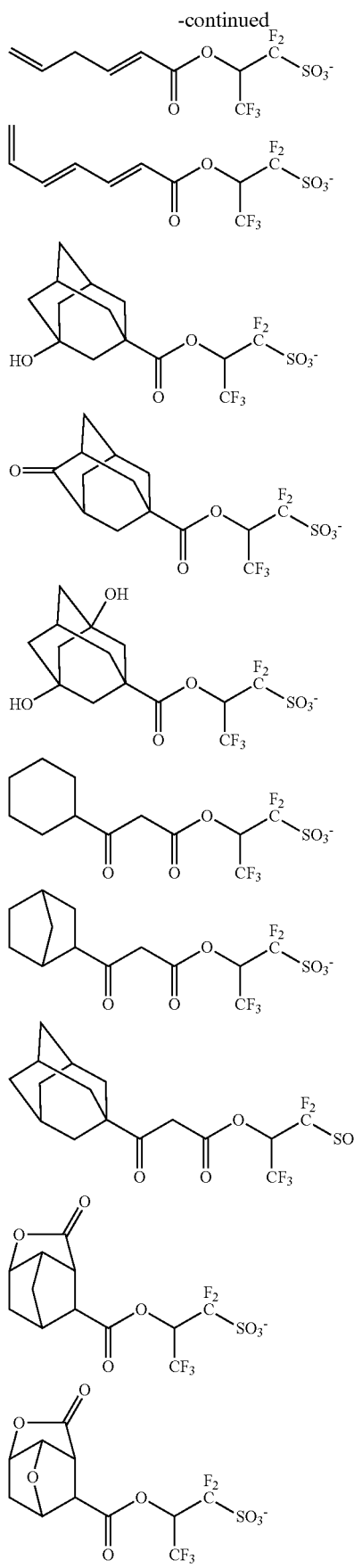
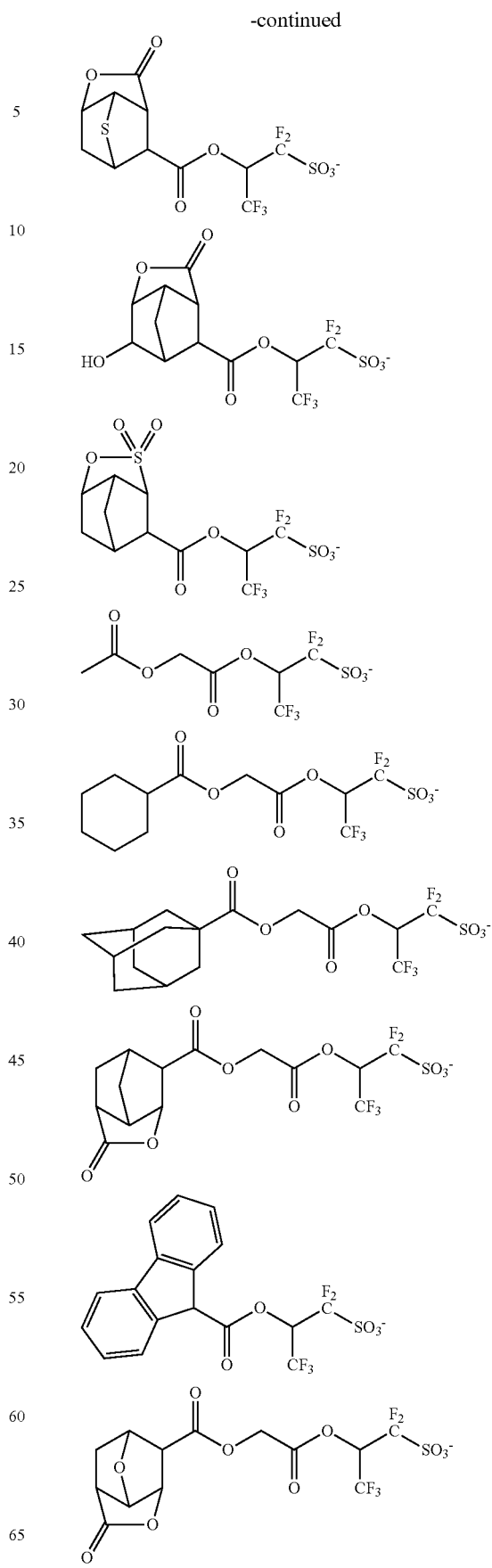

-continued
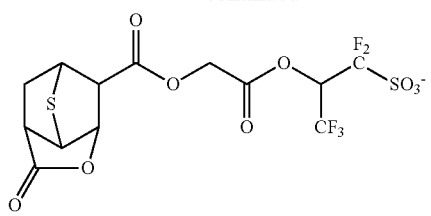
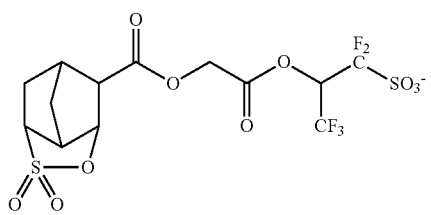
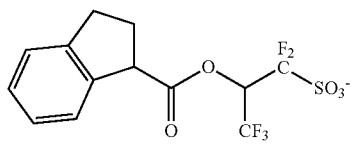
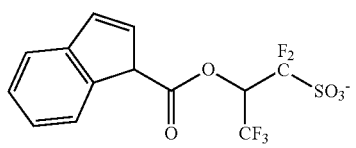
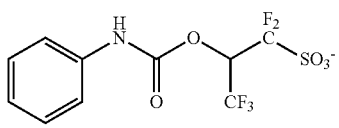
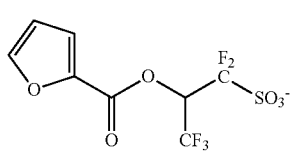
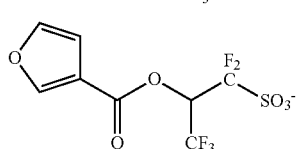
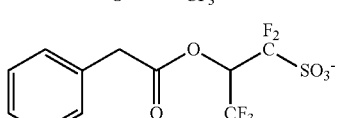
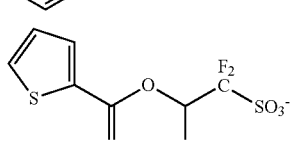
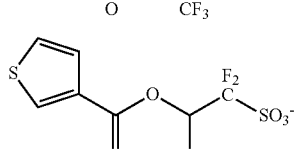
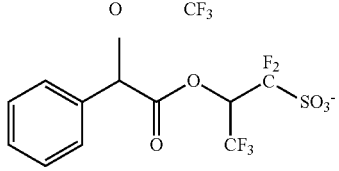
-continued
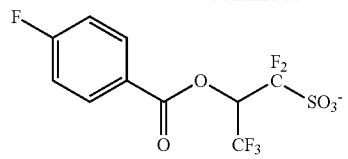
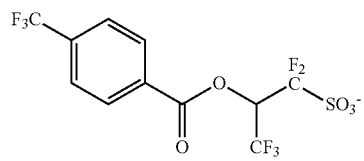
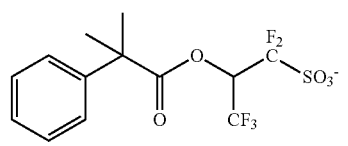
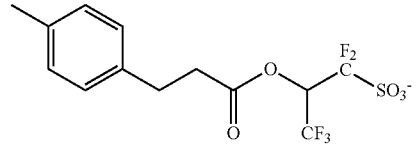
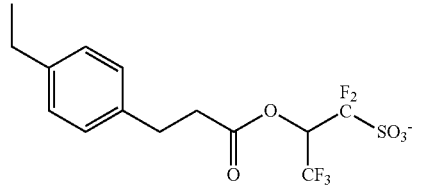
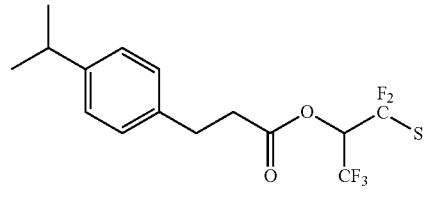
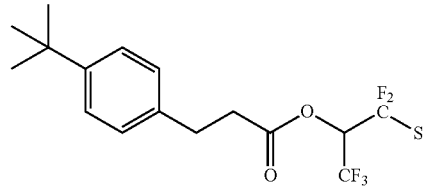
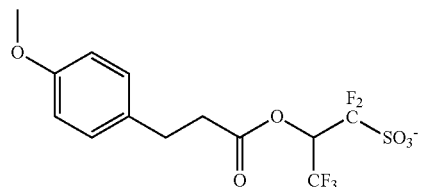
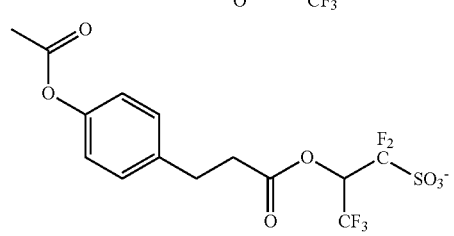

-continued
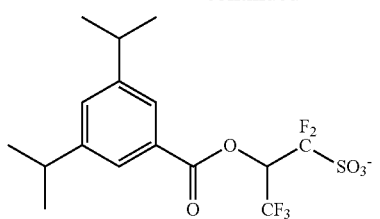
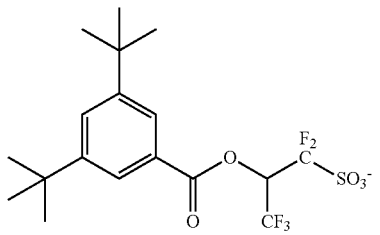
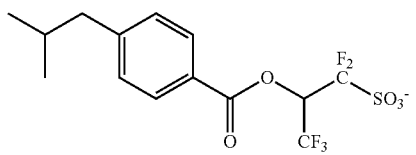
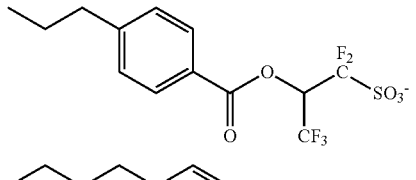
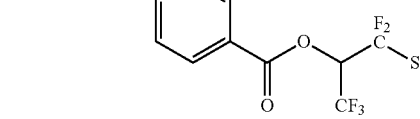
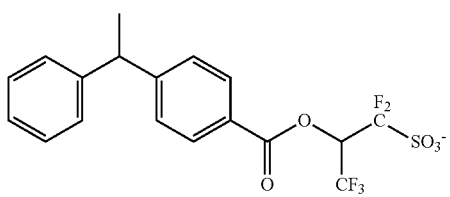
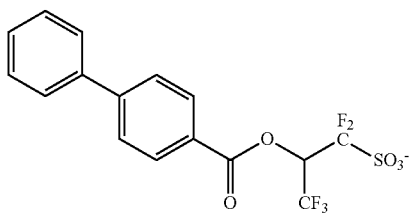
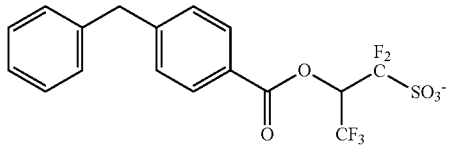
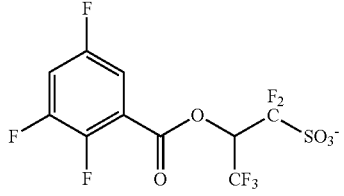
-continued
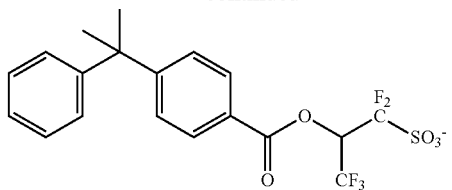
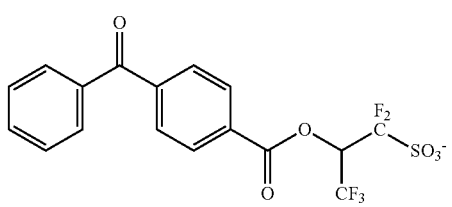
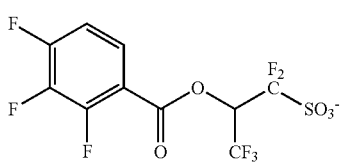
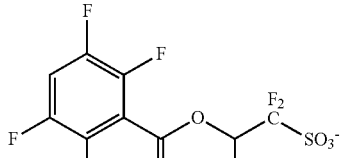
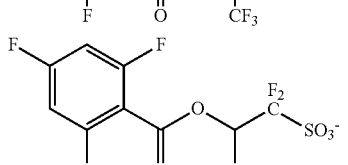
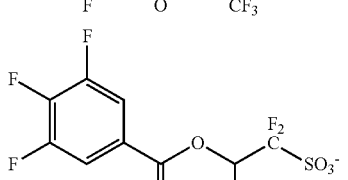
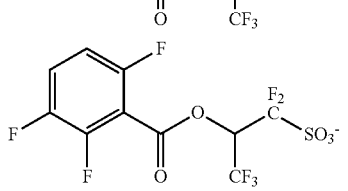
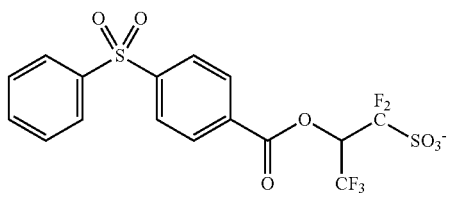
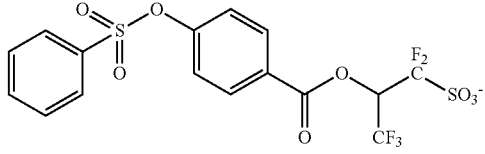

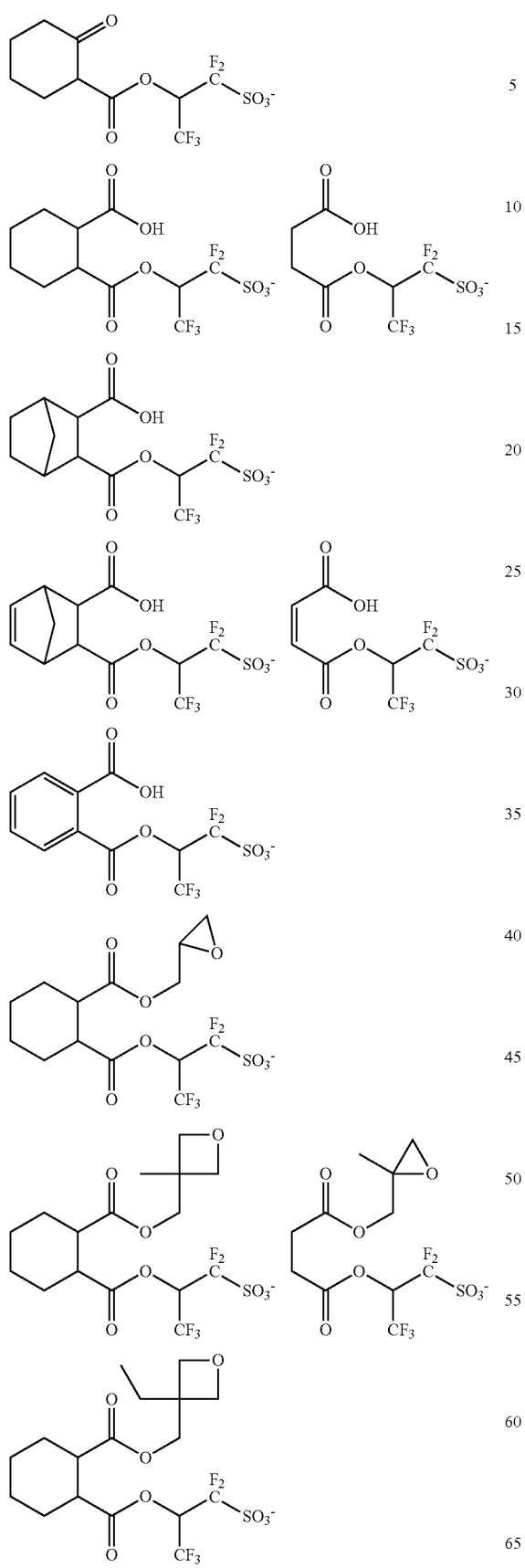
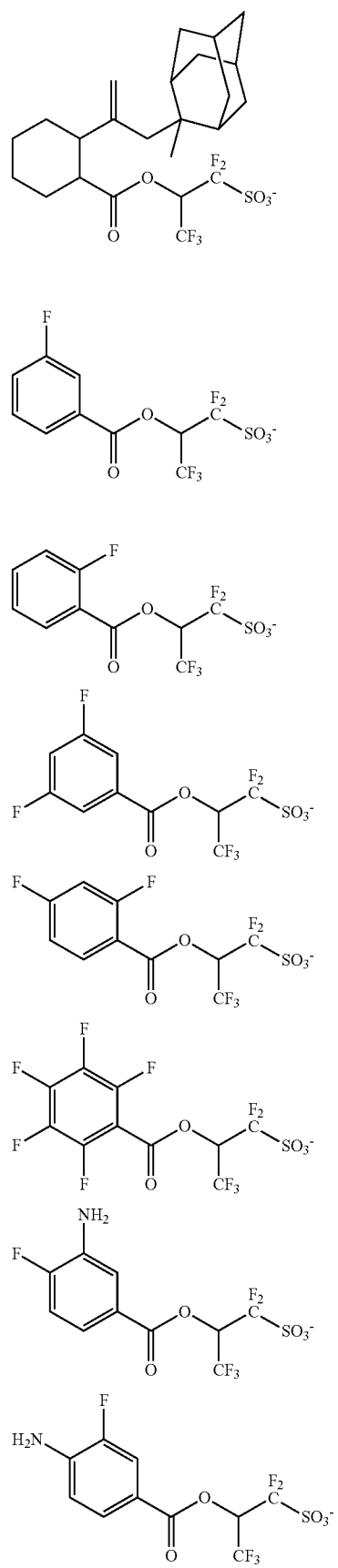

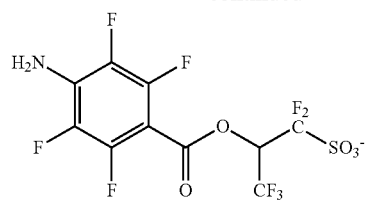
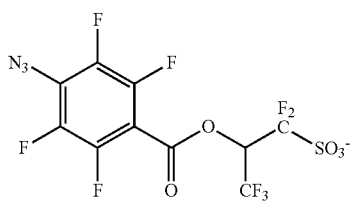
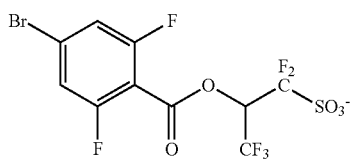
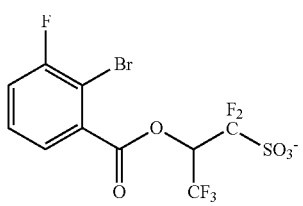
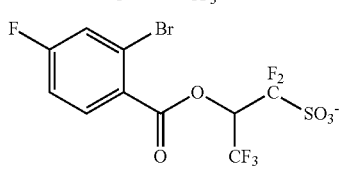
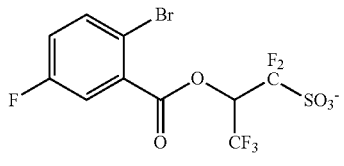
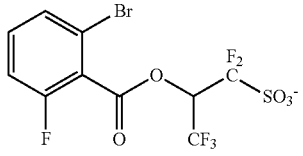
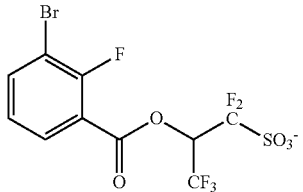
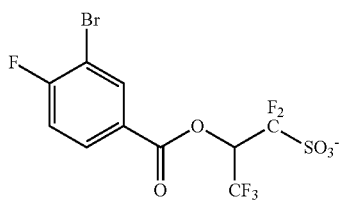
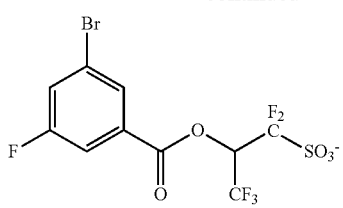
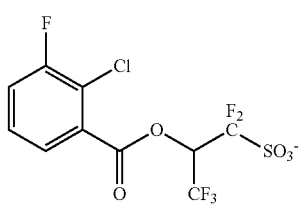
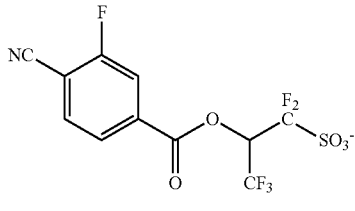
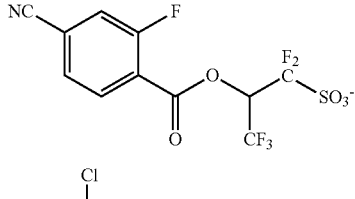
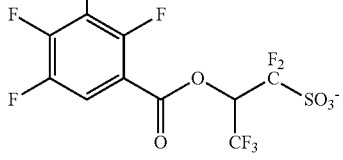
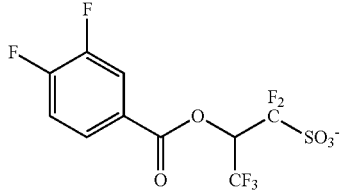
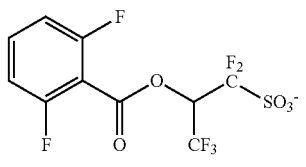
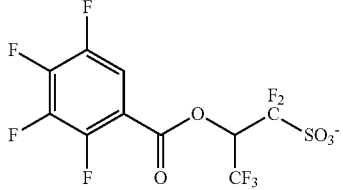
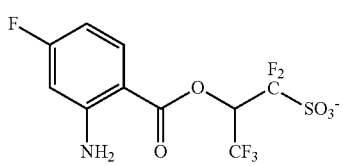

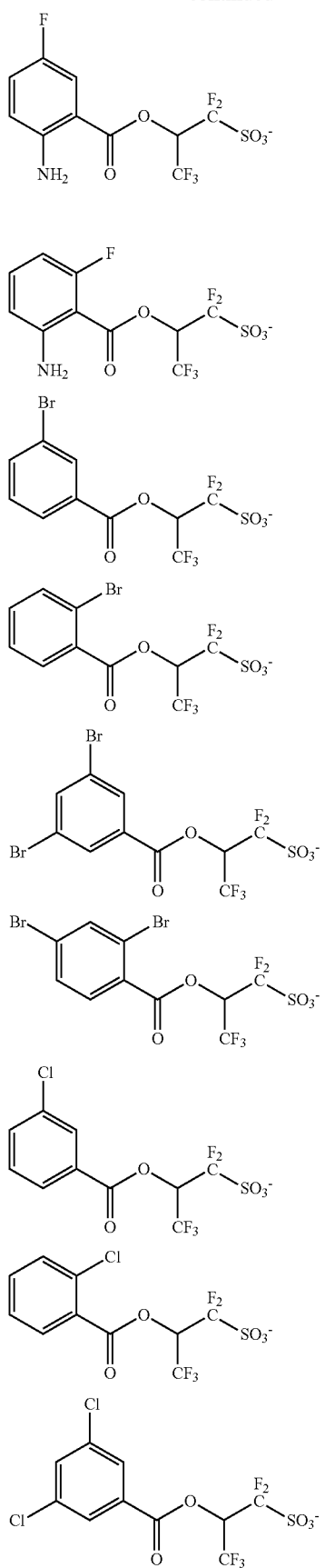
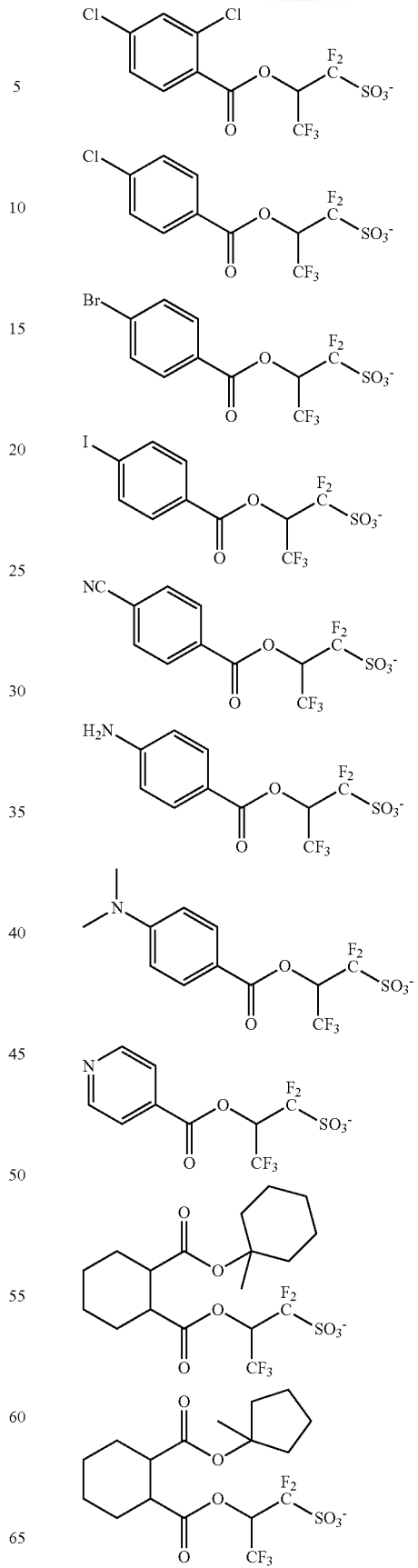

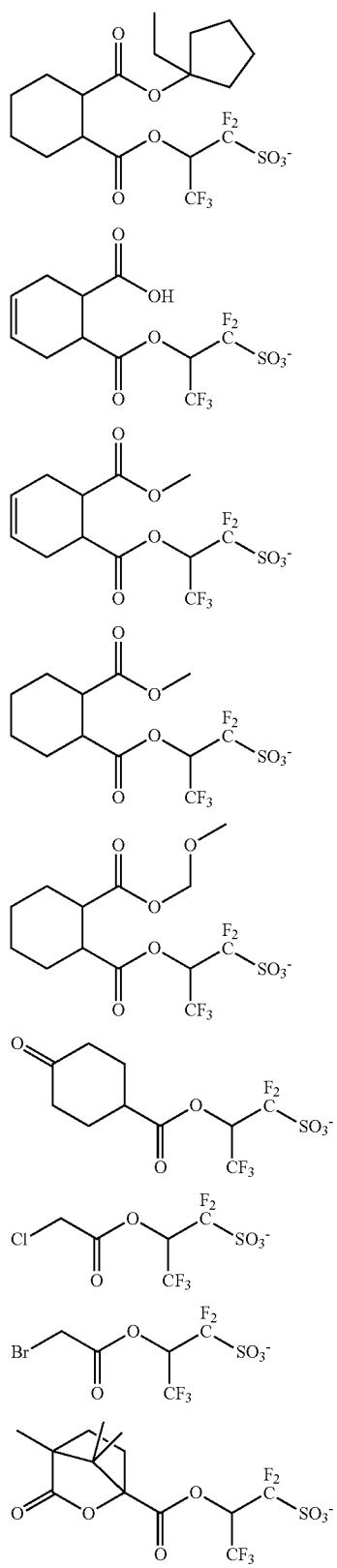
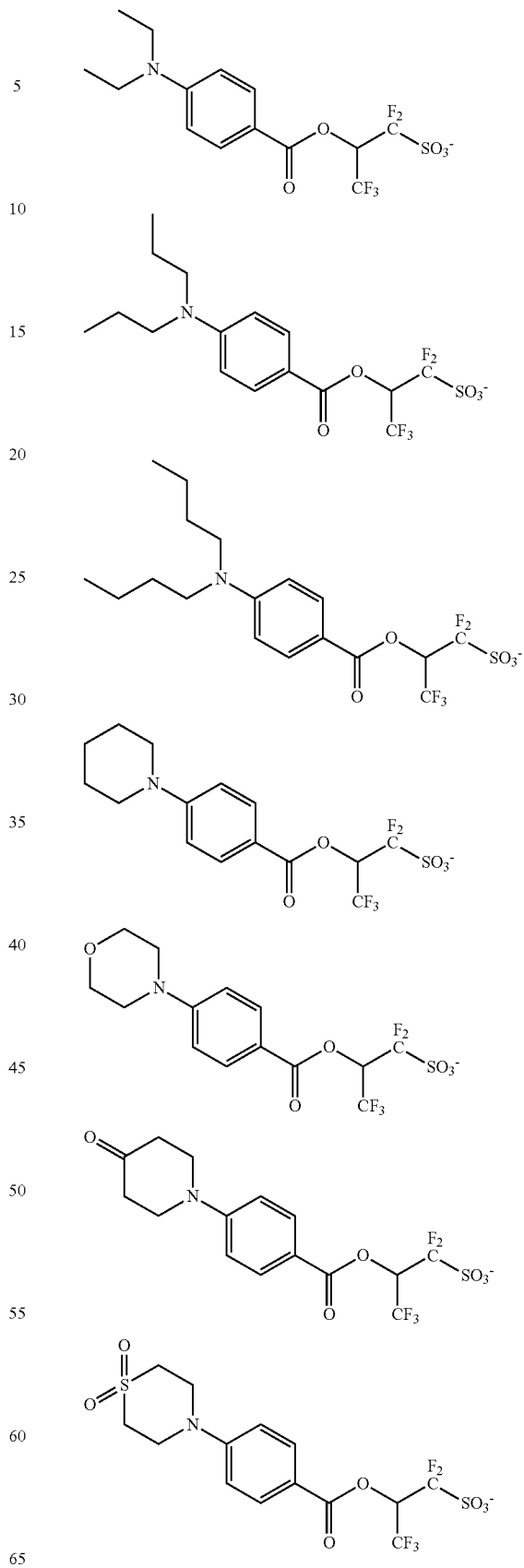

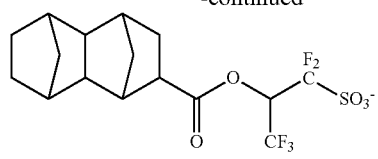
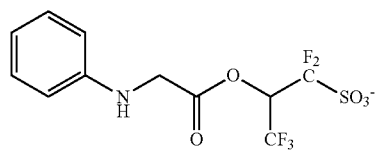
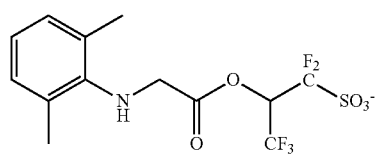
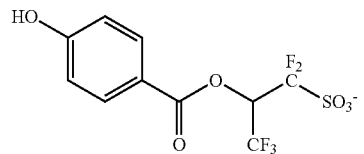
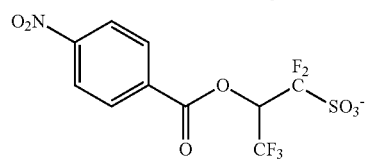
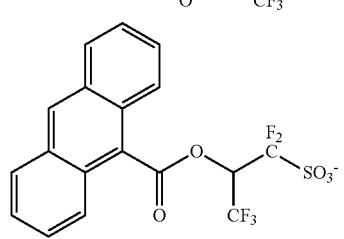
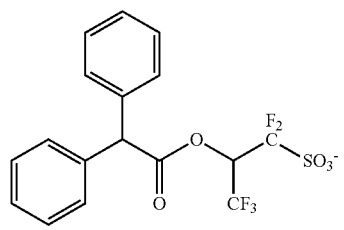
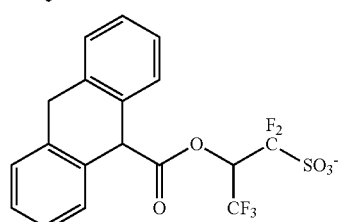
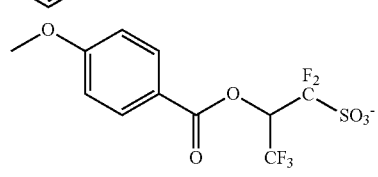
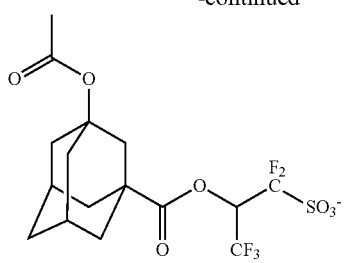
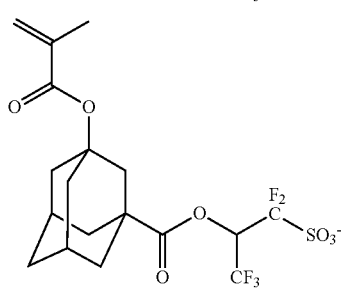
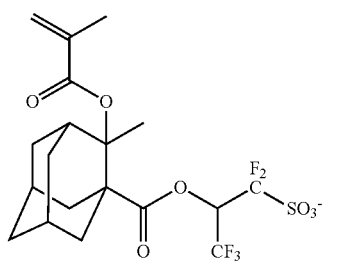
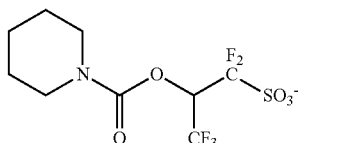
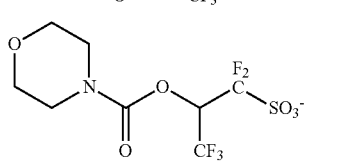
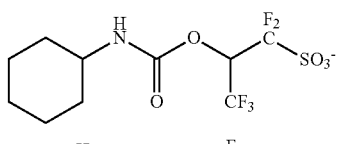
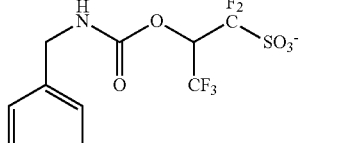
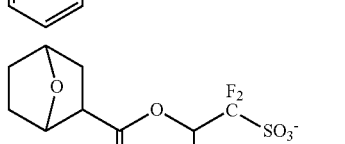
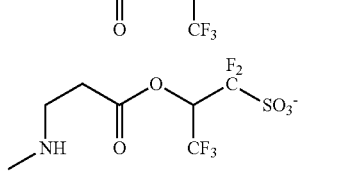

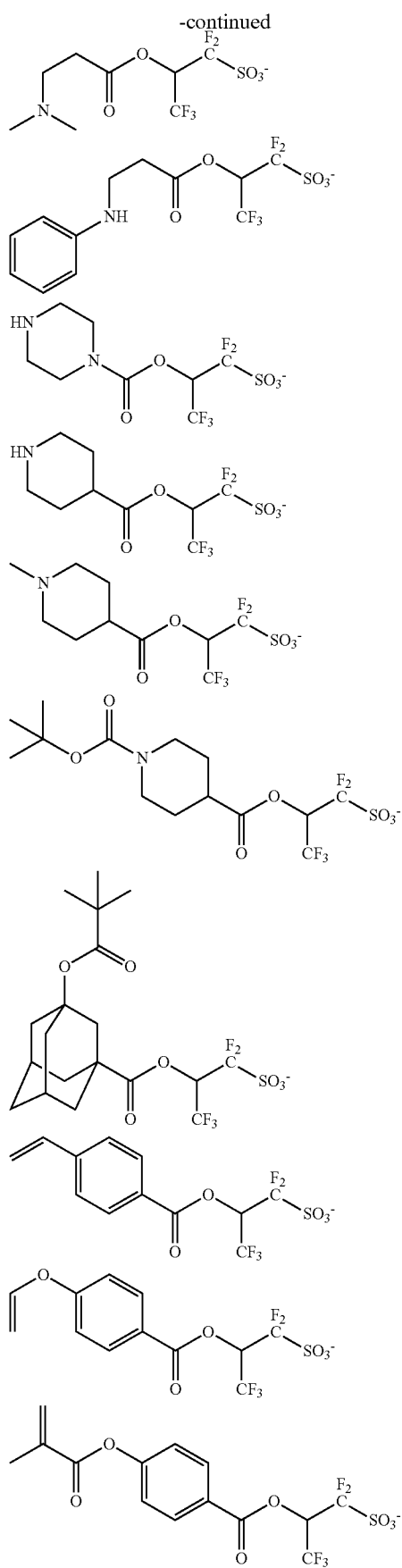

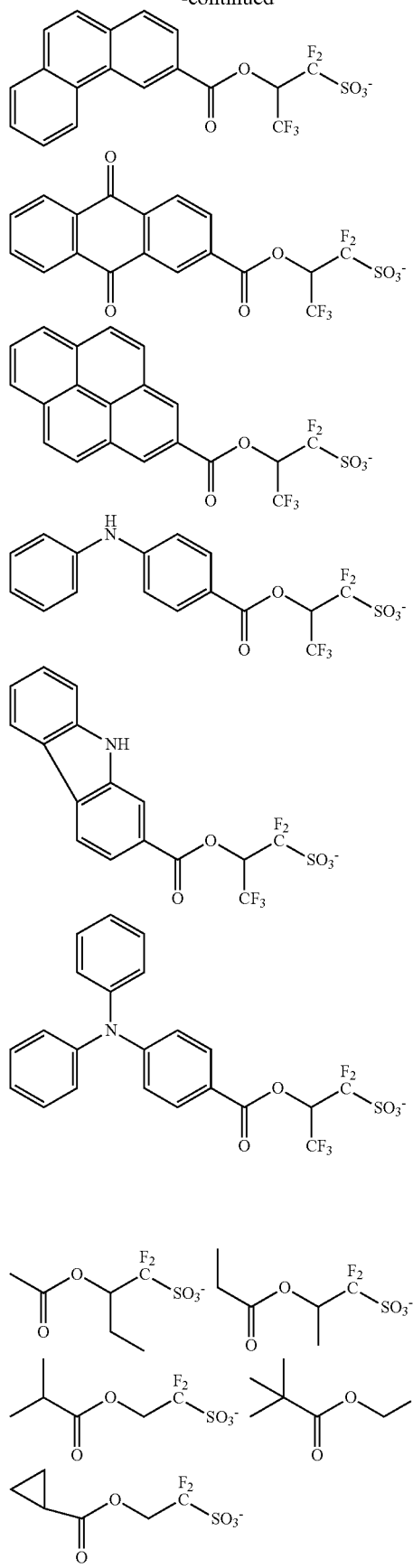
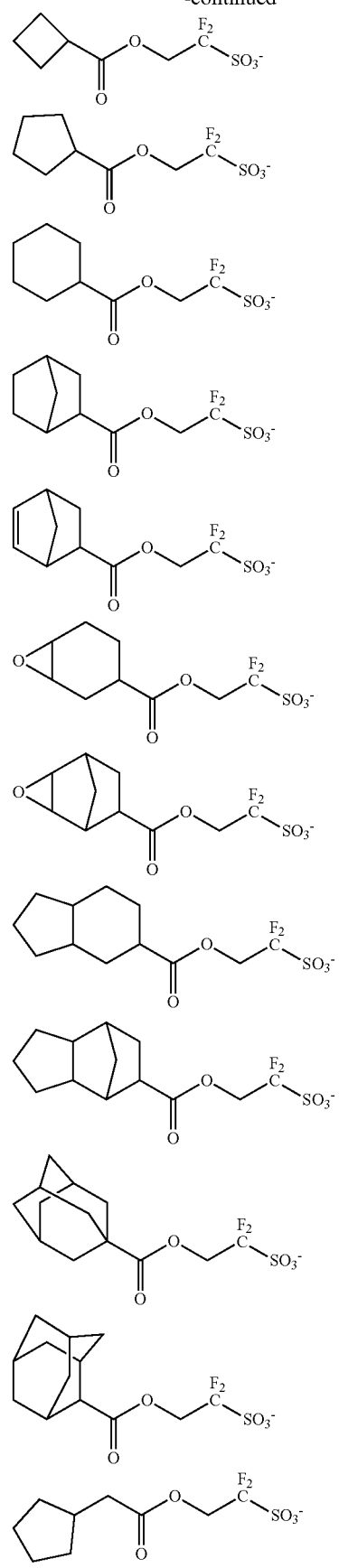

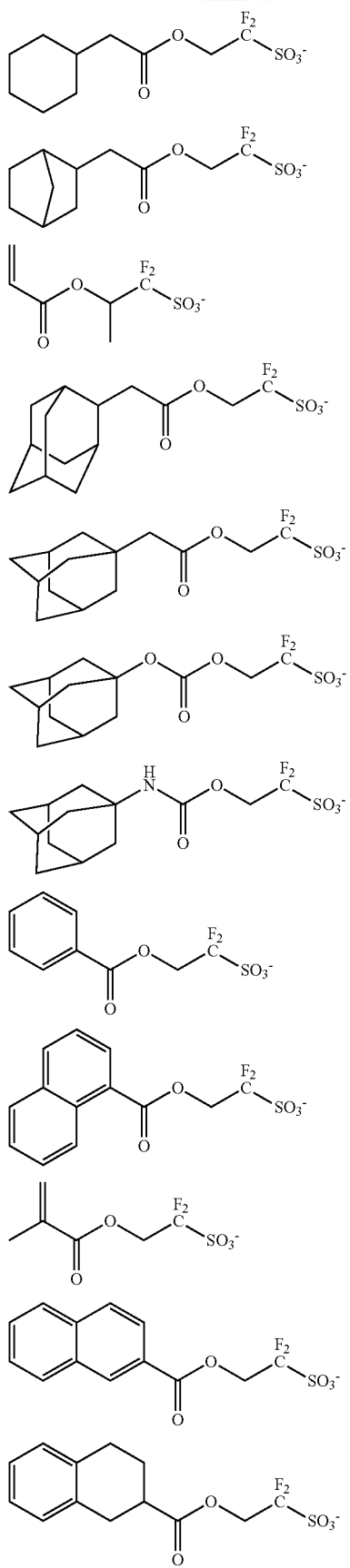
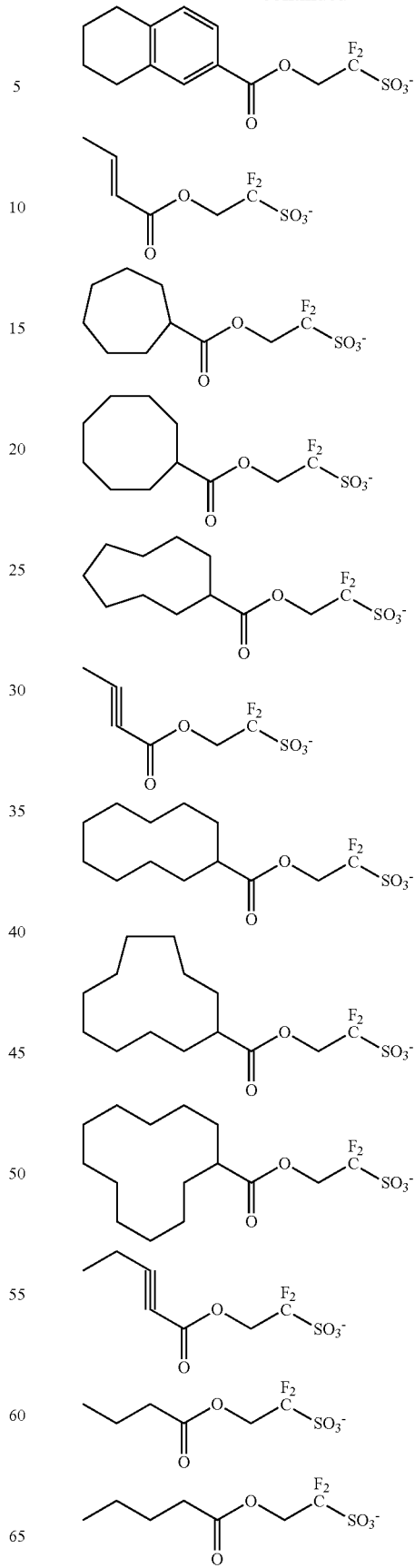

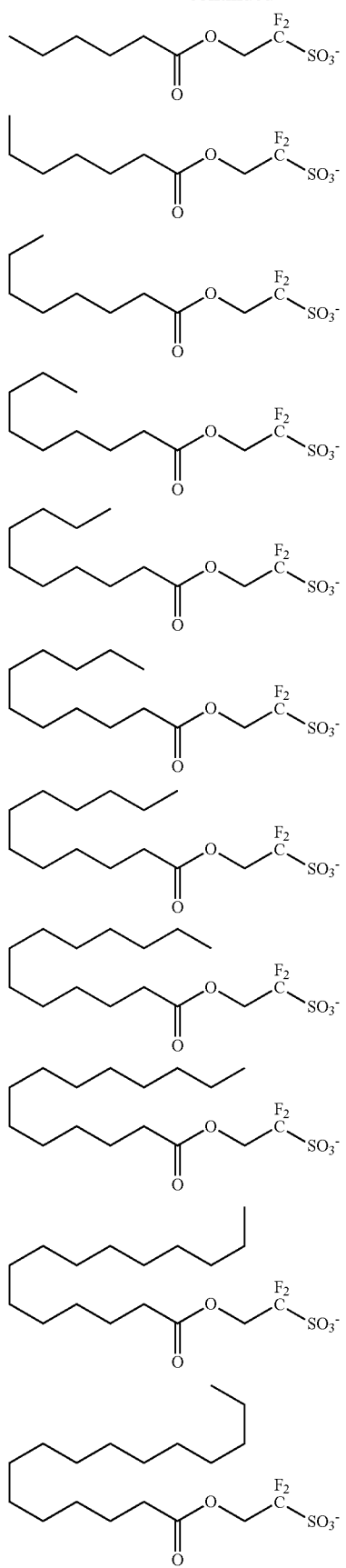
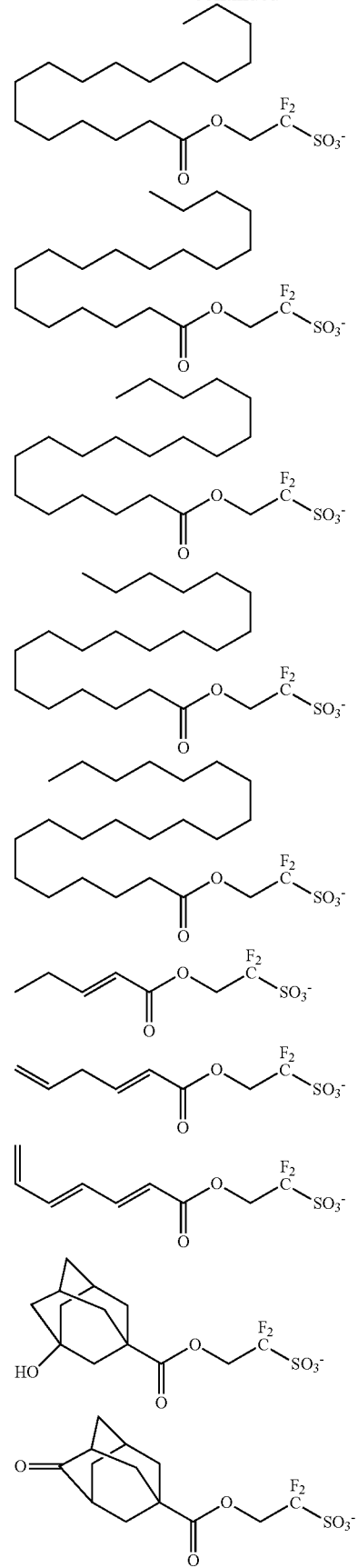

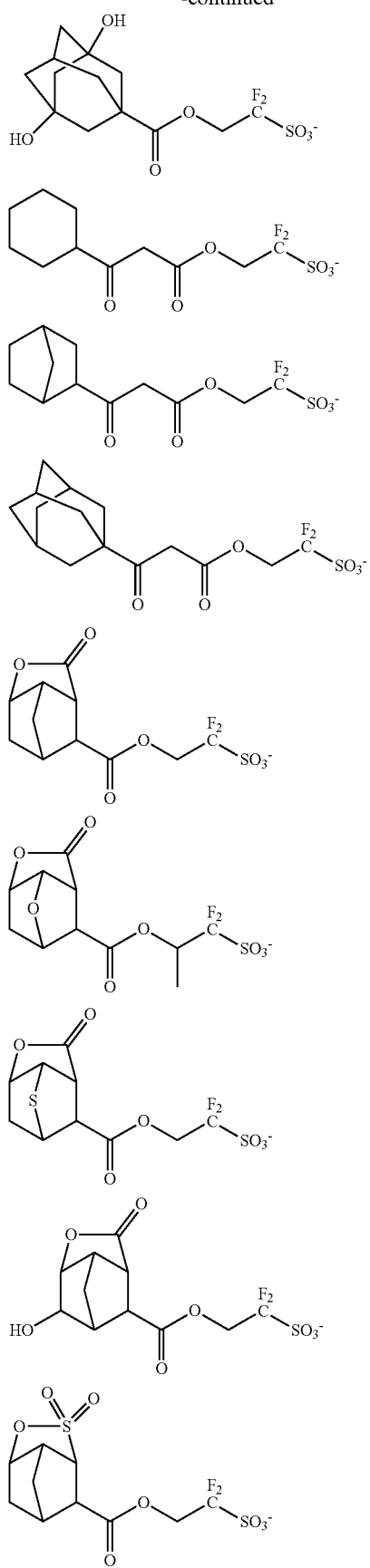
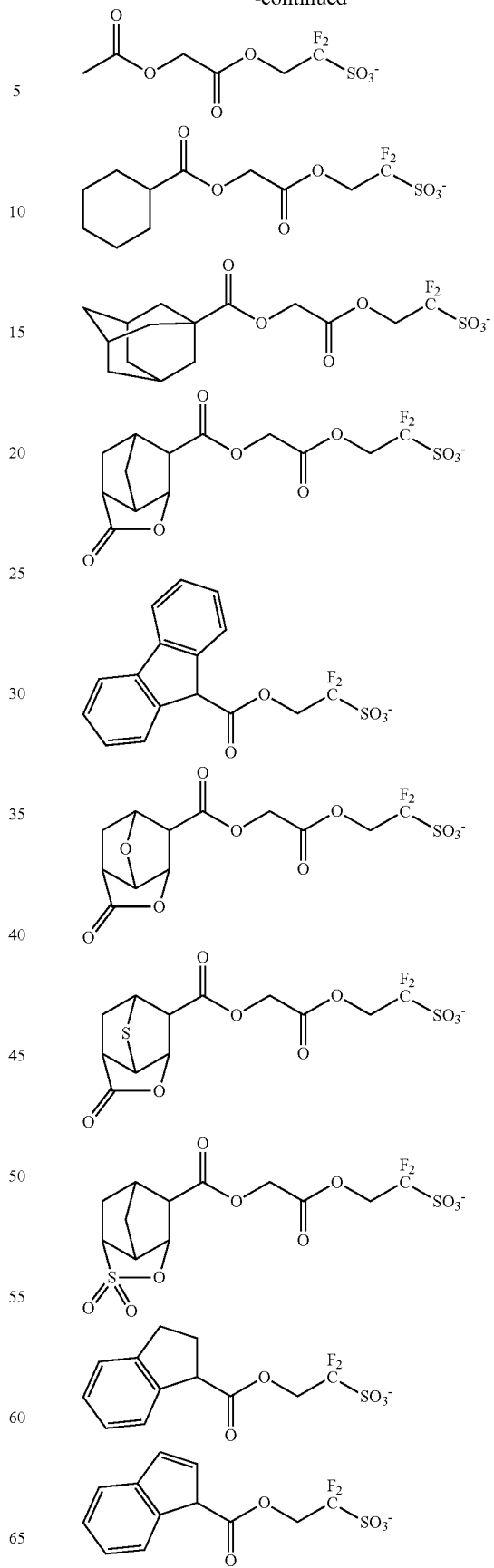

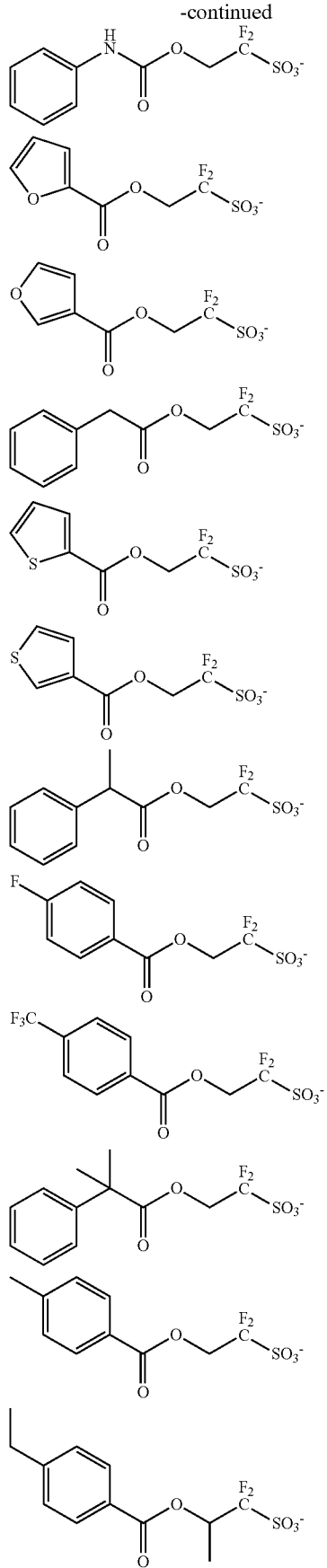
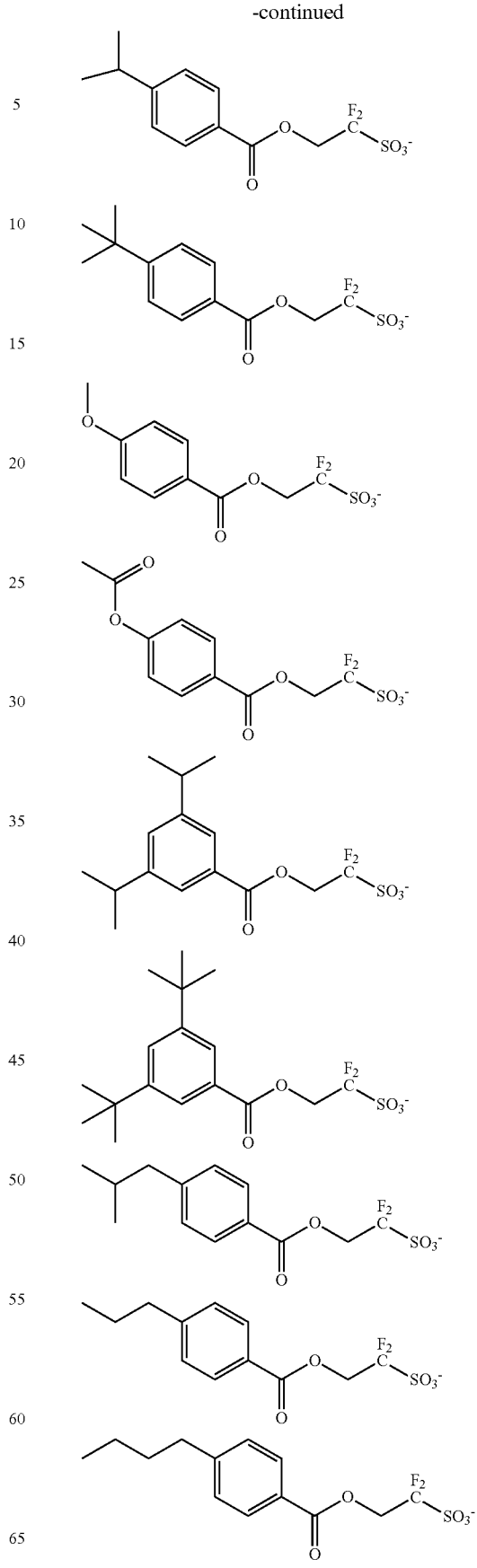

-continued

75
-continued
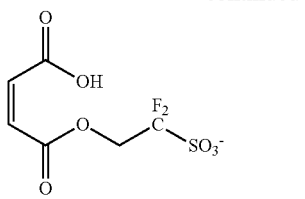
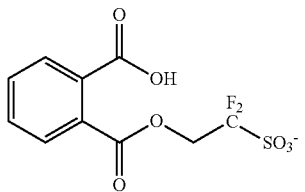
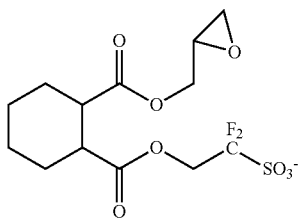
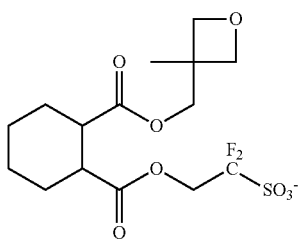
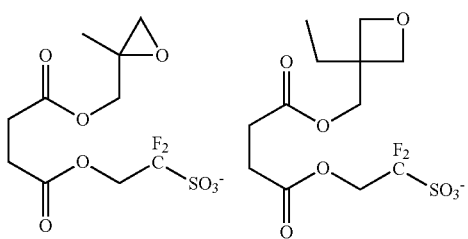
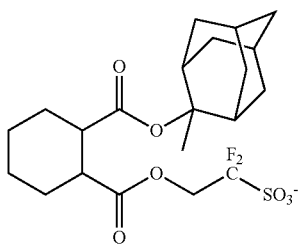
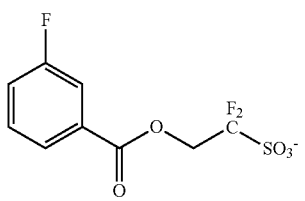
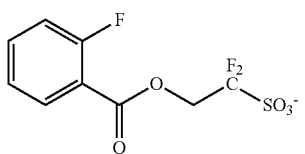
76
-continued
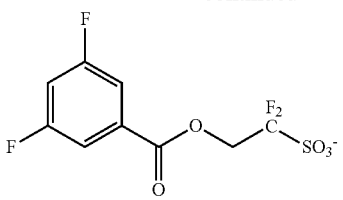
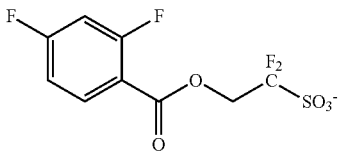
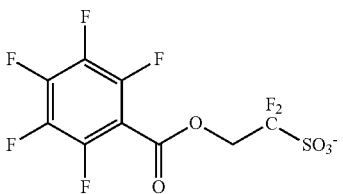
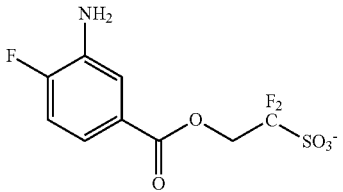
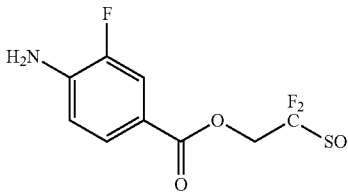
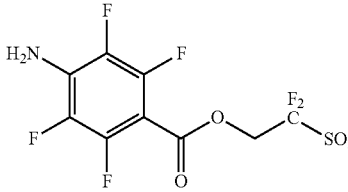
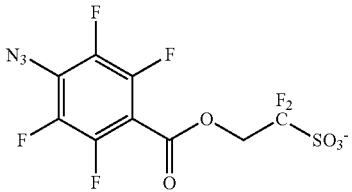
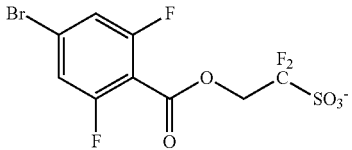
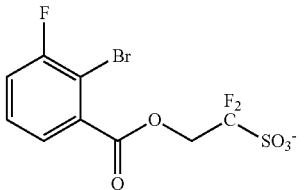

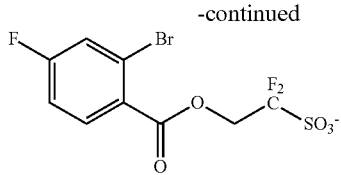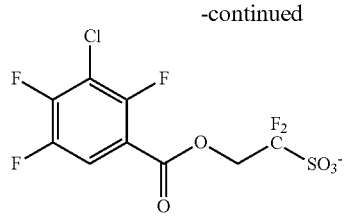

79
-continued
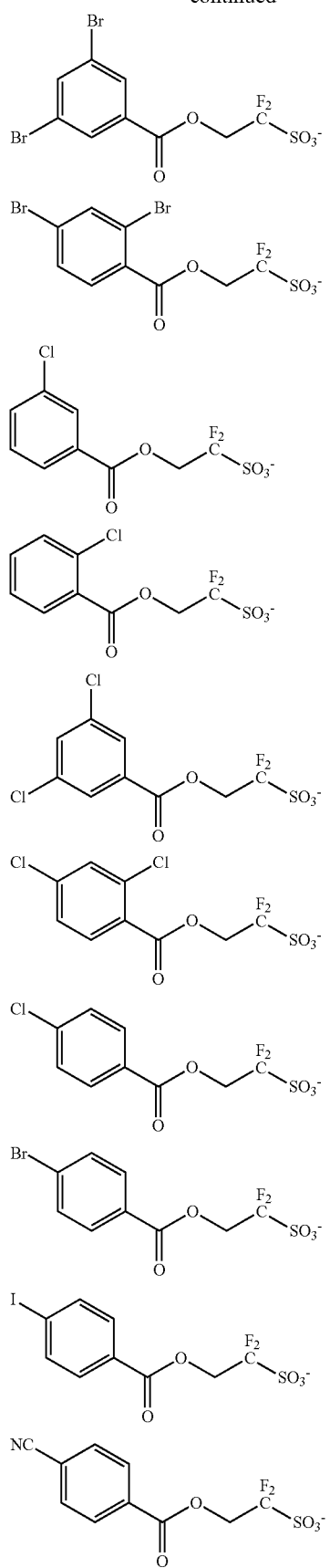
80
-continued
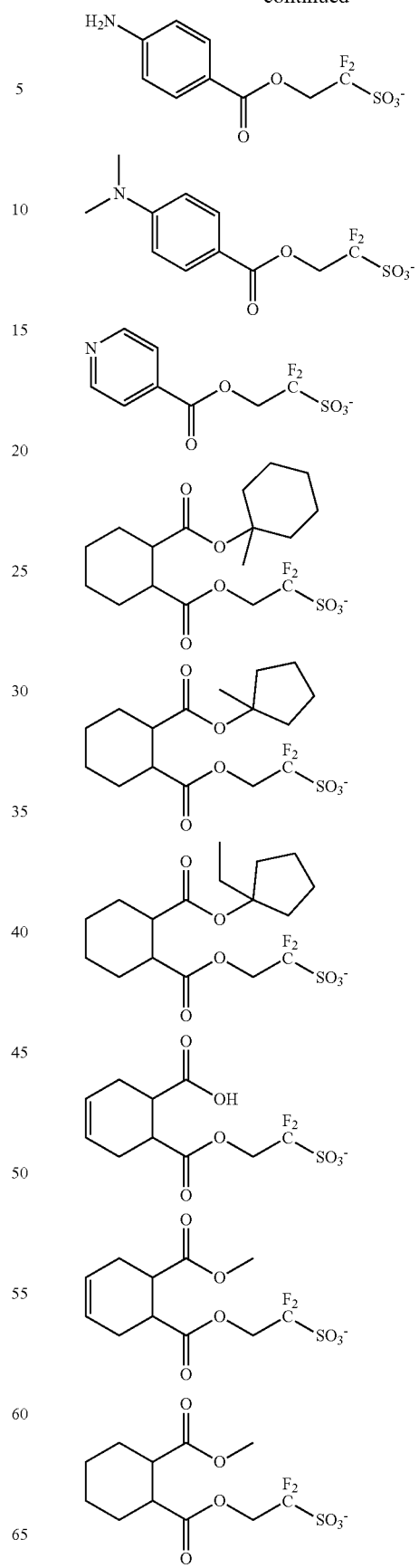

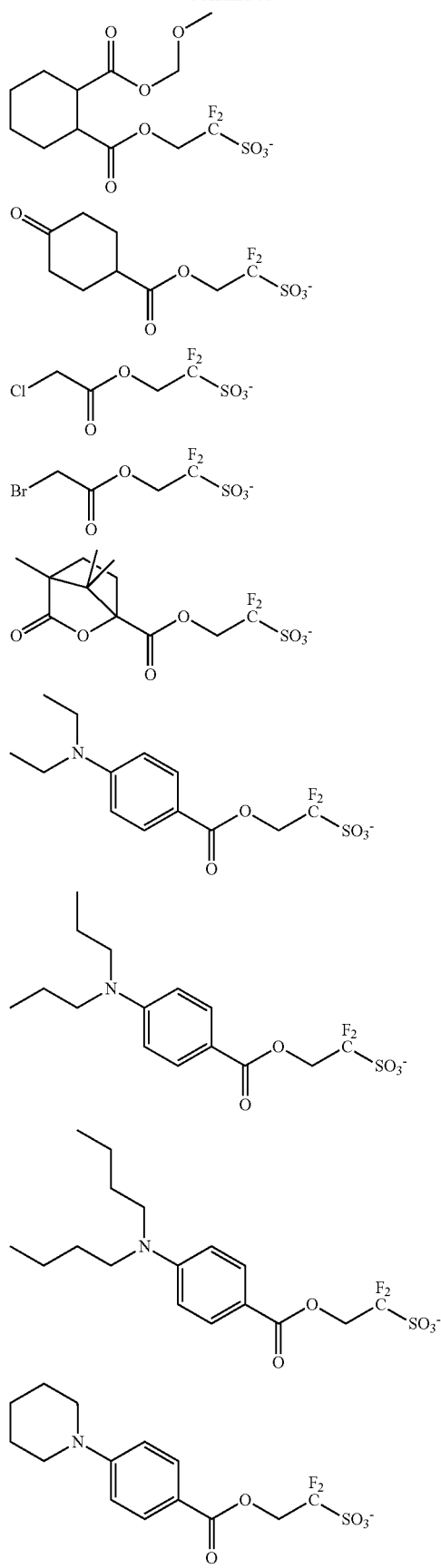
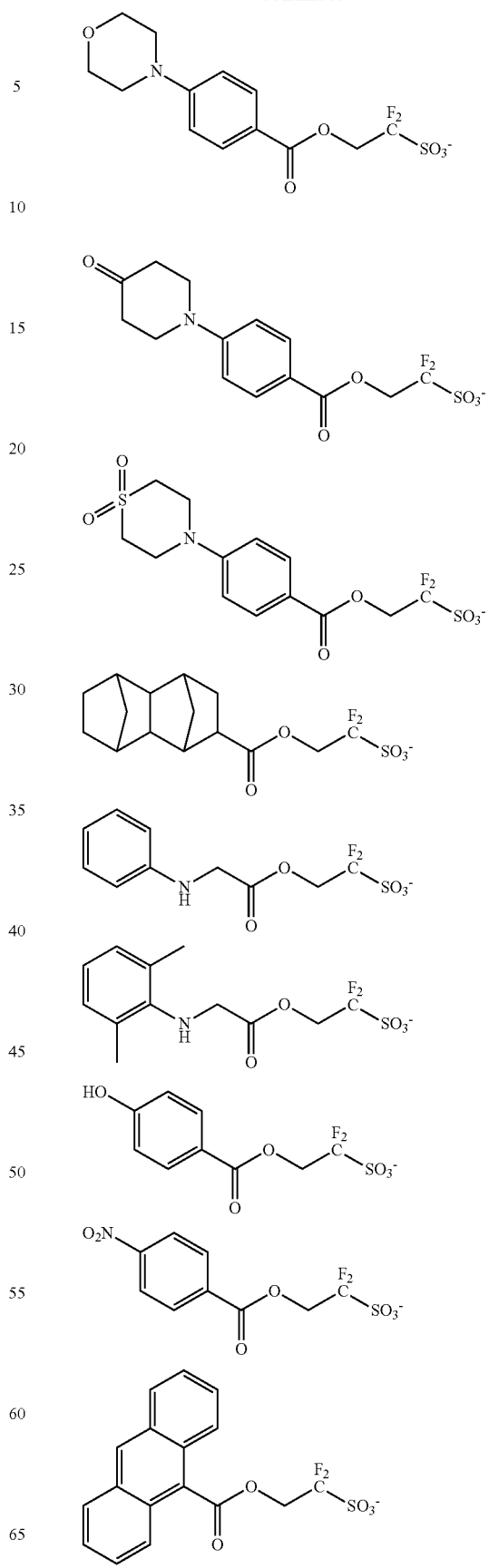

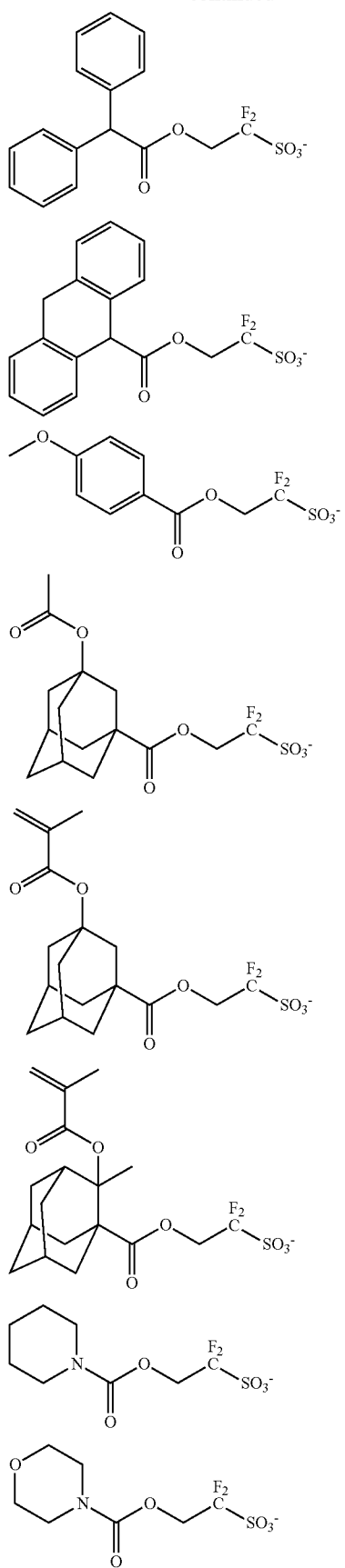
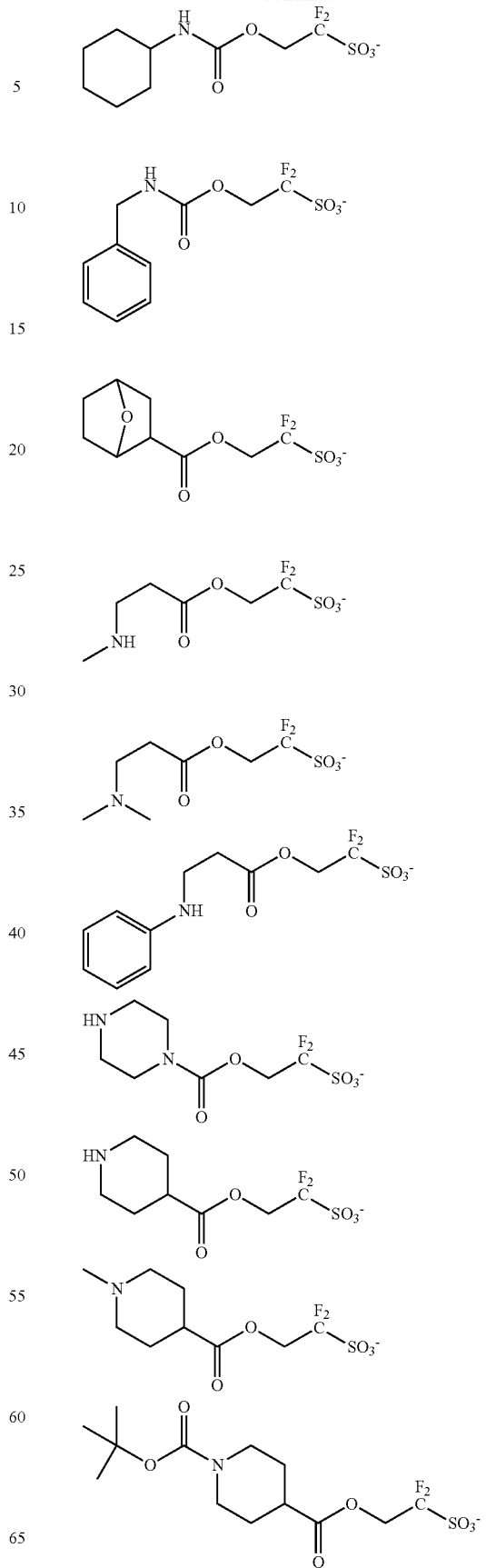

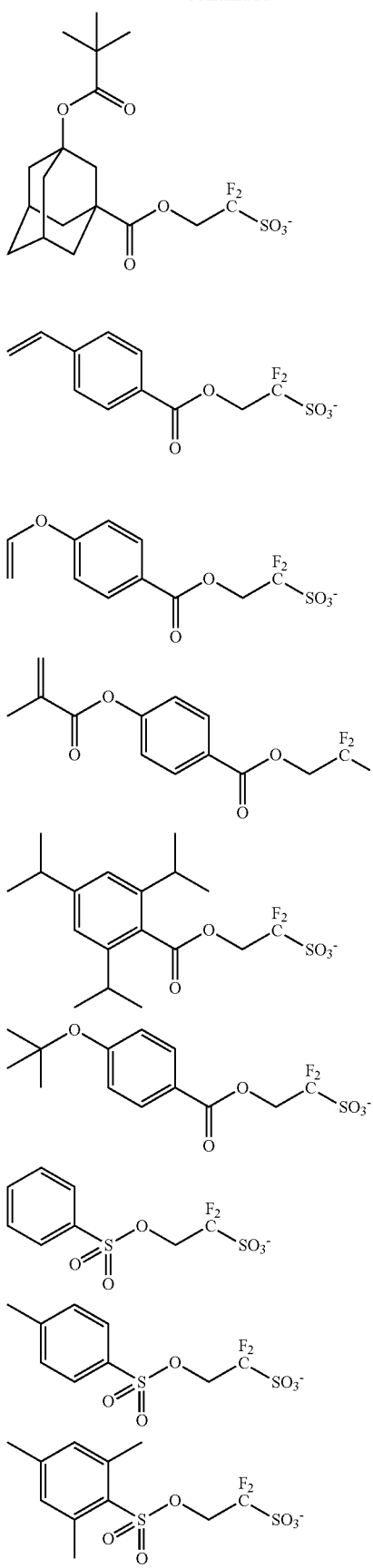
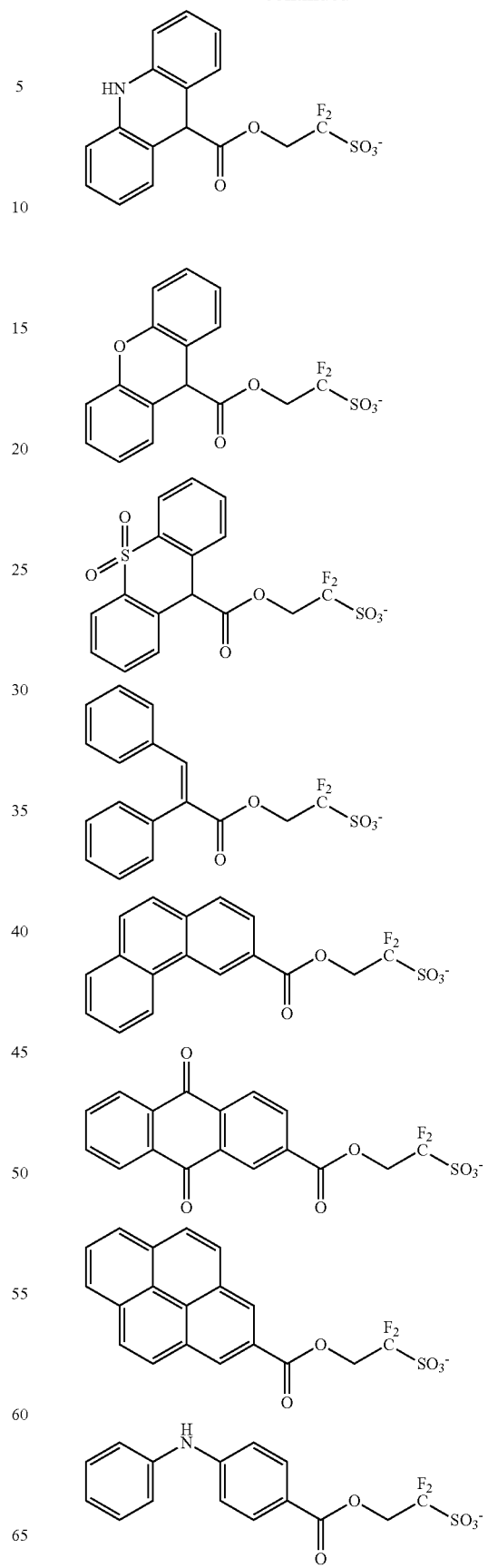

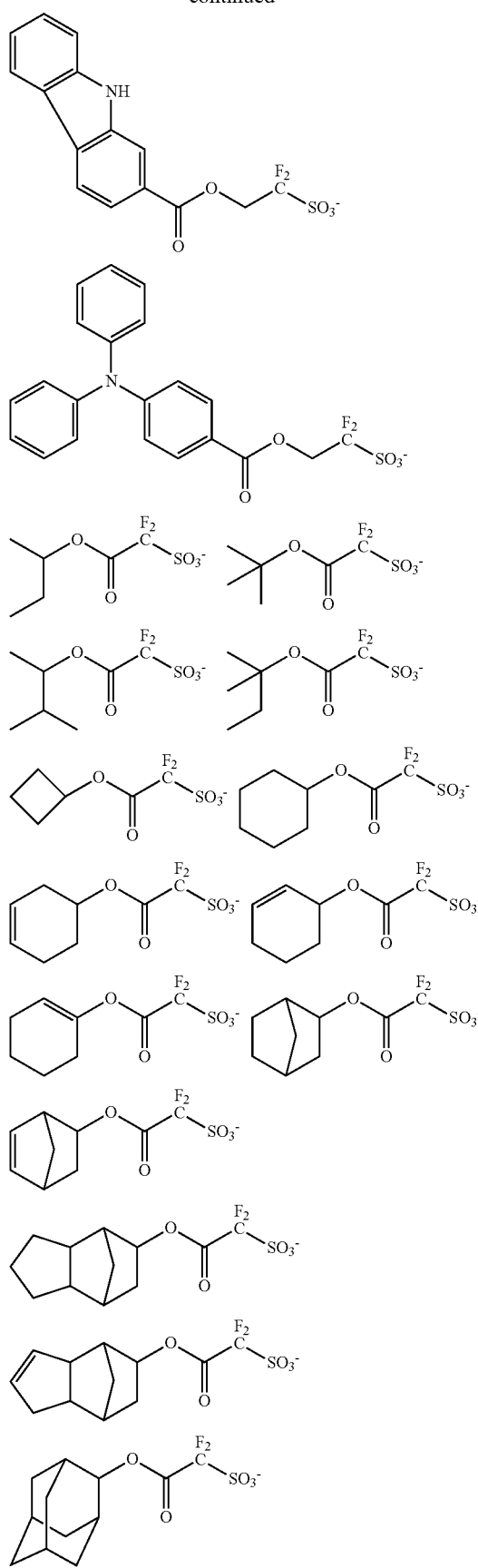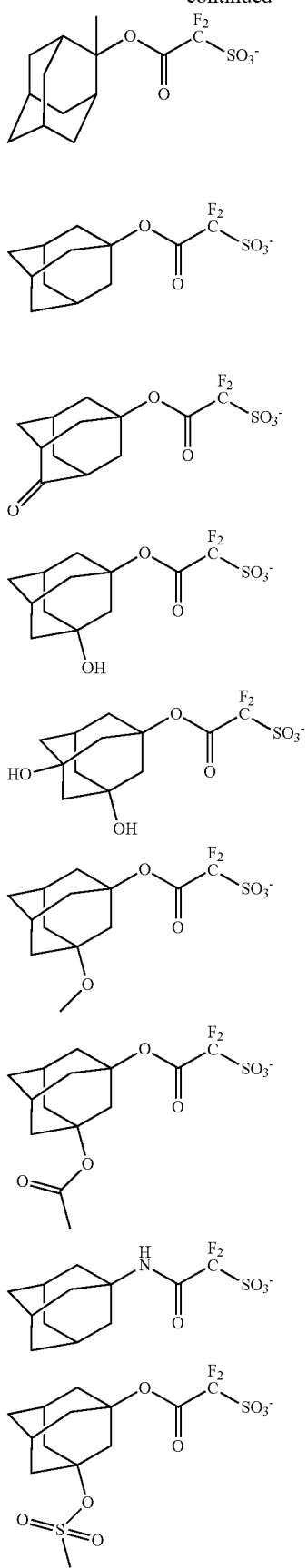

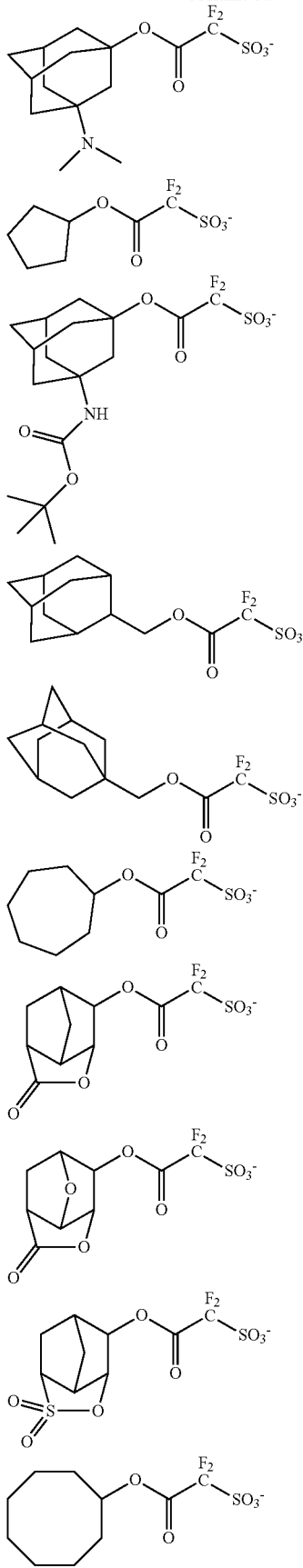
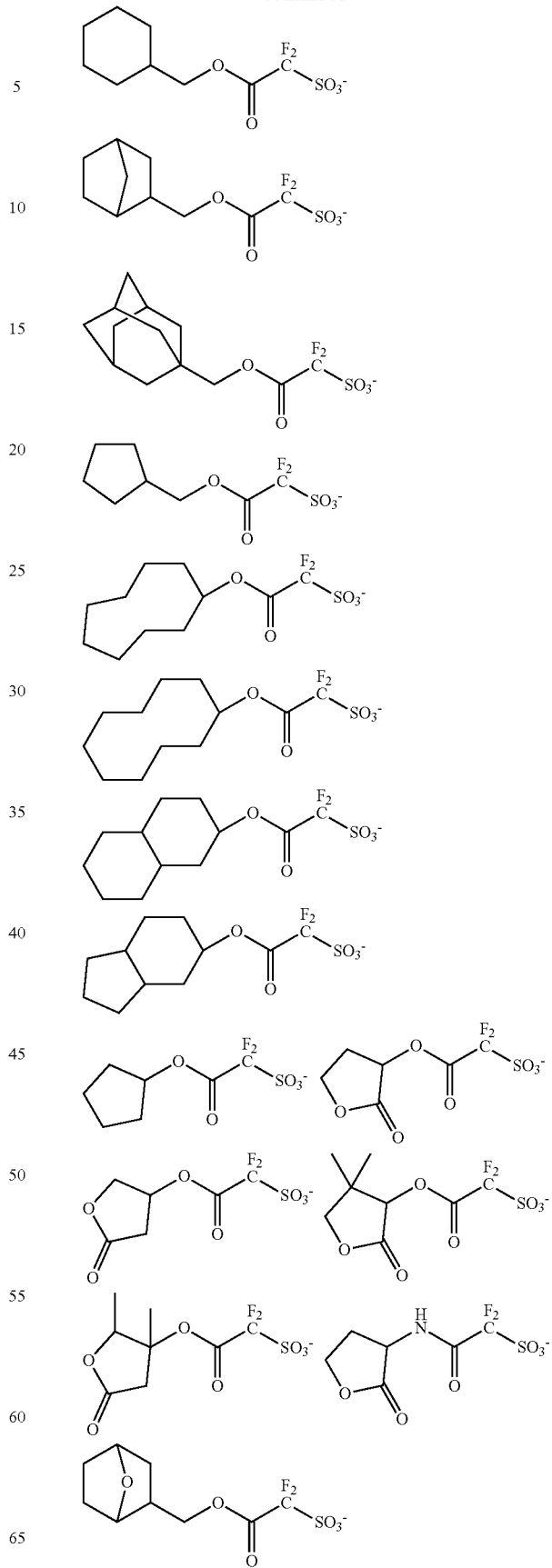

91
-continued
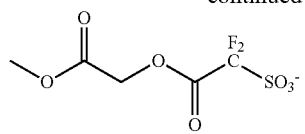
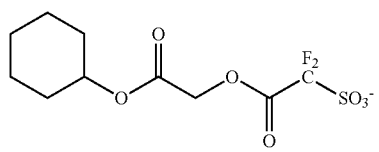
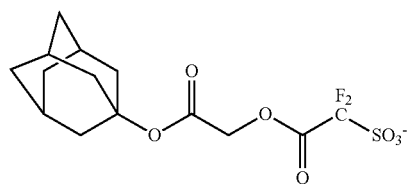
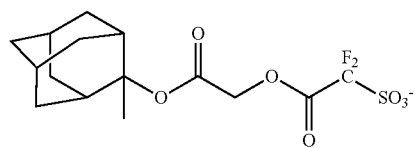
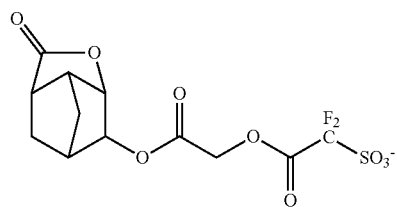
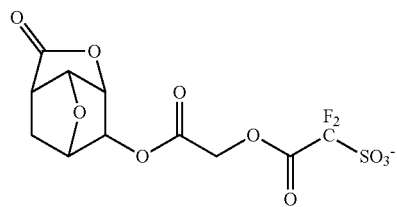
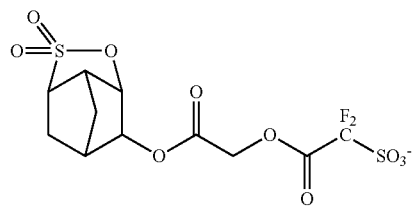
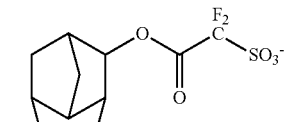
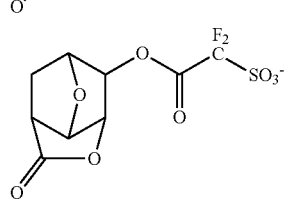
92
-continued
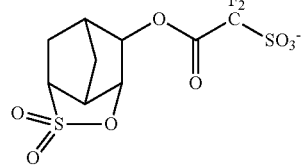
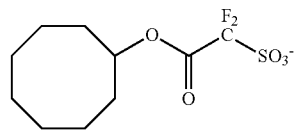
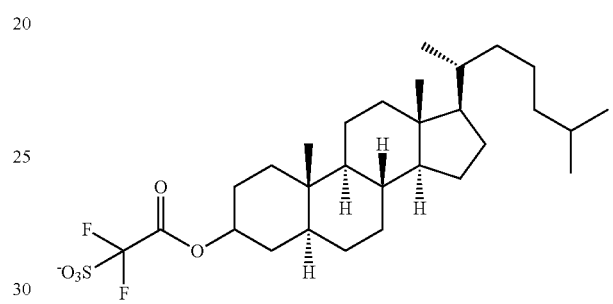
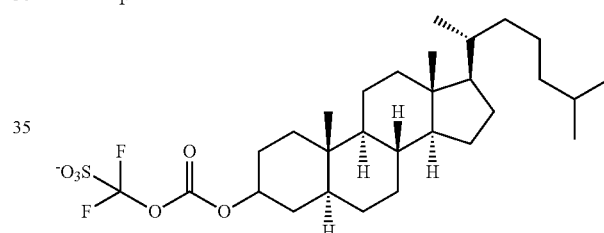
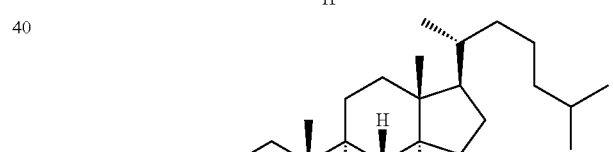
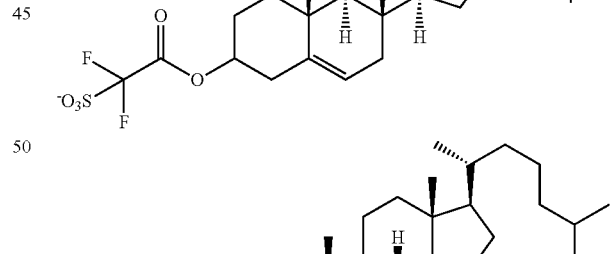
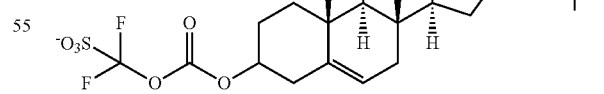
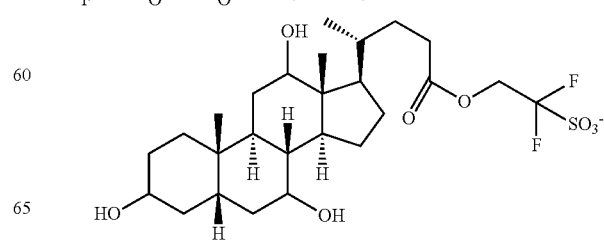

-continued
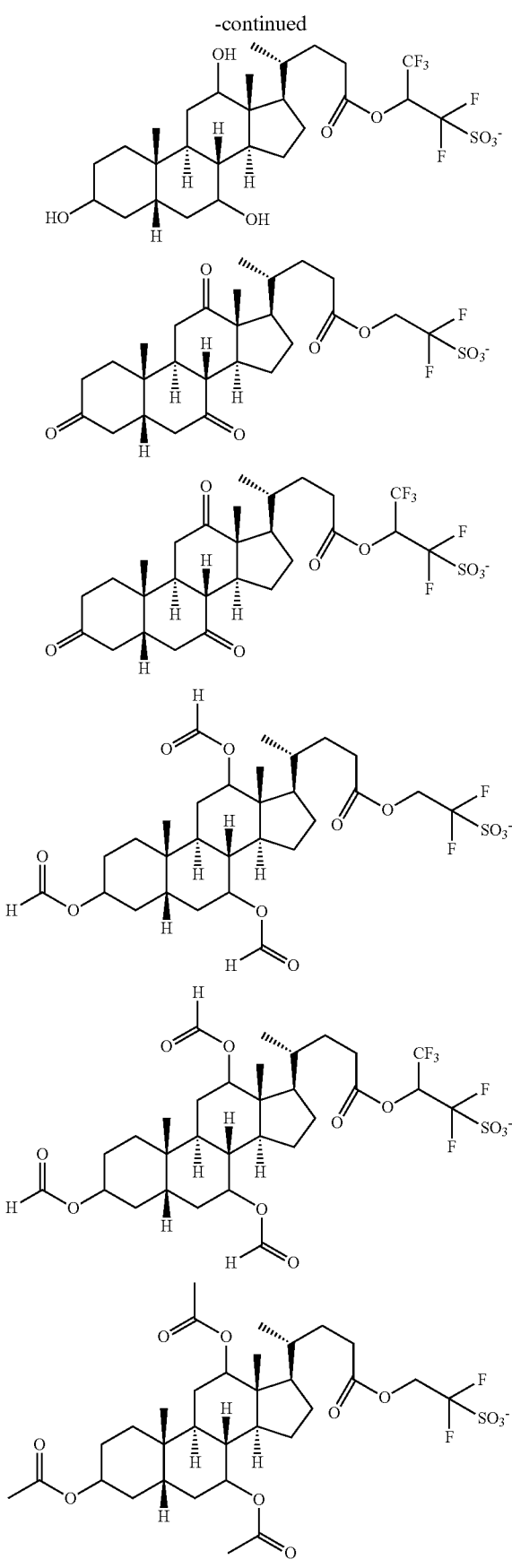
-continued
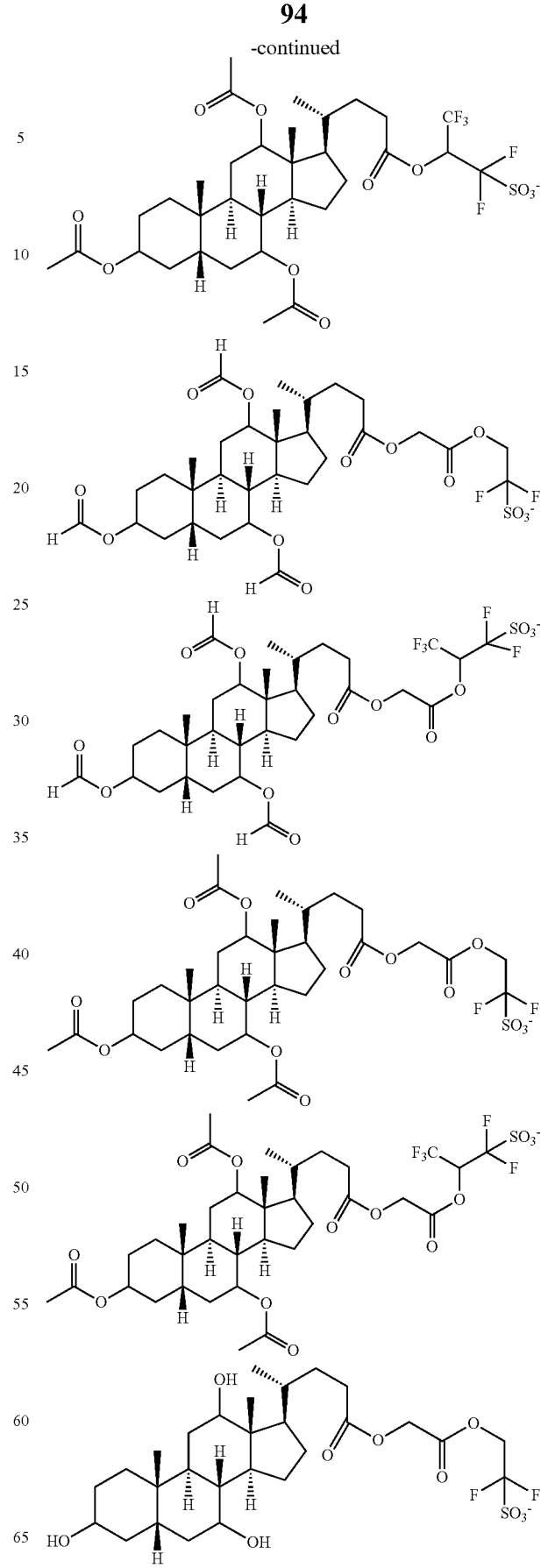

95
-continued
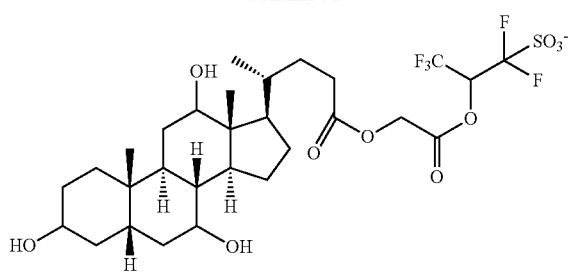
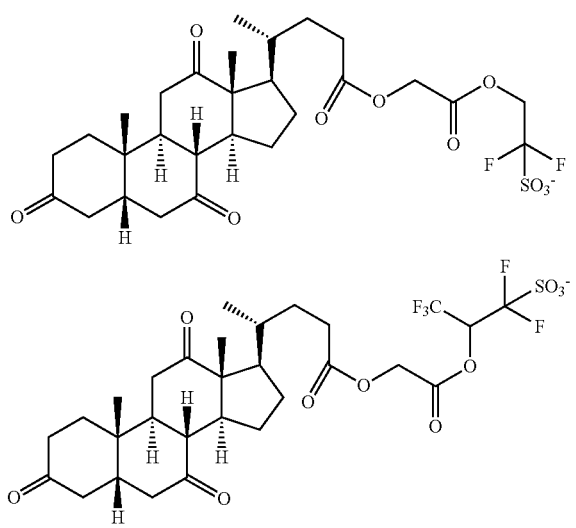
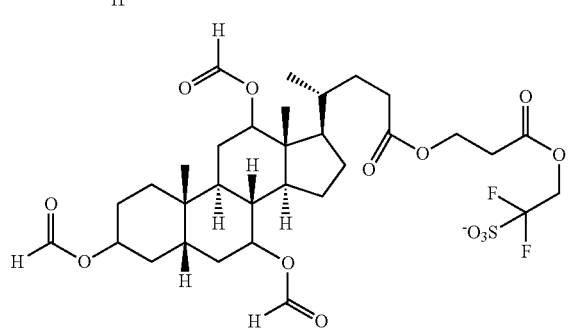
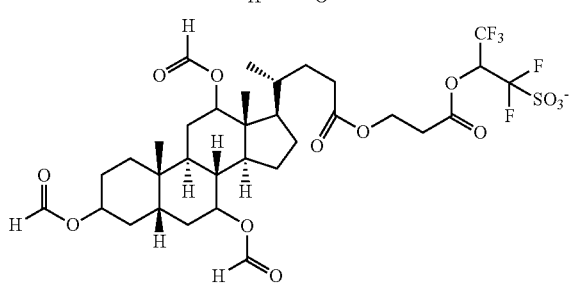
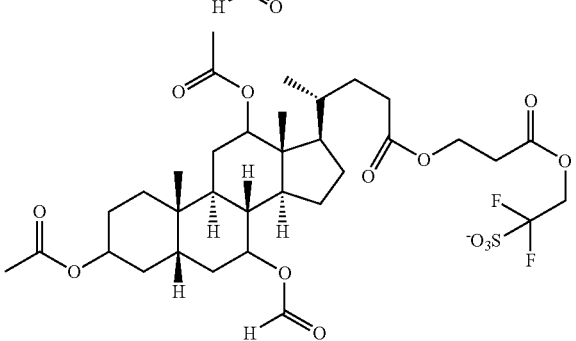
96
-continued
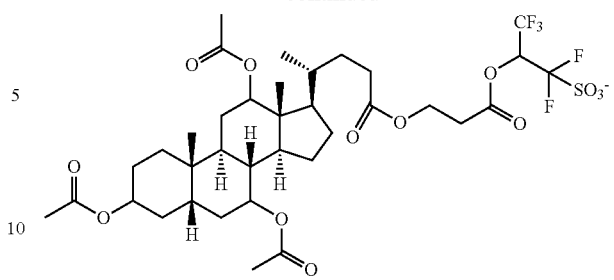
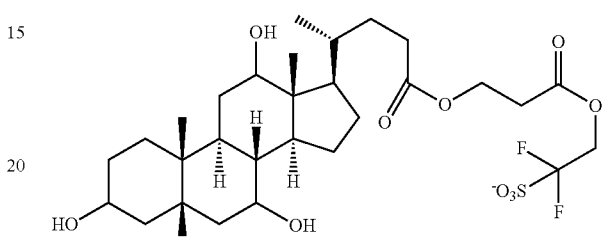
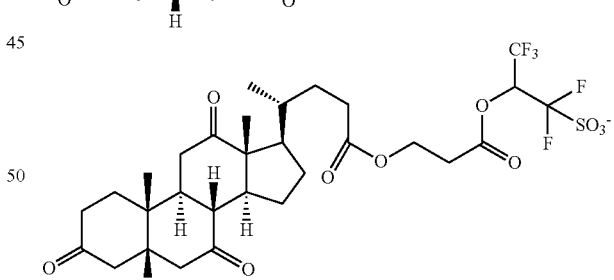
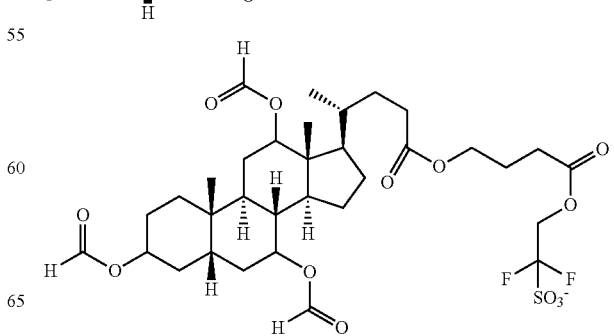

97
-continued
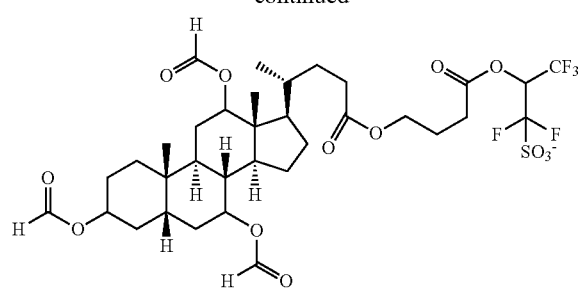
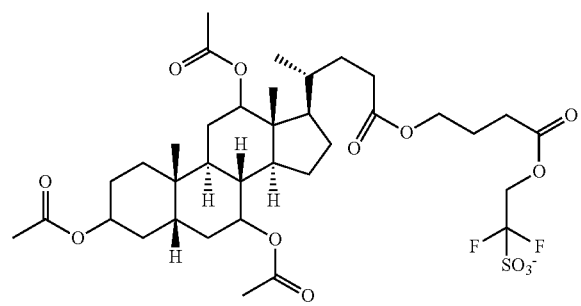
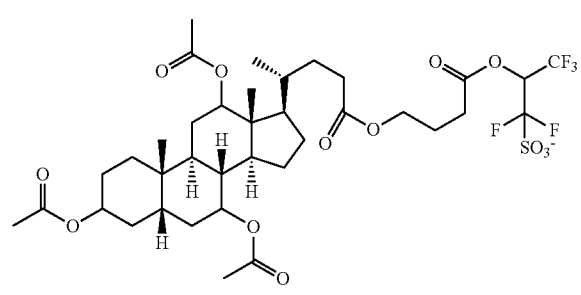
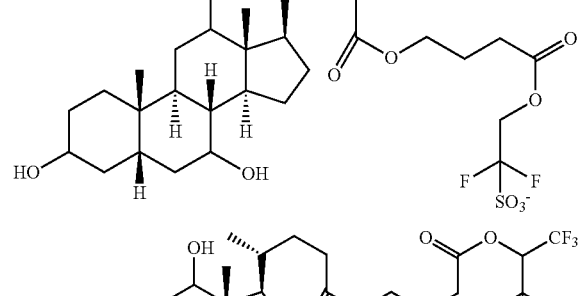
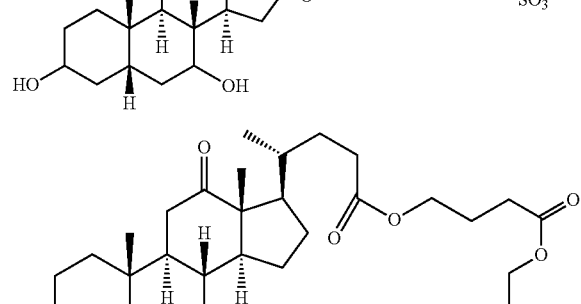
98
-continued
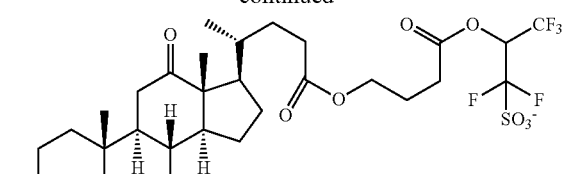
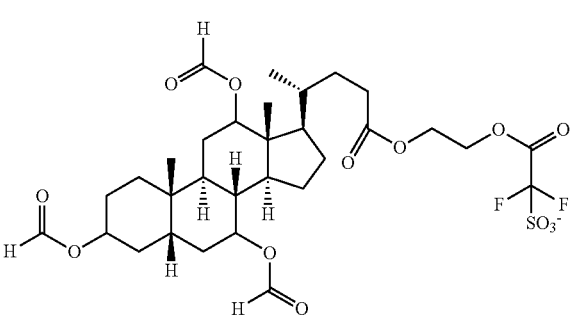
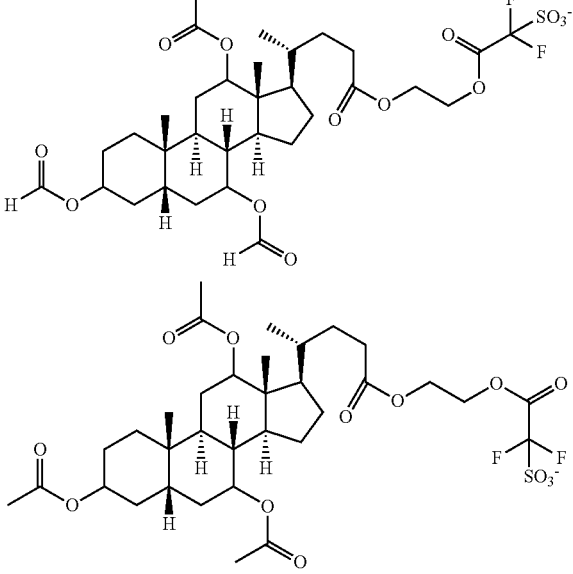
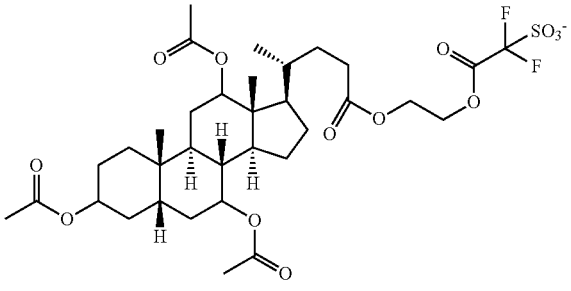
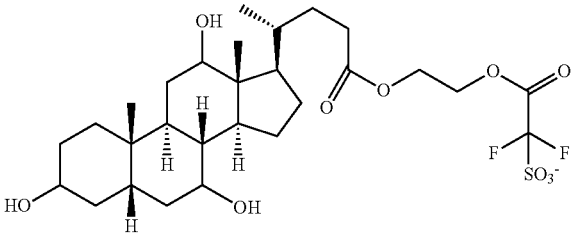

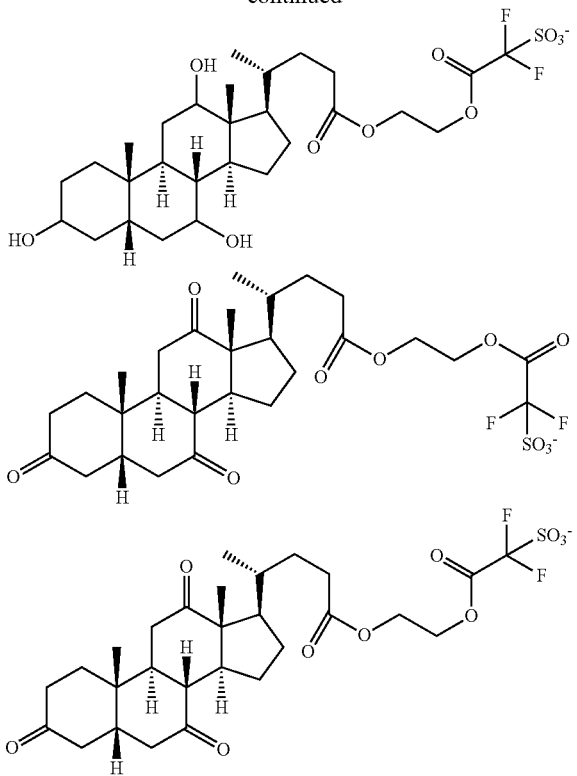

In formula (B-3), $R^{B2}$ and $R^{B3}$ are each independently fluorine, trifluoromethyl, pentafluoroethyl, trifluoroethyl, octafluorobutyl or nonafluorobutyl. $R^{B2}$ and $R^{B3}$ may bond together to form a ring with the linkage: —SO$_2$N⁻SO$_2$—, and in this case, preferably $R^{B2}$ and $R^{B3}$ bond together to form —(CF$_2$)$_k$— wherein k is an integer of 2 to 5.

In formula (B-4), $R^{B4}$, $R^{B5}$ and $R^{B6}$ are each independently fluorine, trifluoromethyl, pentafluoroethyl, trifluoroethyl, octafluorobutyl or nonafluorobutyl.

Component (B) is preferably present in an amount of 0.01 to 100 parts by weight, more preferably 0.1 to 50 parts by weight per 100 parts by weight of component (A). Component (B) may be used alone or in combination of two or more.

(C) Silicon-Containing Compound

The resist composition may further comprise (C) a silicon-containing compound for the purposes of enhancing reactivity and sensitivity. The silicon-containing compound is typically selected from a silane compound having the formula (C-1), a hydrolysate of the silane compound having formula (C-1), and a hydrolytic condensate of the silane compound having formula (C-1).

$(R^{C1})_p$—Si—$(OR^{C2})_{(4-p)}$ (C-1)

In formula (C-1), $R^{C1}$ is hydrogen or a $C_1$-$C_{30}$ monovalent organic group free of iodine. The monovalent organic groups may be straight, branched or cyclic. Examples include monovalent saturated hydrocarbon groups such as methyl, ethyl, n-propyl, isopropyl, cyclopropyl, n-butyl, isobutyl, sec-butyl, tert-butyl, cyclobutyl, n-pentyl, isopentyl, sec-pentyl, tert-pentyl, neopentyl, cyclopentyl, n-hexyl, cyclohexyl, n-heptyl, cycloheptyl, n-octyl, cyclooctyl, n-nonyl, cyclononyl, n-decyl, cyclodecyl, adamantyl and norbornyl; monovalent unsaturated hydrocarbon groups such as cyclohexenyl, cyclohexenylmethyl, cyclohexenyl-ethyl, cycloheptenyl, and cyclopentadienyl; aryl groups such as phenyl, tolyl, xylyl, methoxyphenyl, and naphthyl; aralkyl groups such as benzyl, phenethyl, and methoxybenzyl; and monovalent heterocyclic groups such as tetrahydrofurfuryl.

In the organic group, one or more or all hydrogen atoms may be substituted by halogen atoms other than iodine. The halogen is preferably fluorine or chlorine. Examples of the organic group substituted with halogen other than iodine include fluorophenyl, difluorophenyl, chlorophenyl, dichlorophenyl, fluoronaphthyl, difluoronaphthyl, chloronaphthyl, dichloronaphthyl, fluorobenzyl, difluorobenzyl, chlorobenzyl, dichlorobenzyl, fluorophenethyl, difluorophenethyl, chlorophenethyl, and dichlorophenethyl.

In the organic group, one or more or all hydrogen atoms may be substituted by silicon-containing moieties. Typical of the silicon-containing moiety is trialkylsilyl in which each alkyl is preferably of 1 to 6 carbon atoms. Examples of the organic group substituted with a silicon-containing moiety include (trimethylsilyl)phenyl, (triethylsilyl)phenyl, (tert-butyldimethylsilyl)phenyl, (trimethylsilyl)naphthyl, (triethylsilyl)naphthyl, (tert-butyldimethylsilyl)naphthyl, (trimethylsilyl)benzyl, (triethylsilyl)benzyl, (tert-butyldimethylsilyl)benzyl, (trimethylsilyl)phenethyl, (triethylsilyl)phenethyl, and (tert-butyldimethylsilyl)phenethyl.

Other examples of the organic group include those having a hydroxyl or carboxyl group substituted with an acid labile group. Examples of the organic group having a hydroxyl or carboxyl group substituted with an acid labile group are shown below, but not limited thereto. In the following formulae, (Si) indicates the bonding site to a silicon atom.

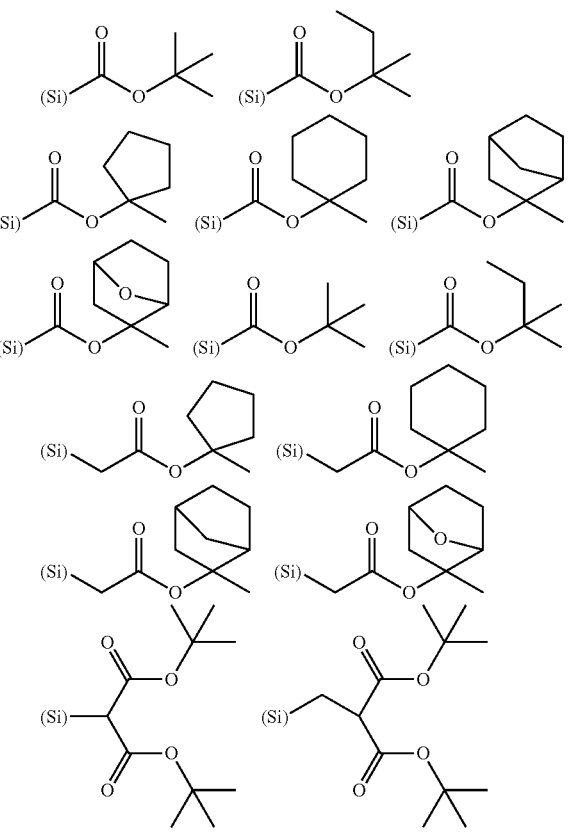

-continued
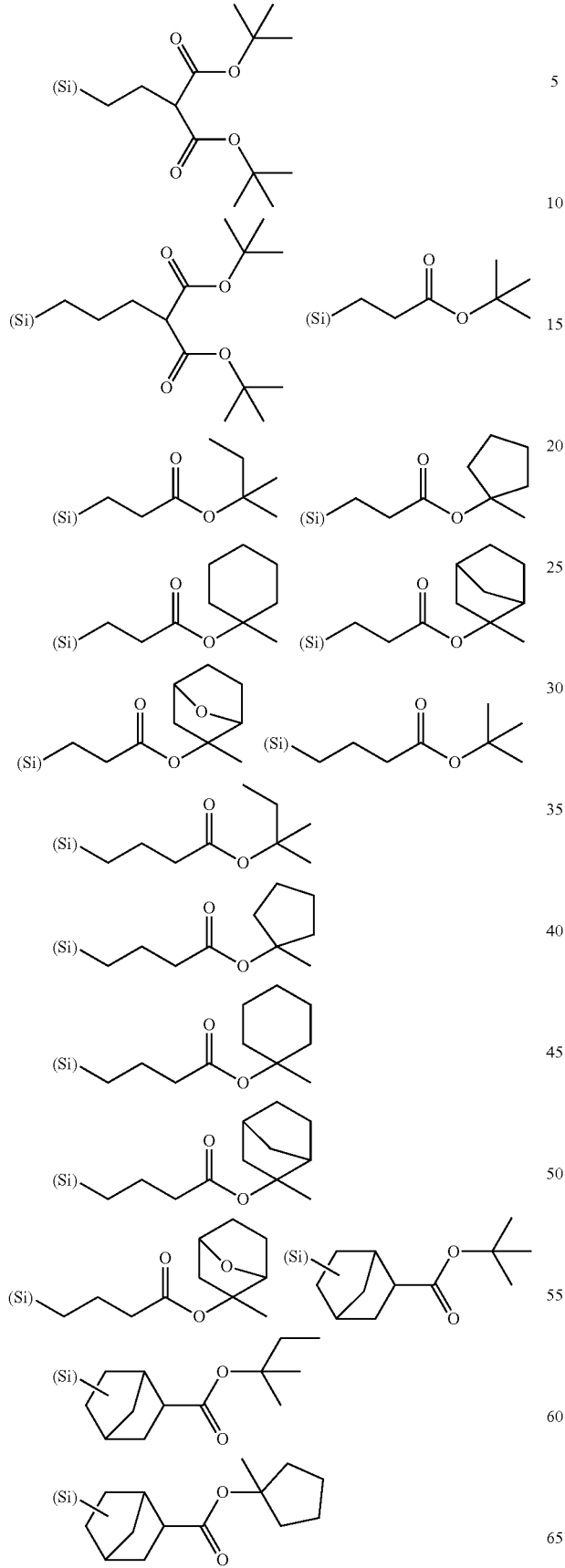
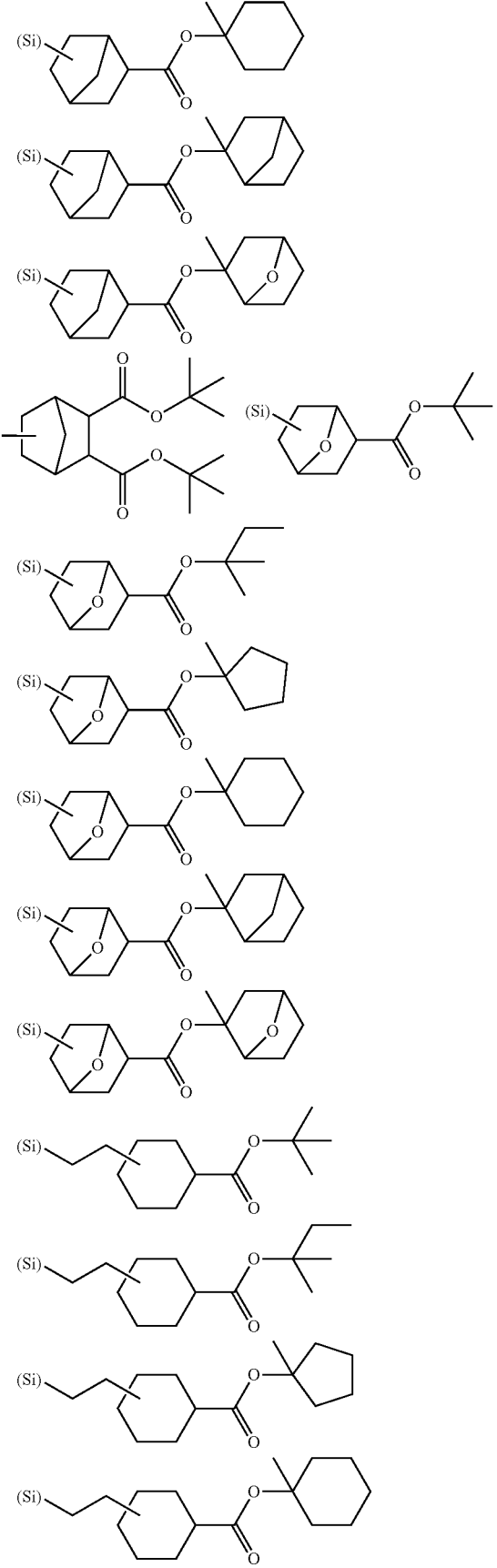

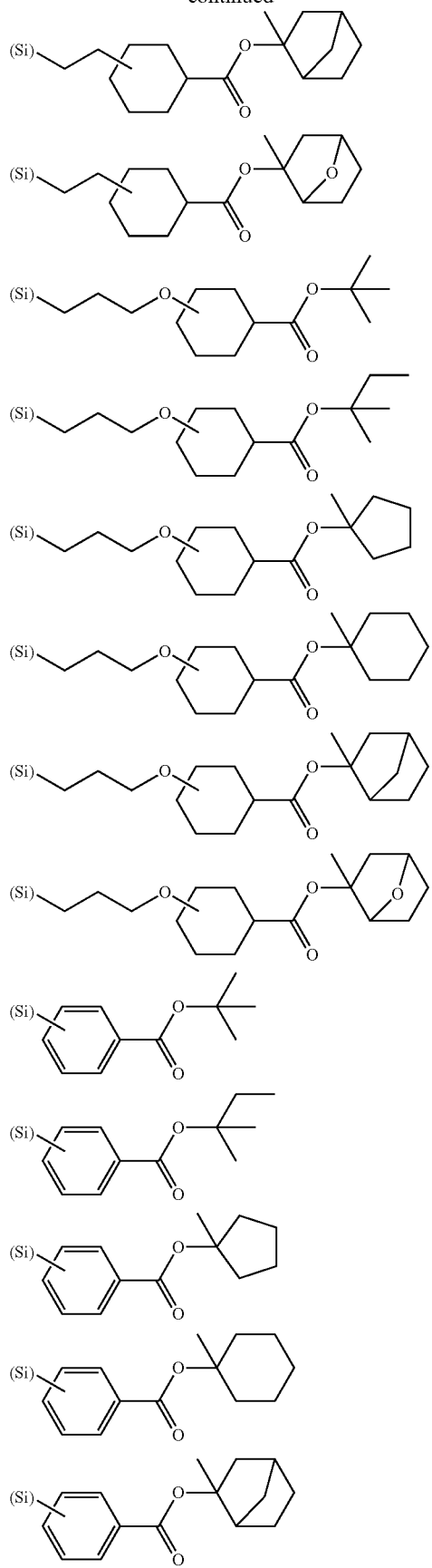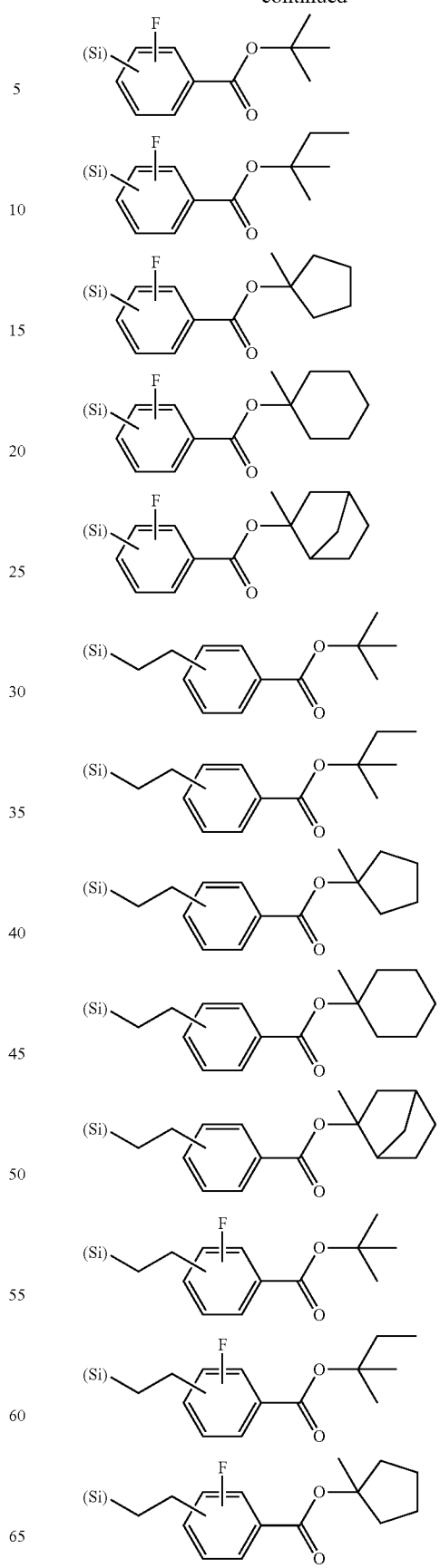

-continued
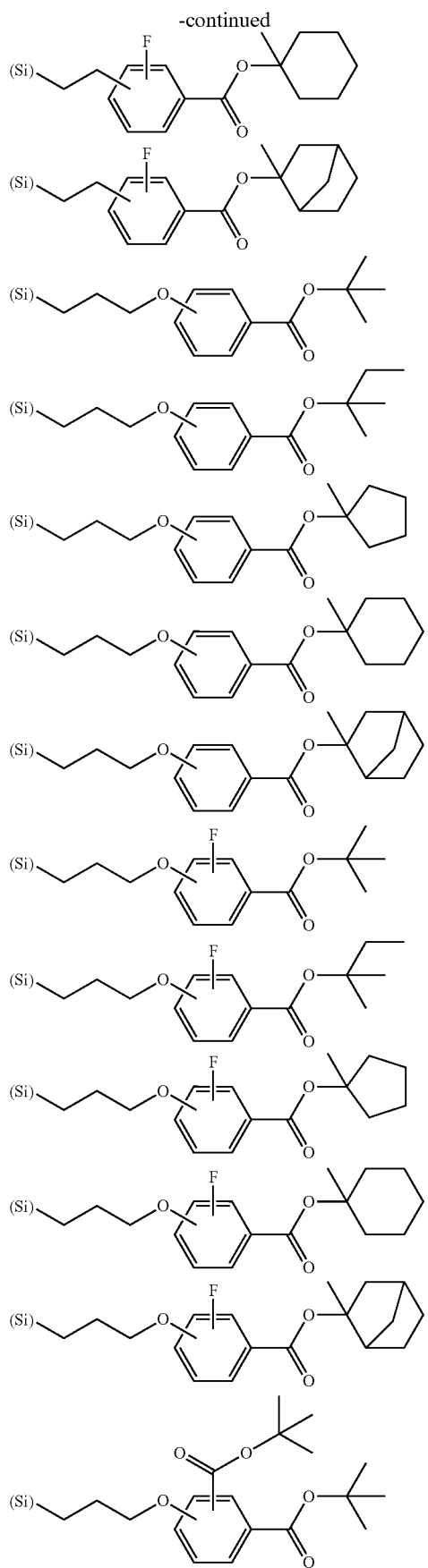
-continued
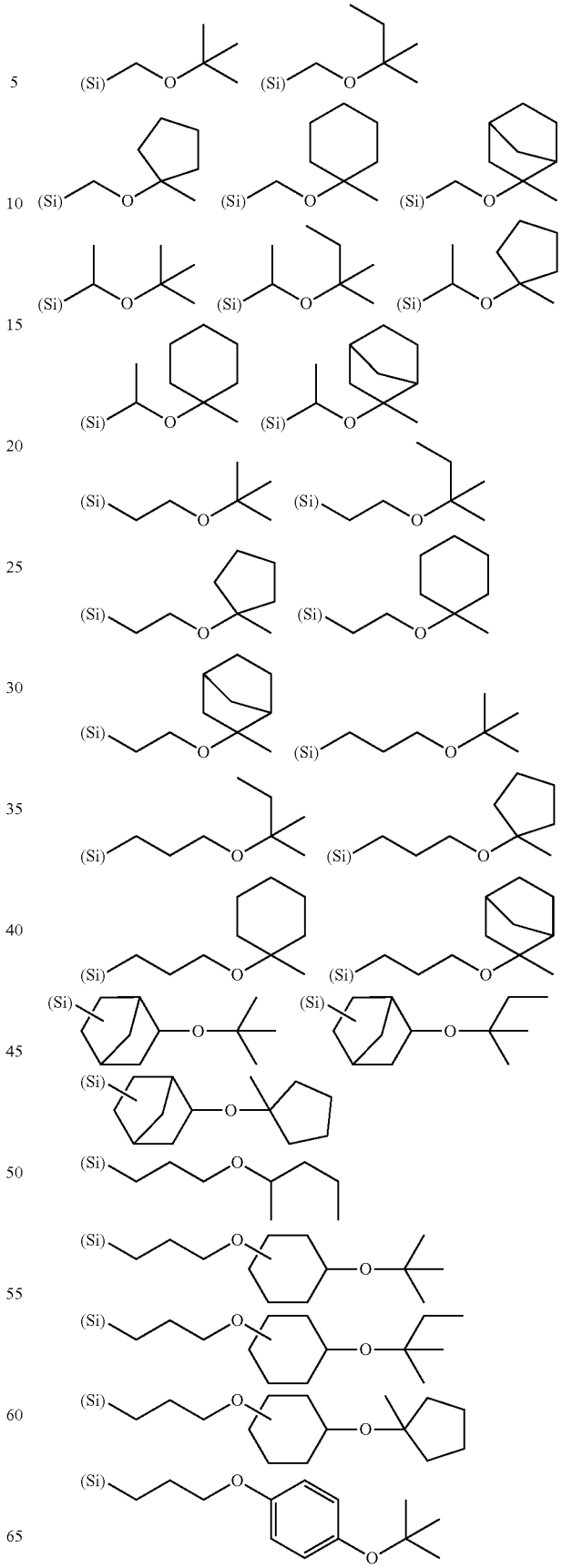

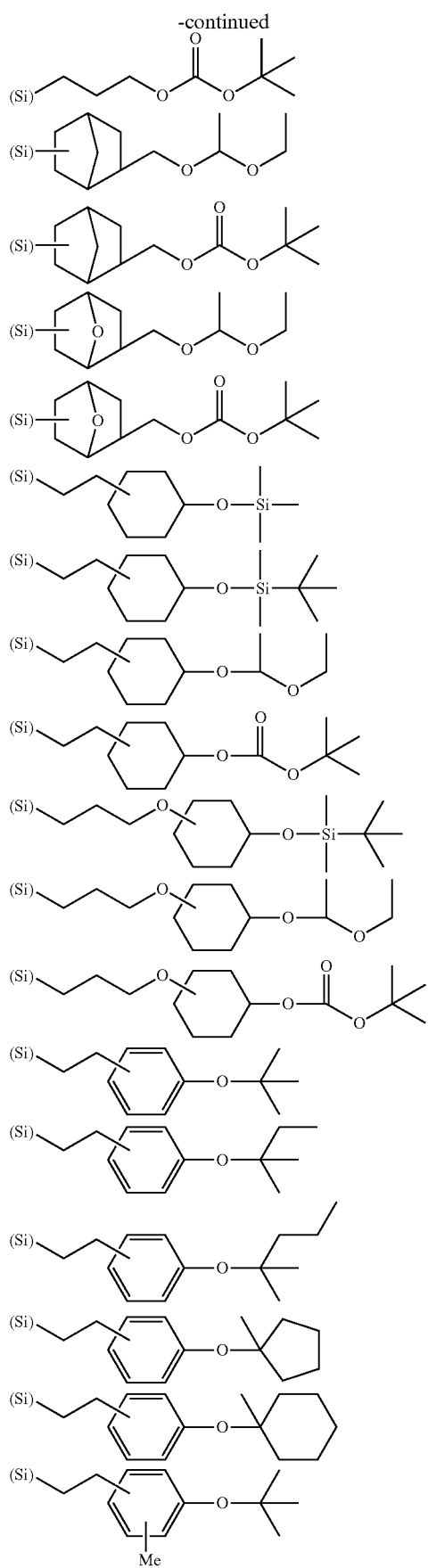
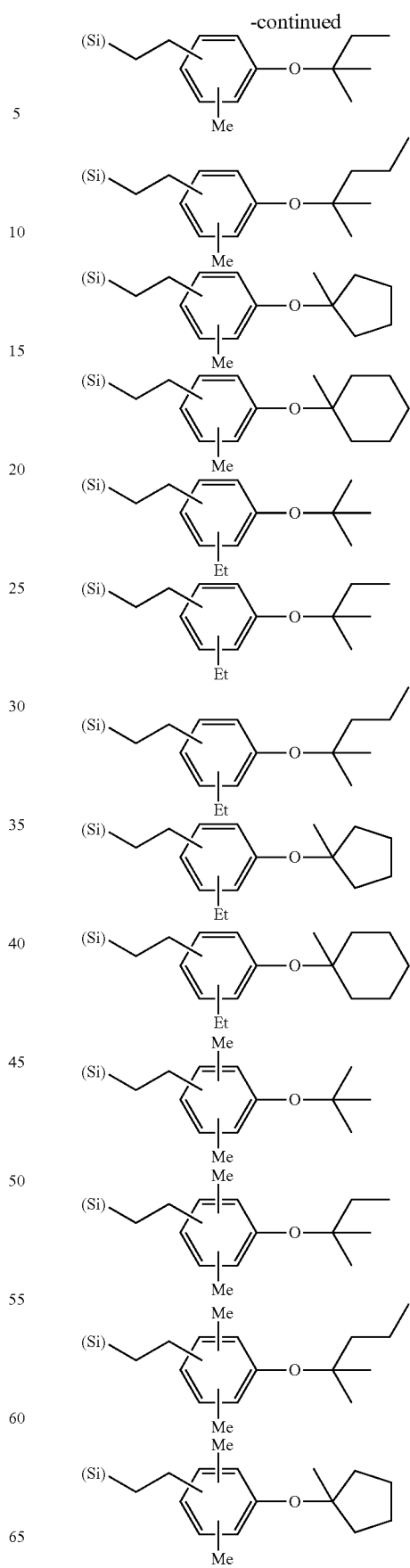

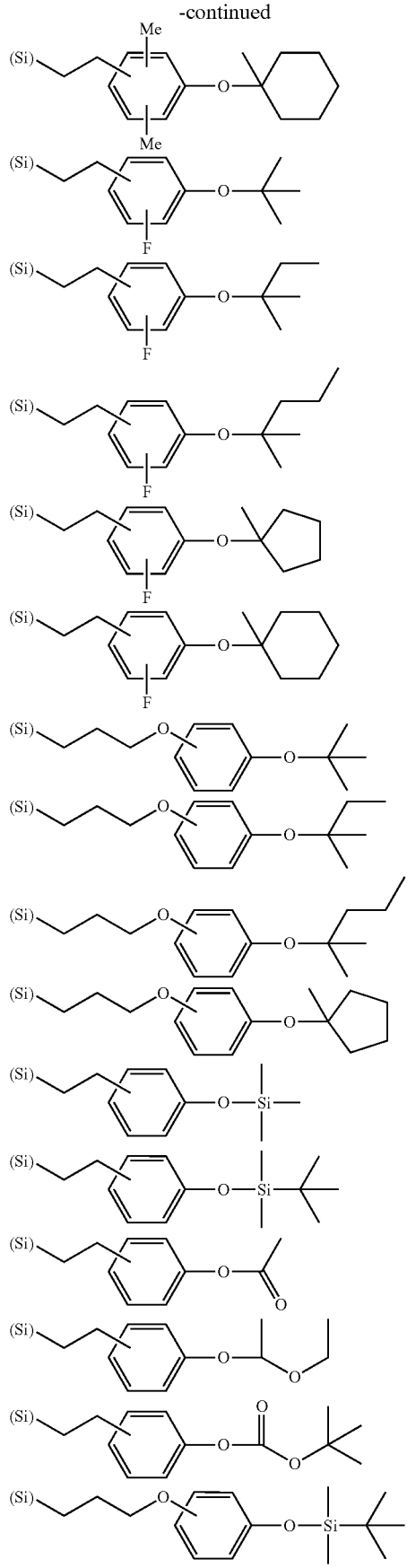
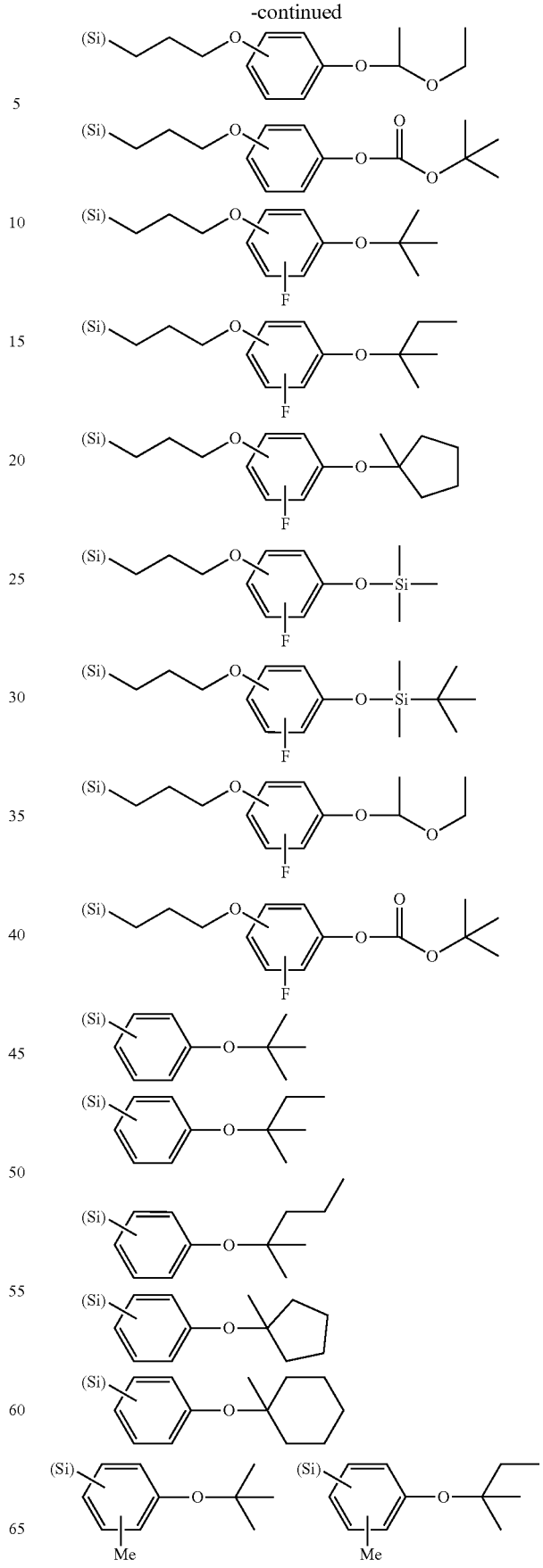

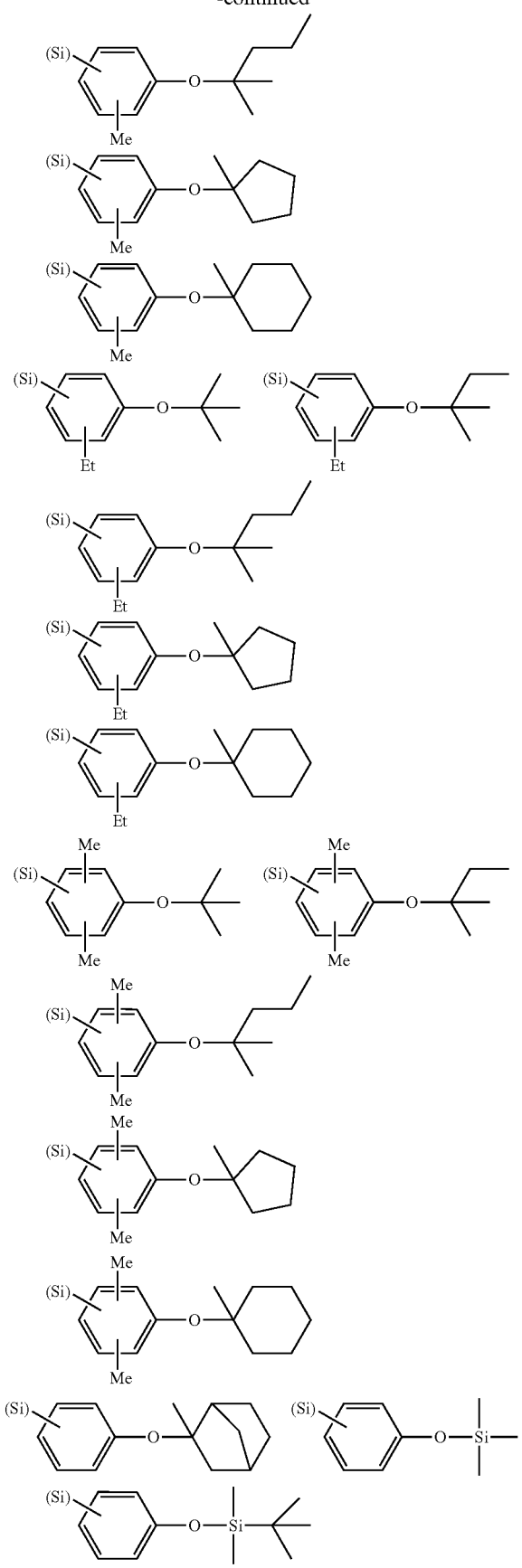
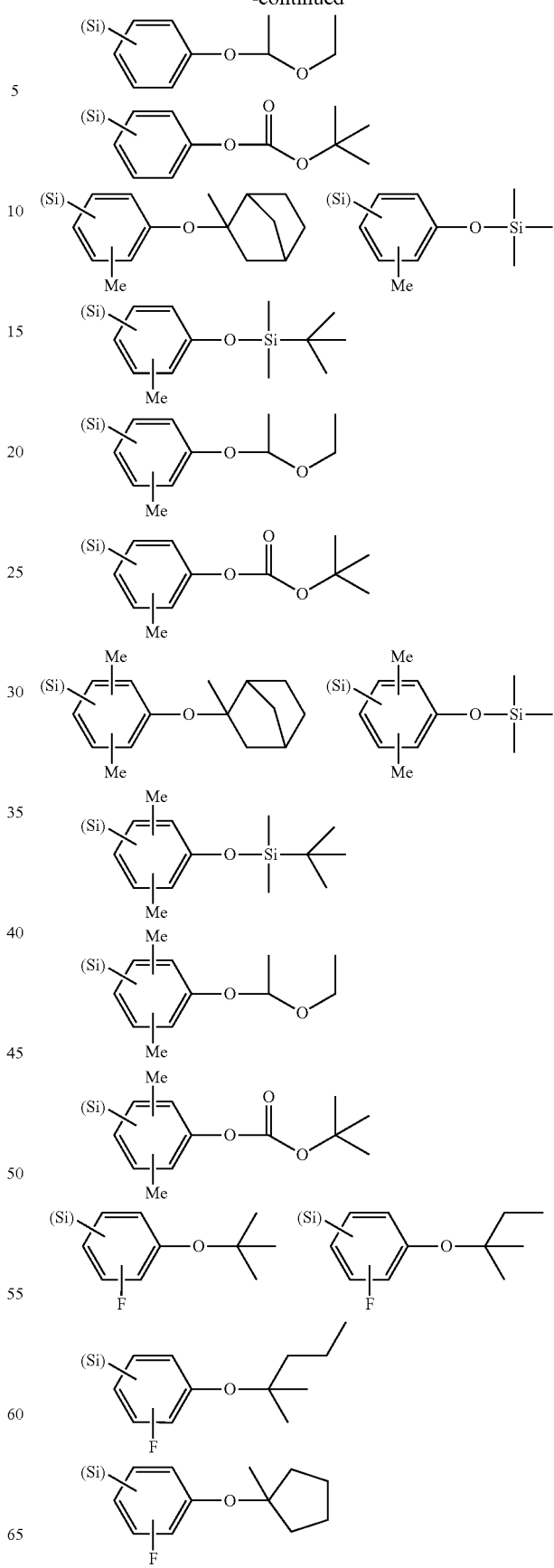

-continued

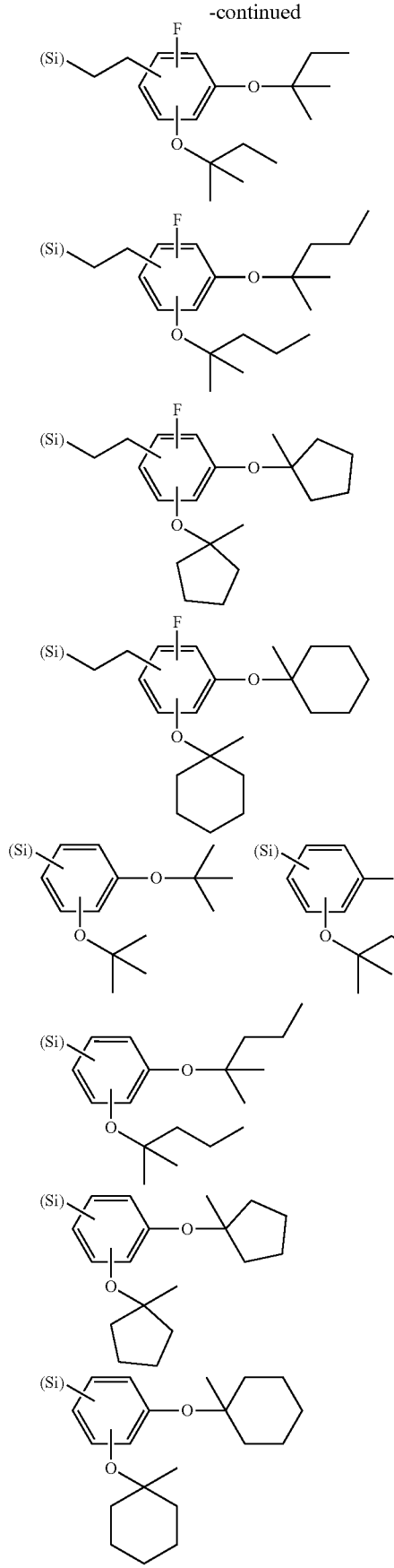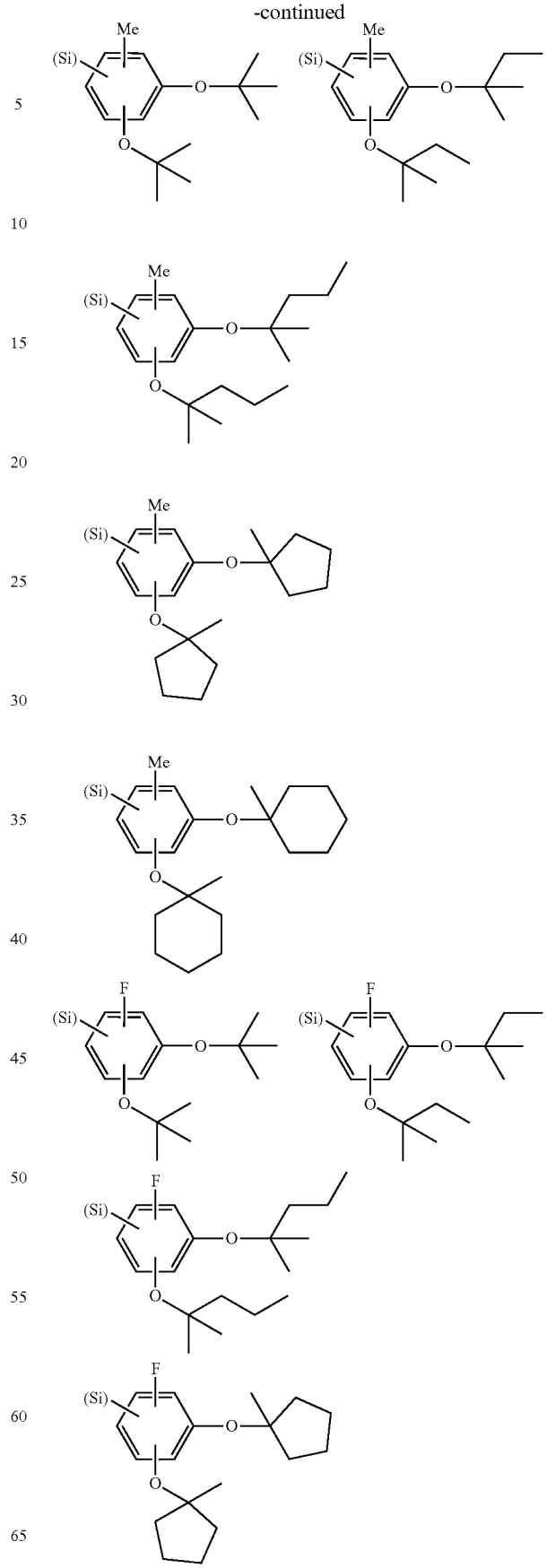

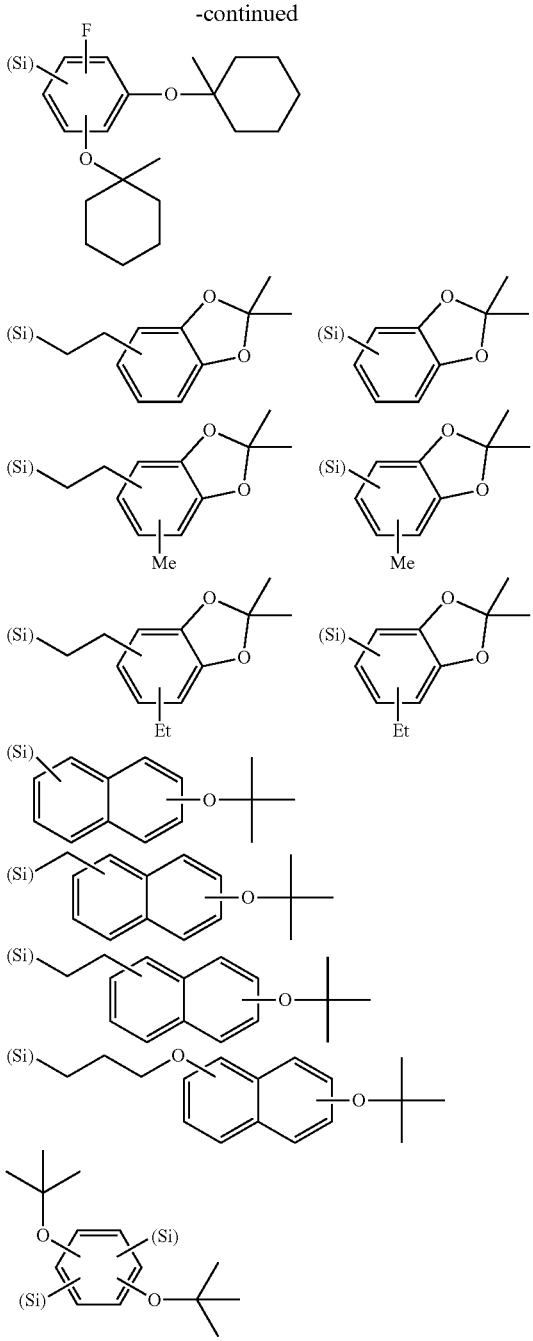

In formula (C-1), $R^{C2}$ is a $C_1$-$C_6$ alkyl group, examples of which include methyl, ethyl, n-propyl, isopropyl, cyclopropyl, n-butyl, isobutyl, sec-butyl, tert-butyl, cyclobutyl, n-pentyl, isopentyl, sec-pentyl, tert-pentyl, neopentyl, cyclopentyl, n-hexyl, and cyclohexyl.

In formula (C-1), p is an integer of 0 to 3 (0≤p≤3), preferably 1 or 2.

Examples of the silane compound having formula (C-1) include trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, tert-butyltrimethoxysilane, tert-butyltriethoxysilane, tert-butyltripropoxysilane, tert-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, tolyltrimethoxysilane, tolyltriethoxysilane, tolyltripropoxysilane, tolyltriisopropoxysilane, anisyltrimethoxysilane, anisyltriethoxysilane, anisyltripropoxysilane, anisyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-tert-butyldimethoxysilane, di-tert-butyldiethoxysilane, di-tert-butyldipropoxysilane, di-tert-butyldiisopropoxysilane, dicyclopropyldimethoxysilane, dicyclopropyldiethoxysilane, dicyclopropyldipropoxysilane, dicyclopropyldiisopropoxysilane, dicylobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, [4-(trimethylsilyl)phenyl]trimethoxysilane, [4-(triethylsilyl)phenyl]trimethoxysilane, [4-(tert-butyldimethylsilyl)phenyl]trimethoxysilane, [(4-trimethylsilyl)phenethyl]trimethoxysilane, [(4-triethylsilyl)phenethyl]trimethoxysilane, [4-(tert-butyldimethylsilyl)phenethyl]trimethoxysilane, (tert-butoxymethyl)trimethoxysilane, (tert-butoxyethyl)trimethoxysilane, (4-tert-butoxyphenethyl)trimethoxysilane, (tert-pentoxymethyl)trimethoxysilane, (tert-pentoxyethyl)trimethoxysilane, (4-tert-pentoxyphenethyl)trimethoxysilane, (tert-butoxycarbonylmethyl)trimethoxysilane, (tert-butoxycarbonylethyl)trimethoxysilane, (4-tert-butoxycarbonylphenethyl)trimethoxysilane, (tert-pentoxycarbonylmethyl)trimethoxysilane, (tert-pentoxycarbonylethyl)trimethoxysilane, (4-tert-pentoxycarbonylphenethyl)trimethoxysilane, etc.

Also included in component (C) are a silane compound having the formula (C-2), a hydrolysate of the silane compound having formula (C-2), and a hydrolytic condensate of the silane compound having formula (C-2), which may be used alone or in admixture.

$$(R^{C3})_q\text{—Si—}(OR^{C4})_{(4-q)} \quad \text{(C-2)}$$

In formula (C-2), $R^{C3}$ is a $C_1$-$C_{30}$ monovalent organic group substituted with at least one iodine, $R^{C4}$ is a $C_1$-$C_6$ alkyl group, and q is an integer of 1 to 3 (1≤q≤3).

Examples of the iodine-substituted organic group are shown below, but not limited thereto. In the following formulae, (Si) indicates the bonding site to a silicon atom.

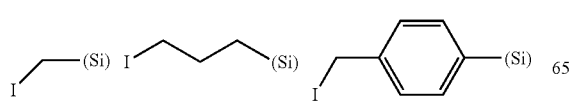

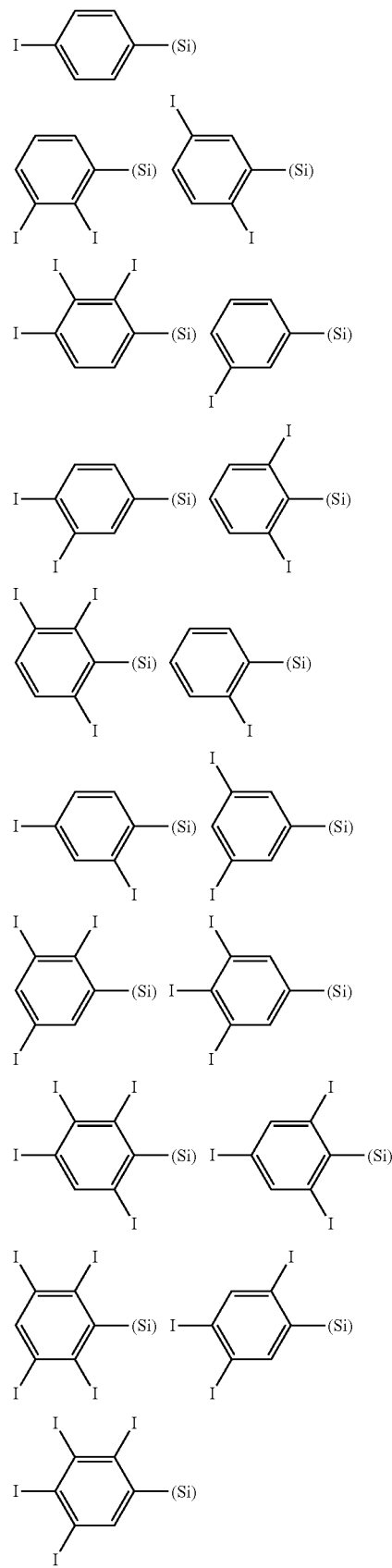

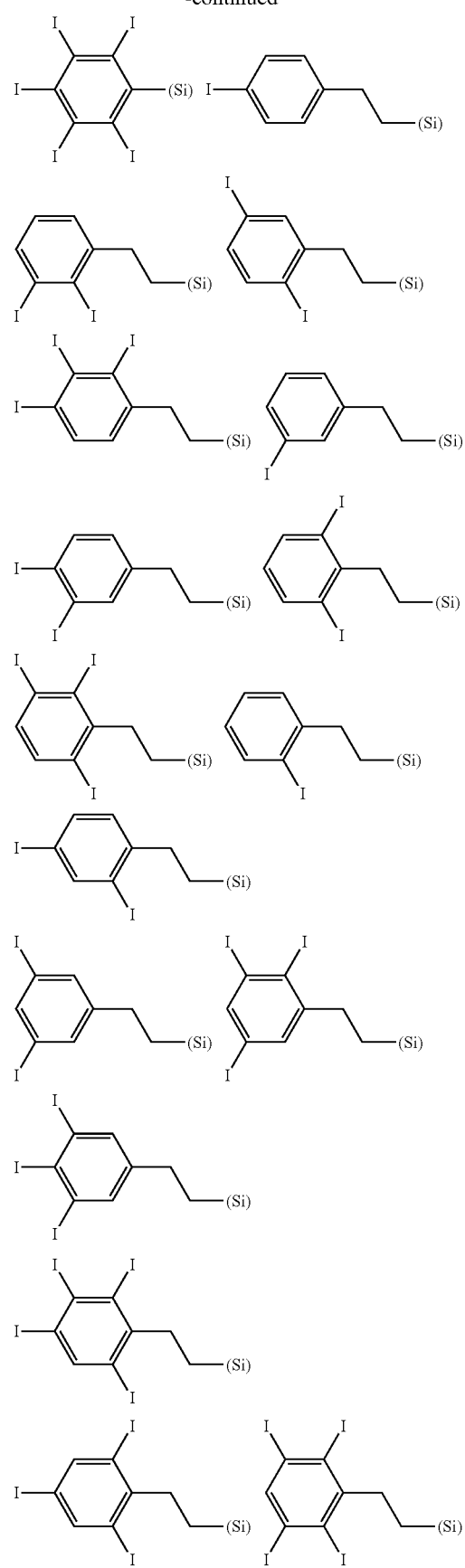
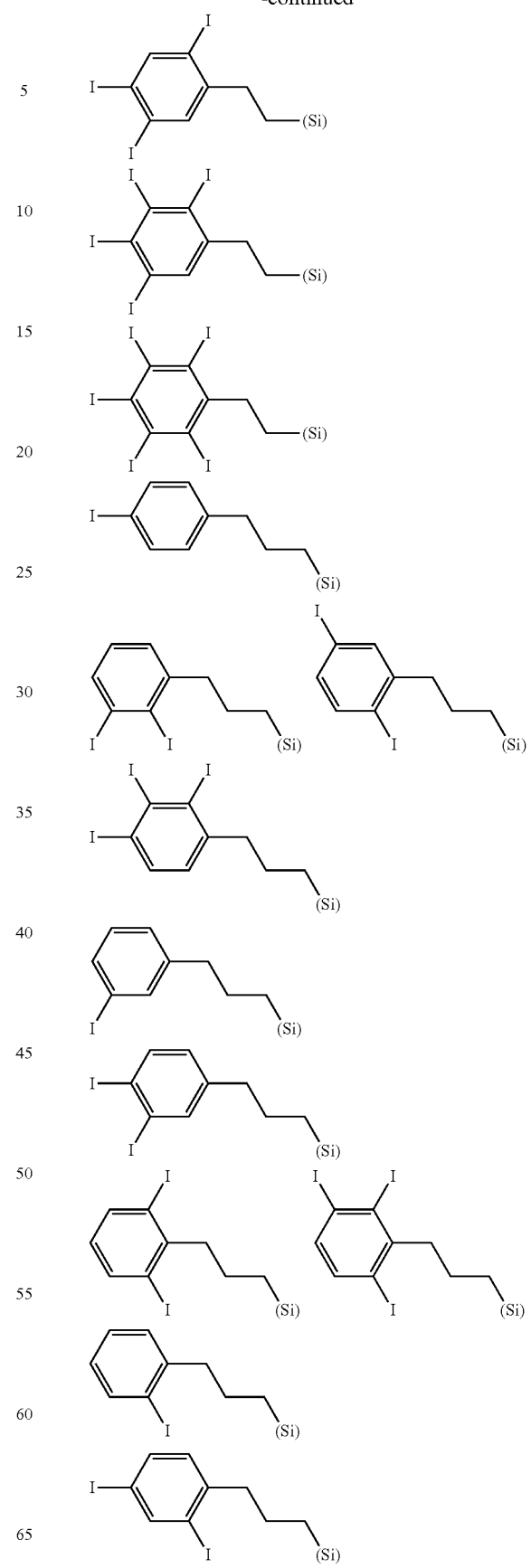

-continued

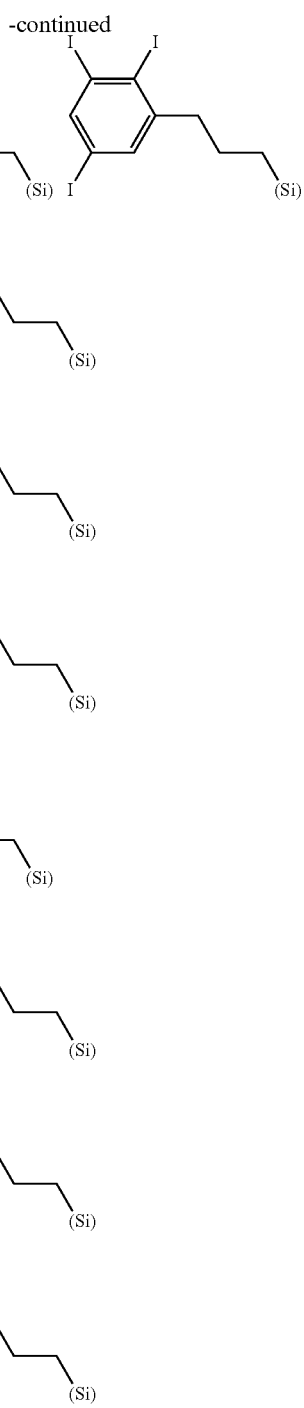

Also included in component (C) is a hydrolytic condensate of at least one silane compound having formula (C-1) and at least one silane compound having formula (C-2).

The hydrolytic condensate of silane compounds may be obtained from hydrolytic condensation of the silane compounds in the presence of an acid catalyst selected from inorganic acids, aliphatic sulfonic acids and aromatic sulfonic acids.

Suitable acid catalysts include hydrofluoric acid, hydrochloric acid, hydrobromic acid, sulfuric acid, nitric acid, perchloric acid, phosphoric acid, methanesulfonic acid, benzenesulfonic acid, and toluenesulfonic acid. The acid catalyst is preferably used in an amount of $10^{-6}$ to 10 moles, more preferably $10^{-5}$ to 5 moles, even more preferably $10^{-4}$ to 1 mole per mole of the silane compounds combined.

The amount of water used when the hydrolytic condensate is obtained from silane compounds is preferably 0.01 to 100 moles, more preferably 0.05 to 50 moles, even more preferably 0.1 to 30 moles per mole of hydrolyzable substituent group on the silane compounds. As long as the amount of water is up to 100 moles, the procedure is economical because a reactor of extra size is not required.

One exemplary procedure is by adding the silane compounds to an aqueous solution of the catalyst to start hydrolytic condensation reaction. Prior to the reaction, an organic solvent may be added to the catalyst aqueous solution and/or the silane compounds may be diluted with an organic solvent. The reaction temperature is preferably 0 to 100° C., more preferably 5 to 80° C. The reaction time is preferably 0.5 to 60 hours, more preferably 1 to 50 hours. In one preferred procedure, the reaction system is maintained at a temperature of 5 to 80° C. during dropwise addition of the silane compounds and aged at 20 to 80° C. for 1 to 50 hours.

Examples of the organic solvent which can be added to the catalyst aqueous solution or with which the silane compounds can be diluted include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl pentyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Of these, water-soluble solvents are preferred. Suitable water-soluble solvents include alcohols such as methanol, ethanol, 1-propanol, 2-propanol, polyhydric alcohols such as ethylene glycol and propylene glycol, polyhydric alcohol condensation derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether, acetone, acetonitrile, and tetrahydrofuran. Inter alia, those solvents having a boiling point of up to 100° C. are especially preferred.

The organic solvent is preferably used in an amount of 0 to 1,000 mL, more preferably 0 to 500 mL per mole of the silane compounds. As long as the amount of the organic solvent is up to 1,000 mL, the procedure is economical because a reactor of extra size is not required.

Thereafter, the catalyst is neutralized if necessary. The amount of alkali used for neutralization is preferably 0.1 to 2 equivalents relative to the acid catalyst. Any alkaline compound may be used as long as it exhibits alkalinity in water.

Subsequently, the alcohol or by-product formed during hydrolytic condensation reaction is preferably removed from the reaction solution. For by-product removal, the reaction solution is heated at a temperature under a pressure. The heating temperature is preferably 0 to 100° C., more preferably 10 to 90° C., even more preferably 15 to 80° C., depending on the type of the organic solvent added and the by-product formed during reaction. The pressure is preferably up to atmospheric, more preferably up to 80 kPa, even more preferably up to 50 kPa in absolute pressure, depending on the type of the organic solvent and by-product to be removed, vacuum unit, condensation unit, and heating temperature. Although it is difficult to predetermine the amount of by-product to be removed accurately, it is desirable to remove at least about 80% by weight of the by-product formed.

Next, the acid catalyst used for hydrolytic condensation may be removed from the reaction solution. The acid catalyst may be removed, for example, by mixing the reaction solution with water and extracting the hydrolytic condensate with an organic solvent. The organic solvent used herein is preferably such that the hydrolytic condensate is dissolved in the solvent and a solvent/water mixture separates into two layers. Suitable organic solvents include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl pentyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, cyclopentyl methyl ether, and mixtures thereof.

It is also possible to use a mixture of a water-soluble organic solvent and a substantially water-insoluble organic solvent. Suitable mixtures include, but are not limited to, a mixture of methanol/ethyl acetate, ethanol/ethyl acetate, 1-propanol/ethyl acetate, 2-propanol/ethyl acetate, butanediol monomethyl ether/ethyl acetate, propylene glycol monomethyl ether/ethyl acetate, ethylene glycol monomethyl ether/ethyl acetate, butanediol monoethyl ether/ethyl acetate, propylene glycol monoethyl ether/ethyl acetate, ethylene glycol monoethyl ether/ethyl acetate, butanediol monopropyl ether/ethyl acetate, propylene glycol monopropyl ether/ethyl acetate, ethylene glycol monopropyl ether/ethyl acetate, methanol/methyl isobutyl ketone, ethanol/methyl isobutyl ketone, 1-propanol/methyl isobutyl ketone, 2-propanol/methyl isobutyl ketone, propylene glycol monomethyl ether/methyl isobutyl ketone, ethylene glycol monomethyl ether/methyl isobutyl ketone, propylene glycol monoethyl ether/methyl isobutyl ketone, ethylene glycol monoethyl ether/methyl isobutyl ketone, propylene glycol monopropyl ether/methyl isobutyl ketone, ethylene glycol monopropyl ether/methyl isobutyl ketone, methanol/cyclopentyl methyl ether, ethanol/cyclopentyl methyl ether, 1-propanol/cyclopentyl methyl ether, 2-propanol/cyclopentyl methyl ether, propylene glycol monomethyl ether/cyclopentyl methyl ether, ethylene glycol monomethyl ether/cyclopentyl methyl ether, propylene glycol monoethyl ether/cyclopentyl methyl ether, ethylene glycol monoethyl ether/cyclopentyl methyl ether, propylene glycol monopropyl ether/cyclopentyl methyl ether, ethylene glycol monopropyl ether/cyclopentyl methyl ether, methanol/propylene glycol methyl ether acetate, ethanol/propylene glycol methyl ether acetate, 1-propanol/propylene glycol methyl ether acetate, 2-propanol/propylene glycol methyl ether acetate, propylene glycol monomethyl ether/propylene glycol methyl ether acetate, ethylene glycol monomethyl ether/propylene glycol methyl ether acetate, propylene glycol monoethyl ether/propylene glycol methyl ether acetate, ethylene glycol monoethyl ether/propylene glycol methyl ether acetate, propylene glycol monopropyl ether/propylene glycol methyl ether acetate, and ethylene glycol monopropyl ether/propylene glycol methyl ether acetate.

The mixing ratio of water-soluble organic solvent to substantially water-insoluble organic solvent may be selected as appropriate. Preferably 100 parts by weight of the substantially water-insoluble organic solvent is mixed with 0.1 to 1,000 parts, more preferably 1 to 500 parts, even more preferably 2 to 100 parts by weight of the water-soluble organic solvent.

Subsequently, the reaction solution may be washed with neutral water. The water used herein may be so-called deionized water or ultrapure water. Water is used in an amount of preferably 0.01 to 100 L, more preferably 0.05 to 50 L, even more preferably 0.1 to 5 L per liter of the reaction solution. The washing procedure may be by feeding the reaction solution and water into a common vessel, agitating them, and holding the mixture statically for allowing the water layer to separate. With respect to the number of washing cycles, at least one cycle is sufficient, and 1 to about 5 cycles of washing are preferable because no further effects are obtainable from 10 or more cycles of washing. Other means for removing the acid catalyst include ion exchange resins and neutralization with an epoxy compound such as ethylene oxide or propylene oxide. An appropriate removal means may be selected in accordance with a particular acid catalyst used in the reaction.

During the water washing operation, part of the hydrolytic condensate of silane compounds can escape into the water layer, achieving a substantially equivalent effect to the fractional operation. Thus the number of water washing cycles and the volume of washing water may be selected as appropriate in view of the catalyst removal effect and the fractional effect.

Whether the acid catalyst remains in or the acid catalyst has been removed from the hydrolytic condensate solution, the desired solution is obtained from the hydrolytic condensate solution by adding a final solvent thereto and performing solvent exchange under reduced pressure. The temperature of solvent exchange is preferably 0 to 100° C., more preferably 10 to 90° C., even more preferably 15 to 80° C. depending on the type of reaction solvent and extracting solvent to be removed. The pressure is preferably up to atmospheric, more preferably up to 80 kPa, even more preferably up to 50 kPa in absolute pressure, depending on the type of the extracting solvent to be removed, vacuum unit, condensation unit, and heating temperature.

In some cases, the hydrolytic condensate becomes unstable as a result of solvent exchange. Instability is attributable to the compatibility of the hydrolytic condensate with the final solvent. To prevent instability, a mono-, di- or polyhydric alcohol having a cyclic ether substituent may be added as a stabilizer as described in JP-A 2009-126940, paragraphs [0181]-[0182]. The amount of the stabilizer added is preferably 0 to 25 parts, more preferably 0 to 15 parts, even more preferably 0 to 5 parts by weight per 100 parts by weight of the hydrolytic condensate in the solution prior to the solvent exchange. When added, the amount of the stabilizer is preferably at least 0.5 part by weight. If necessary, a mono-, di- or polyhydric alcohol having a cyclic ether substituent may be added to the solution prior to the solvent exchange, followed by solvent exchange operation.

As the hydrolytic condensate solution is concentrated above a certain concentration, condensation reaction proceeds such that the hydrolytic condensate may sometimes turn to be undissolvable in the organic solvent. With this in mind, it is recommended that the solution is maintained at an appropriate concentration. Also, a solution which is not so thin is economical because the volume of solvent is not excessive. An appropriate concentration is 0.1 to 20% by weight.

The final solvent added to the hydrolytic condensate solution is preferably selected from alcohol solvents, more preferably monoalkyl ether derivatives of alcohols such as ethylene glycol, diethylene glycol, triethylene glycol, propylene glycol, dipropylene glycol, and butanediol. Preferred examples include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether.

As long as any of these solvents is the main component, a non-alcohol solvent may be added as an auxiliary solvent. Suitable auxiliary solvents include acetone, tetrahydrofuran, toluene, hexane, ethyl acetate, cyclohexanone, methyl pentyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

The hydrolytic condensate of silane compounds may also be obtained from hydrolytic condensation of the silane compounds in the presence of a base catalyst. Examples of the base catalyst include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The base catalyst is preferably used in an amount of $10^{-6}$ to 10 moles, more preferably $10^{-5}$ to 5 moles, even more preferably $10^{-4}$ to 1 mole per mole of the silane compounds.

The amount of water used when the hydrolytic condensate is obtained from hydrolytic condensation of silane compounds is preferably 0.1 to 50 moles per mole of hydrolyzable substituent group on the silane compounds. As long as the amount of water is up to 50 moles, the procedure is economical because the reactor is not of extra size.

One exemplary procedure is by adding the silane compounds to an aqueous solution of the catalyst to start hydrolytic condensation reaction. Prior to the reaction, an organic solvent may be added to the catalyst aqueous solution and/or the silane compounds may be diluted with an organic solvent. The reaction temperature is preferably 0 to 100° C., more preferably 5 to 80° C. In one preferred procedure, the reaction system is maintained at a temperature of 5 to 80° C. during dropwise addition of the silane compounds and aged at 20 to 80° C.

Examples of the organic solvent which can be added to the base catalyst aqueous solution or with which the silane compounds can be diluted are the same as the aforementioned examples of the organic solvent which can be added to the acid catalyst aqueous solution. The organic solvent is preferably used in an amount of 0 to 1,000 mL per mole of the silane compounds to ensure that the reaction takes place in an economically acceptable manner.

Thereafter, the base catalyst is neutralized if necessary. The amount of an acidic compound used for neutralization is preferably 0.1 to 2 equivalents relative to the base catalyst. Any acidic compound may be used as long as it exhibits acidity in water.

Subsequently, the alcohol or by-product formed during hydrolytic condensation reaction is preferably removed from the reaction mixture. For by-product removal, the reaction mixture is heated at a temperature under a pressure. The heating temperature is preferably 0 to 100° C., more preferably 10 to 90° C., even more preferably 15 to 80° C., depending on the type of the organic solvent added and the alcohol formed during reaction. The pressure is preferably up to atmospheric, more preferably up to 80 kPa, even more preferably up to 50 kPa in absolute pressure, depending on the type of the organic solvent and alcohol to be removed, vacuum unit, condensation unit, and heating temperature. Although it is difficult to predetermine the amount of alcohol to be removed accurately, it is desirable to remove at least about 80% by weight of the alcohol formed.

Next, the base catalyst used for hydrolytic condensation is removed from the reaction solution, for example, by extracting the silicon-containing compound with an organic solvent. The organic solvent used herein is preferably such that the silicon-containing compound is dissolved in the solvent and a solvent/water mixture separates into two layers. A mixture of water-soluble organic solvent and substantially water-insoluble organic solvent is also useful.

Examples of the organic solvent which can be used for removal of the base catalyst are the same as the aforementioned examples of the organic solvent which can be used for removal of the acid catalyst and the mixture of water-soluble organic solvent and substantially water-insoluble organic solvent.

The mixing ratio of water-soluble organic solvent to substantially water-insoluble organic solvent may be selected as appropriate. Preferably 100 parts by weight of the substantially water-insoluble organic solvent is mixed with 0.1 to 1,000 parts, more preferably 1 to 500 parts, even more preferably 2 to 100 parts by weight of the water-soluble organic solvent.

Subsequently, the reaction solution may be washed with neutral water. The water used herein may be so-called deionized water or ultrapure water. Water is used in an amount of preferably 0.01 to 100 L, more preferably 0.05 to 50 L, even more preferably 0.1 to 5 L per liter of the silicon-containing compound solution. The washing procedure may be by feeding the reaction solution and water into a common vessel, agitating them, and holding the mixture statically for allowing the water layer to separate. At least one cycle of washing is sufficient, and 1 to about 5 cycles of washing are preferable because no further effects are obtainable from 10 or more cycles of washing.

The desired silicon-containing compound solution is obtained by adding a final solvent to the silicon-containing compound solution as washed and performing solvent exchange under reduced pressure. The temperature of solvent exchange is preferably 0 to 100° C., more preferably 10 to 90° C., even more preferably 15 to 80° C. depending on the type of extracting solvent to be removed. The pressure is preferably up to atmospheric, more preferably up to 80 kPa, even more preferably up to 50 kPa in absolute pressure, depending on the type of the extracting solvent to be removed, vacuum unit, condensation unit, and heating temperature.

The final solvent added to the silicon-containing compound solution is preferably selected from alcohol solvents, more preferably monoalkyl ethers of ethylene glycol, diethylene glycol, triethylene glycol, propylene glycol, and dipropylene glycol. Preferred examples include propylene glycol monomethyl ether, ethylene glycol monomethyl ether, propylene glycol monoethyl ether, ethylene glycol monoethyl ether, propylene glycol monopropyl ether, and ethylene glycol monopropyl ether.

Also, the hydrolysate of the silane compound may be prepared by adding water or water-containing organic solvent to the silane compound or silane compound-containing organic solvent and effecting hydrolytic reaction. Prior to reaction, a catalyst may be added to the silane compound or silane compound-containing organic solvent, or water or water-containing organic solvent. The reaction temperature is preferably 0 to 100° C., more preferably 10 to 80° C. The reaction time is preferably 0.5 to 60 hours, more preferably 1 to 50 hours. One preferred procedure involves heating at a temperature of 10 to 50° C. during dropwise addition of water, then heating at 20 to 80° C., and aging at the temperature for 1 to 50 hours.

When the organic solvent is used, water-soluble solvents are preferred. Suitable water-soluble solvents include methanol, ethanol, 1-propanol, 2-propanol, 1-butanol, 2-butanol, 2-methyl-1-propanol, acetone, tetrahydrofuran, acetonitrile, and polyhydric alcohol condensation derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, propylene glycol monopropyl ether, and mixtures thereof.

The amount of the organic solvent used may be the same as described above. The reaction mixture is post-treated by the same technique as described above, obtaining the silicon-containing compound.

The molecular weight of the hydrolytic condensate of the silane compound may be adjusted by selecting a particular silane compound and controlling the reaction conditions during hydrolytic condensation. The hydrolytic condensate preferably has a Mw of up to 100,000, more preferably 200 to 50,000, even more preferably 300 to 30,000. As long as Mw is up to 100,000, neither foreign particles nor coating spots form.

Component (C) is preferably present in an amount of 1 to 60 parts by weight, more preferably 5 to 50 parts by weight per 100 parts by weight of component (A). Component (C) may be used alone or in combination of two or more.

Other Components

To the resist composition, a solvent may be added. The solvent used herein is not particularly limited as long as various components of the resist composition are dissolved therein. Preferably the solvent used herein is identical with the solvent which is finally added during preparation of components (A) and (C). Suitable solvents include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monobutyl ether, 1-butanol, 2-butanol, 2-methyl-1-propanol, 4-methyl-2-pentanol, acetone, tetrahydrofuran, toluene, hexane, ethyl acetate, cyclohexanone, methyl pentyl ketone, propylene glycol dimethyl ether, diethylene glycol dimethyl ether, dipentyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, methyl isobutyl ketone, and cyclopentyl methyl ether.

When the organic solvent is added, it is preferably used in an amount of 100 to 10,000 parts by weight, more preferably 500 to 7,000 parts by weight per 100 parts by weight of component (A). The organic solvent may be used alone or in combination of two or more.

In one embodiment, an acid generator is added to the resist composition. Typical of the acid generator used herein is a photoacid generator (PAG) capable of generating an acid in response to actinic light or radiation. PAG may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Exemplary acid generators are described in U.S. Pat. No. 7,537,880 (JP-A 2008-111103, paragraphs [0122]-[0142]), JP-A 2009-080474, and JP-A 2015-026064. The PAGs may be used alone or in admixture. When used, the acid generator is preferably added in an amount of 0.1 to 50 parts by weight per 100 parts by weight of component (A).

A surfactant is added to the resist composition, if necessary. Suitable surfactants are described in JP-A 2009-126940, paragraph [0129].

Pattern Forming Process

Another embodiment of the invention is a pattern forming process comprising the steps of coating the resist composition onto a substrate, prebaking the composition to form a resist film, exposing the resist film to high-energy radiation, baking, and developing the resist film in a developer.

When the resist composition is used in the fabrication of various integrated circuits and masks, any well-known lithography techniques are applicable. For example, the resist composition is coated onto a substrate for integrated circuit fabrication or a processable layer thereon (e.g., Si, $SiO_2$, SiN, SiON, TiN, WSi, BPSG, SOG, or organic anti-reflective coating) or a substrate for mask circuit fabrication or a processable layer thereon (e.g., Cr, CrO, CrON, $MoSi_2$, or $SiO_2$) by any suitable technique such as spin coating, roll coating, flow coating, dip coating, spray coating or doctor coating. The coating is prebaked on a hot plate at a temperature of 60 to 350° C. for 10 seconds to 30 minutes, preferably 100 to 300° C. for 30 seconds to 20 minutes to form a resist film having a thickness of 0.01 to 2.0 µm.

Next the resist film is exposed imagewise to high-energy radiation directly or through a mask having the desired pattern. The radiation is selected from among excimer laser radiation such as KrF, ArF, Xe, $F_2$ or $Ar_2$ excimer laser radiation, EUV, and EB. The resist composition is adapted to change a solubility in developer upon exposure to high-energy radiation. Upon receipt of exposure energy, the resist composition turns insoluble in organic solvent through the mechanism that organic groups are eliminated and cross-linking reaction takes place. That is, the resist composition functions as negative tone resist material. The high-energy radiation used herein is preferably EUV of wavelength 3 to 15 nm, or EB at an accelerating voltage of 1 to 150 kV, more preferably 5 to 120 kV, even more preferably up to 50 kV, and especially low accelerated EB at an accelerating voltage of up to 10 kV. Preference is given to EUV and EB because EUV and EB have a shorter wavelength and a higher energy density than excimer laser radiation, indicating a higher efficiency of deprotection reaction of organic groups. The dose of high-energy radiation is preferably 1 to 1,000 mJ/cm$^2$, especially 10 to 500 mJ/cm$^2$, or 0.1 to 1,000 μC/cm$^2$, especially 0.5 to 500 μC/cm$^2$.

This is followed by baking (PEB) on a hot plate, preferably at 60 to 350° C. for 10 seconds to 30 minutes, more preferably at 100 to 300° C. for 30 seconds to 20 minutes.

The resist film is then developed in an organic solvent developer, preferably for 0.1 to 3 minutes, more preferably 0.5 to 2 minutes, by any conventional techniques such as dip, puddle and spray techniques. Since the unexposed region of resist film is dissolved in the developer, the desired negative pattern is formed on the substrate. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

EXAMPLE

Examples of the invention are given below by way of illustration and not by way of limitation. The abbreviation "pbw" is parts by weight. Mw is measured versus polystyrene standards by GPC using THF solvent.

[1] Synthesis of Component (A)

Synthesis Example 1-1

To a solution of 284 g of titanium tetraisopropoxide (Tokyo Chemical Industry Co., Ltd.) in 500 g of 2-propanol (IPA), with stirring, a mixture of 27 g of deionized water and 500 g of IPA was added dropwise at room temperature over 2 hours. To the solution, 180 g of 2,4-dimethyl-2,4-octanediol was added, followed by stirring at room temperature for 30 minutes. The solution was concentrated in vacuum at 30° C. The concentrate was further heated to 60° C. and held at the temperature in vacuum until any distillate no longer came out. At the end of distillation, 1,200 g of 4-methyl-2-pentanol (MIBC) was added to the residue, which was heated at 40° C. in vacuum until IPA was no longer distilled out. There was obtained 1,000 g of a MIBC solution of titanium-containing compound A1 (concentration 25 wt %). The compound A1 had a Mw of 1,200.

Synthesis Example 1-2

To a solution of 284 g of titanium tetraisopropoxide (Tokyo Chemical Industry Co., Ltd.) in 500 g of IPA, with stirring, a mixture of 27 g of deionized water and 500 g of IPA was added dropwise at room temperature over 2 hours. To the solution, 120 g of 2-methyl-2,4-pentanediol was added, followed by stirring at room temperature for 30 minutes. The solution was concentrated in vacuum at 30° C. The concentrate was further heated to 60° C. and held at the temperature in vacuum until any distillate no longer came out. At the end of distillation, 1,200 g of MIBC was added to the residue, which was heated at 40° C. in vacuum until IPA was no longer distilled out. There was obtained 1,000 g of a MIBC solution of titanium-containing compound A2 (concentration 20 wt %). The compound A2 had a Mw of 1,100.

Synthesis Example 1-3

To a solution of 40 g of titanium tetrabutoxide tetramer (Tokyo Chemical Industry Co., Ltd.) in 10 g of 1-butanol (BuOH), 24 g of 2,4-dimethyl-2,4-hexanediol was added, followed by stirring at room temperature for 30 minutes. The solution was concentrated in vacuum at 50° C. The concentrate was further heated to 60° C. and held at the temperature in vacuum until any distillate no longer came out. At the end of distillation, 200 g of propylene glycol monomethyl ether acetate (PGMEA) was added to the residue, which was heated at 50° C. in vacuum until BuOH was no longer distilled out. There was obtained 160 g of a PGMEA solution of titanium-containing compound A3 (concentration 25 wt %). The compound A3 had a Mw of 1,000.

Synthesis Example 1-4

To a solution of 243 g of titanium tetrabutoxide tetramer (Tokyo Chemical Industry Co., Ltd.) in 500 g of BuOH, 130 g of pinacol was added, followed by stirring at room temperature for 30 minutes. The solution was concentrated in vacuum at 40° C. The concentrate was further heated to 60° C. and held at the temperature in vacuum until any distillate no longer came out. At the end of distillation, 1,200 g of PGMEA was added to the residue, which was heated at 50° C. in vacuum until BuOH was no longer distilled out. There was obtained 1,000 g of a PGMEA solution of titanium-containing compound A4 (concentration 22 wt %). The compound A4 had a Mw of 1,150.

[2] Synthesis of Component (C)

Synthesis Example 2-1

A mixture of 100 g of 4-chlorostyrene and 220 g of THF was added dropwise to a mixture of 20 g of THF, 17.5 g of magnesium, and 0.2 g of 1,2-dibromoethane. The resulting mixture was held at 55° C. for 4 hours. A mixture of 78.4 g of chlorotrimethylsilane and 200 g of THF was added to the solution, which was held at 40° C. for 2 hours to effect Grignard reaction. At the end of reaction, a mixture of 72.2 g of ammonium chloride, 72.2 g of 20 wt % hydrochloric acid aqueous solution, and 216.6 g of ultrapure water was added dropwise to the reaction solution at 0° C. over 1 hour. Stirring was continued for 24 hours for post-treatment of unreacted components. The salt precipitate was removed by filtration. A mixture of 200 g of hexane and 200 g of deionized water was added to the filtrate, from which an organic layer was collected by separatory operation. The separatory procedure of adding 200 mL of deionized water to the organic layer, stirring the mixture and statically holding the mixture which separated into two layers was repeated 3 times. Thereafter, the product, 4-trimethylsilyl-styrene was recovered from the organic layer by vacuum distillation.

To a mixture of 104 g of 4-trimethylsilylstyrene and 0.76 g of a platinum catalyst PL50N, 75.6 g of methyltrimethoxysilane and 1.5 g of acetic acid were added dropwise at 50° C. over 3 hours. The product, [4-(trimethylsilyl)phenethyl]trimethoxysilane was purified and recovered by vacuum distillation.

A mixture of 59.8 g of iodine monochloride and 220 g of dichloromethane was added dropwise to a mixture of 100 g of [4-(trimethylsilyl)phenethyl]trimethoxysilane and 2,260 g of dichloromethane at 0° C. over 2.5 hours. The resulting solution was added to a mixture of 67.8 g of triethylamine and 53.7 g of methanol, followed by stirring at 25° C. for 1 hour. Hexane, 1,000 g, was added to the solution, with the salt precipitating out. The salt was filtered off and the residual solvent was removed at 30° C. in vacuum. The product was purified by distillation, yielding a silicon-containing compound C1.

Synthesis Example 2-2

A mixture of 50 g of 1-chloro-4-bromobenzene and 110 g of THF was added dropwise to a mixture of 10 g of THF, 6.6 g of magnesium, and 0.1 g of 1,2-dibromoethane. The resulting mixture was held at 60° C. for 2 hours. A mixture of 28.4 g of chlorotrimethylsilane and 90 g of THF was added to the solution, which was held at 40° C. for 2 hours to effect Grignard reaction. At the end of reaction, a mixture of 26.1 g of ammonium chloride, 26.1 g of 20 wt % hydrochloric acid aqueous solution, and 78.3 g of ultrapure water was added dropwise to the reaction solution at 0° C. over 1 hour. Stirring was continued for 24 hours for post-treatment of unreacted components. The salt precipitate was removed by filtration. A mixture of 100 g of hexane and 100 g of deionized water was added to the filtrate, from which an organic layer was collected by separatory operation. The separatory procedure of adding 100 mL of deionized water to the organic layer, stirring the mixture and statically holding the mixture which separated into two layers was repeated 3 times. Thereafter, the product, 1-chloro-4-trimethylsilylbenzene was recovered from the organic layer by vacuum distillation.

A mixture of 33 g of 1-chloro-4-trimethylsilylbenzene and 70 g of THF was added dropwise to a mixture of 10 g of THF, 6.6 g of magnesium and 0.1 g of 1,2-dibromoethane, followed by stirring at 65° C. for 1.5 hours. To this solution, 77.6 g of tetramethoxysilane was added dropwise at 45° C., followed by stirring at 90° C. for 12 hours. Hexane, 100 g, was added to the solution, from which the precipitate was filtered off. The product, 1-trimethoxysilyl-4-trimethylsilylbenzene was recovered by vacuum distillation.

A mixture of 8.4 g of iodine monochloride and 25 g of dichloromethane was added dropwise to a mixture of 15.5 g of 1-trimethoxysilyl-4-trimethylsilylbenzene and 320 g of dichloromethane, followed by stirring at 0° C. for 24 hours. To the resulting solution, a mixture of 11.9 g of triethylamine and 9.4 g of methanol was added dropwise, followed by stirring at 25° C. for 2 hours. The solution was concentrated by removing the solvent at 30° C. in vacuum. Hexane, 200 g, was added to the concentrate, with the salt precipitating out. The salt was filtered off and the residual solvent was removed at 30° C. in vacuum. Impurities were removed by vacuum distillation, yielding a silicon-containing compound C2.

Synthesis Example 2-3

A mixture of 1.65 g of silicon-containing compound C1, 10.2 g of tetramethoxysilane, and 3.8 g of methyltrimethoxysilane was added dropwise to a mixture of 25.2 g of deionized water and 0.18 g of 7 wt % nitric acid at 5° C. over 2 hours. The solution was stirred at 25° C. for 24 hours to effect hydrolytic condensation. At the end of reaction, a mixture of 58.5 g of propylene glycol monoethyl ether (PGEE) and 0.16 g of 24 wt % maleic acid aqueous solution was added to the reaction solution, from which the alcohol by-product was removed in vacuum. To the solution, 160 g of ethyl acetate and 20 g of deionized water were added, and the water layer was separated out. Thereafter, 10 g of deionized water was added to the organic layer, the mixture was stirred, and the mixture was held stationary for phase separation. Then 170 g of PGEE and 0.16 g of 24 wt % maleic acid aqueous solution were added to the organic layer. The solution was concentrated in vacuum, yielding 60 g of a PGEE solution of a silicon-containing compound C3 (concentration 7.7 wt %). The silicon-containing compound C3 had a Mw of 2,150.

Synthesis Example 2-4

A mixture of 10.7 g of tetramethoxysilane, 8.95 g of (4-tert-butoxyphenethyl)trimethoxysilane, and 2.1 g of methyl isobutyl ketone (MIBK) was added dropwise to a mixture of 25.2 g of deionized water and 0.18 g of 7 wt % nitric acid at 0° C. over 1 hour. The solution was stirred at 25° C. for 48 hours to effect hydrolytic condensation. At the end of reaction, a mixture of 60 g of PGEE and 0.23 g of 24 wt % maleic acid aqueous solution was added to the reaction solution, from which the alcohol by-product was removed in vacuum. To the solution, 160 g of ethyl acetate and 20 g of deionized water were added, and the water layer was separated out. Thereafter, 10 g of deionized water was added to the organic layer, the mixture was stirred, and the mixture was held stationary for phase separation. Then 170 g of PGEE and 0.23 g of 24 wt % maleic acid aqueous solution were added to the organic layer. The solution was concentrated in vacuum, yielding 99 g of a PGEE solution of a silicon-containing compound C4 (concentration 9.5 wt %). The silicon-containing compound C4 had a Mw of 3,250.

[3] Preparation of Resist Composition

Examples 1-1 to 1-10 and Comparative Example 1-1

Negative resist compositions were prepared by mixing titanium-containing compound A1 to A4 as component (A), metal salt sensitizer B1 shown below by the formula (B1) as component (B), silicon-containing compound C1 to C4 or phenyltrimethoxysilane as component (C), and a solvent in accordance with the recipe shown in Table 1, and filtering the solution through a fluoroplastic filter having a pore size of 0.1 μm.

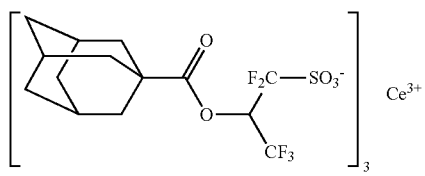
(B1)

TABLE 1

| | Resist | Component A (pbw) | Component B (pbw) | Component C (pbw) | Solvent (pbw) |
|---|---|---|---|---|---|
| Example | 1-1 Resist #1 | A1 (100) | B1 (1) | — | MIBC (2,000) |
| | 1-2 Resist #2 | A2 (100) | B1 (1) | — | MIBC (2,000) |
| | 1-3 Resist #3 | A3 (100) | B1 (1) | — | PGMEA (2,000) |
| | 1-4 Resist #4 | A4 (100) | B1 (1) | — | PGMEA (2,000) |
| | 1-5 Resist #5 | A2 (80) | B1 (1) | C1 (20) | PGMEA (2,000) |
| | 1-6 Resist #6 | A3 (80) | B1 (1) | C1 (20) | PGMEA (2,000) |
| | 1-7 Resist #7 | A3 (80) | B1 (1) | C2 (20) | PGMEA (2,000) |
| | 1-8 Resist #8 | A3 (80) | B1 (1) | C3 (20) | PGMEA (2,000) |
| | 1-9 Resist #9 | A3 (80) | B1 (1) | C4 (20) | PGMEA (2,000) |
| | 1-10 Resist #10 | A4 (80) | B1 (1) | phenyl-trimeth-oxysilane (20) | PGMEA (2,000) |

TABLE 1-continued

| | Resist | Component A (pbw) | Component B (pbw) | Component C (pbw) | Solvent (pbw) |
|---|---|---|---|---|---|
| Comparative Example | 1-1 Comparative Resist #1 | A2 (100) | — | — | MIBC (2,000) |

[4] EB Writing Test (Contrast Curve)

Examples 2-1 to 2-3

Figure 2:
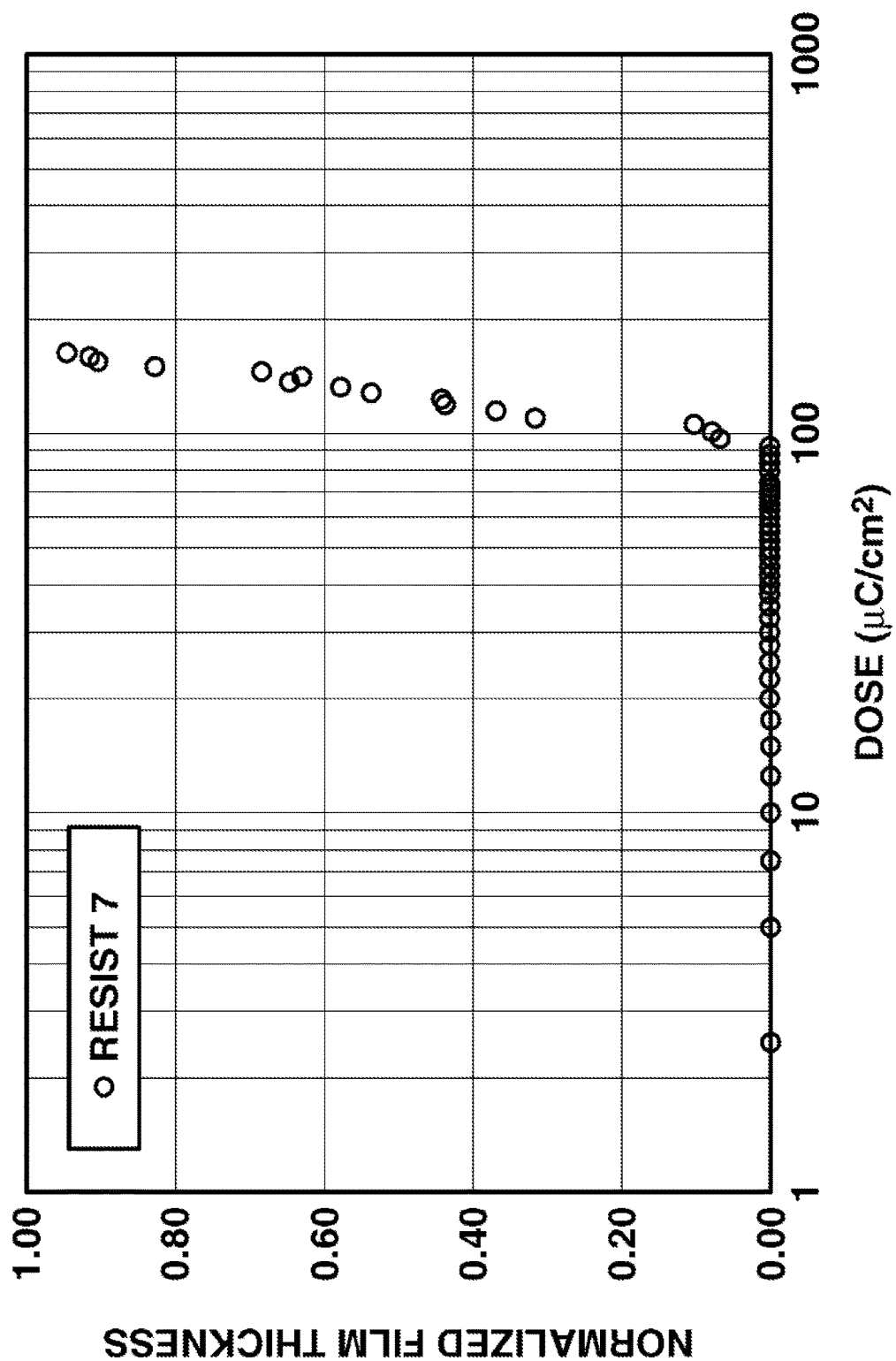
FIG. 2 is a diagram showing a contrast curve of Resist #7 in Example.
Figure 3:
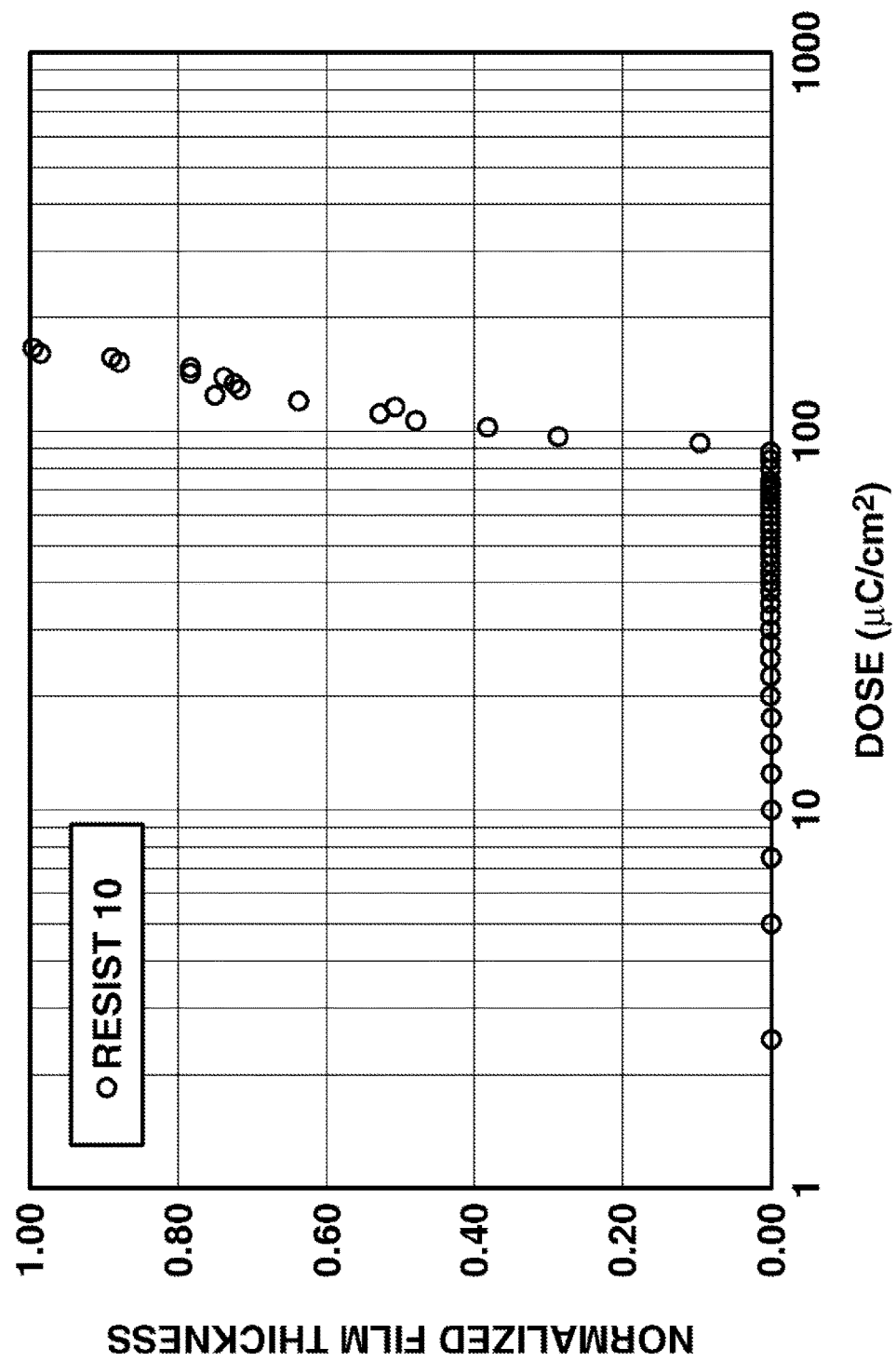
FIG. 3 is a diagram showing a contrast curve of Resist #10 in Example.

A silicon substrate having a diameter of 6 inches was vapor primed with hexamethyldisilazane (HMDS). Using a coater/developer system Clean Track ACT8 (Tokyo Electron Ltd.), Resist #6, #7 or #10 was spin coated onto the primed silicon substrate and prebaked on a hot plate at 180° C. for 60 seconds to form a resist film of 80 nm thick. Using a system JBX-9000MV (JEOL), the resist film was irradiated imagewise with EB at an accelerating voltage of 50 kV in a vacuum chamber in a varying dose of 3 to 160 μC/cm². Using the system Clean Track ACT8, immediately after the imagewise exposure, the resist film was PEB on a hotplate at 200° C. for 60 seconds and puddle developed in butyl acetate for 20 seconds. The thickness of the resist film after development was measured. A contrast curve was drawn by plotting the film thickness relative to the dose. FIGS. 1 to 3 show the contrast curves of Resists #6, #7 and #10 in Examples.

[5] EB Writing Test (Pattern Formation)

Examples 3-1 to 3-10 and Comparative Example 2-1

A silicon substrate having a diameter of 6 inches was vapor primed with HMDS. Using a coater/developer system Clean Track ACT8 (Tokyo Electron Ltd.), the resist composition (Resist #1 to #10 or Comparative Resist #1) was spin coated onto the primed silicon substrate and prebaked on a hot plate at 180° C. for 60 seconds to form a resist film of 60 nm thick. Using a system JBX-9000MV (JEOL), the resist film was irradiated imagewise with EB at an accelerating voltage of 50 kV in a vacuum chamber. Using the system Clean Track ACT8, immediately after the imagewise exposure, the resist film was PEB on a hotplate at the temperature shown in Table 2 for 60 seconds and puddle developed in butyl acetate for 20 seconds, yielding a negative pattern.

The resist pattern was evaluated as follows. Sensitivity was the exposure dose that provided a 1:1 resolution of a 100-nm line-and-space pattern. Resolution was a minimum size at that exposure dose. The 100-nm L/S pattern was measured for line width roughness (LWR) under SEM (Hitachi High-Tech Fielding Corp.). The results are shown in Table 2.

TABLE 2

| | | Resist | PEB temp. (° C.) | Sensitivity (μC/cm²) | Resolution (nm) | LWR (nm) |
|---|---|---|---|---|---|---|
| Example | 3-1 | Resist #1 | 200 | 240 | 65 | 2.3 |
| | 3-2 | Resist #2 | 230 | 250 | 60 | 2.3 |
| | 3-3 | Resist #3 | 180 | 220 | 60 | 2.4 |

TABLE 2-continued

|  |  | Resist | PEB temp. (° C.) | Sensitivity (μC/cm²) | Resolution (nm) | LWR (nm) |
|---|---|---|---|---|---|---|
|  | 3-4 | Resist #4 | 180 | 230 | 65 | 2.3 |
|  | 3-5 | Resist #5 | 200 | 210 | 60 | 2.3 |
|  | 3-6 | Resist #6 | 200 | 180 | 60 | 2.2 |
|  | 3-7 | Resist #7 | 200 | 180 | 60 | 2.2 |
|  | 3-8 | Resist #8 | 200 | 195 | 65 | 2.3 |
|  | 3-9 | Resist #9 | 200 | 185 | 60 | 2.3 |
|  | 3-10 | Resist #10 | 200 | 160 | 60 | 2.2 |
| Comparative Example | 2-1 | Comparative Resist #1 | 230 | 400 | 60 | 2.3 |

As seen from the data in Table 2, the resist compositions within the scope of the invention exhibit a higher sensitivity than the comparative resist composition, while maintaining satisfactory resolution and fully reduced edge roughness.

Japanese Patent Application No. 2018-029264 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A negative resist composition adapted to change a solubility in developer upon exposure to high-energy radiation, consisting of (A) at least one compound selected from a metal compound having the formula (A-1), a hydrolysate of the metal compound having formula (A-1), a hydrolytic condensate of the metal compound having formula (A-1), and the reaction product of the metal compound having formula (A-1), hydrolysate or hydrolytic condensate thereof with a di- or trihydric alcohol having the formula (A-2):

$$R^{A2}O-M^A-OR^{A4} \quad \text{(A-1)}$$
with $OR^{A1}$ and $OR^{A3}$ substituents $$R^{A5}-(OH)_m \quad \text{(A-2)}$$

wherein $M^A$ is Ti, Zr or Hf, $R^{A1}$ to $R^{A4}$ are each independently a $C_1$-$C_{20}$ monovalent organic group optionally having a hydroxyl group, a pair of $R^{A1}$ and $R^{A2}$ may bond together to form a ring with the O and $M^A$ to which they are attached, a pair of $R^{A1}$ and $R^{A2}$ or $R^{A3}$ and $R^{A4}$ may bond together to form a spiro-ring with the O and $M^A$ to which they are attached, $R^{A5}$ is a $C_2$-$C_{20}$ m-valent organic group, m is 2 or 3, (B) a sensitizer containing a compound having the formula (B-1):

$$M^{n+}(X^-)_n \quad \text{(B-1)}$$

wherein $M^{n+}$ is a metal ion selected from the group consisting of Mg, Ca, Ce, Zn, Cu, In, Fe, Yb, Y, Tm, Sn, Ni, Sc, Hf, Nb, Ti, Zr, Ba, Ho, Tb, Lu, La, Ag, Eu, Dy, Gd, Rb, Sr, and Cs, $X^-$ is an alkylsulfonic acid anion, arylsulfonic acid anion, alkylsulfonimidic acid anion or alkylsulfonemethidic acid anion, each having at least one fluorine atom, and n is an integer of 1 to 4, (C) at least one selected from the group consisting of:
at least one compound selected from a silane compound having the formula (C-2), a hydrolysate of the silane compound having formula (C-2), and a hydrolytic condensate of the silane compound having formula (C-2):

$$(R^{C3})_q-Si-(OR^{C4})_{(4-q)} \quad \text{(C-2)}$$

wherein $R^{C3}$ is a $C_1$-$C_{30}$ monovalent organic group substituted with at least one iodine, $R^{C4}$ is $C_1$-$C_6$ alkyl, and q is an integer of 1 to 3, and a hydrolytic condensate of at least one silane compound having the formula (C-1) and at least one silane compound having the formula (C-2):

$$(R^{C1})_p-Si-(OR^{C2})_{(4-p)} \quad \text{(C-1)}$$

$$(R^{C3})_q-Si-(OR^{C4})_{(4-q)} \quad \text{(C-2)}$$

wherein $R^{C1}$ is hydrogen or a $C_1$-$C_{30}$ monovalent organic group free of iodine, $R^{C2}$ is $C_1$-$C_6$ alkyl, $R^{C3}$ is a $C_1$-$C_{30}$ monovalent organic group substituted with at least one iodine, $R^{C4}$ is $C_1$-$C_6$ alkyl, p is an integer of 0 to 3, and q is an integer of 1 to 3, and an organic solvent, and optionally a surfactant.

2. The negative resist composition of claim 1 wherein $X^-$ in formula (B-1) is an anion selected from the following formulae (B-2) to (B-4):

$$R^{B1}-SO_3^- \quad \text{(B-2)}$$

$$R^{B2}-SO_2-N^--SO_2-R^{B3} \quad \text{(B-3)}$$

$$R^{B4}-SO_2-C^-(SO_2-R^{B6})-SO_2-R^{B5} \quad \text{(B-4)}$$

wherein $R^{B1}$ is a $C_5$-$C_{30}$ monovalent hydrocarbon group having at least one fluorine atom, which may contain halogen, thiol, ether, ester, carbonate, carbonyl, amide, amino, azide, carbamate, nitro, cyano, hydroxyl, carboxyl, sulfo, sulfonic acid ester, sultone moiety, lactone ring or lactam ring, $R^{B2}$, $R^{B3}$, $R^{B4}$, $R^{B5}$ and $R^{B6}$ are each independently fluorine, trifluoromethyl, pentafluoroethyl, trifluoroethyl, octafluorobutyl or nonafluorobutyl, $R^{B2}$ and $R^{B3}$ may bond together to form a ring with the $SO_2$ and N to which they are attached.

3. The negative resist composition of claim 2 wherein $X^-$ in formula (B-1) is an anion of the formula (B-4).

4. The negative resist composition of claim 1 wherein the component (C) is at least one compound selected from a silane compound having the formula (C-2), a hydrolysate of the silane compound having formula (C-2), and a hydrolytic condensate of the silane compound having formula (C-2).

5. The negative resist composition of claim 1 wherein the component (C) is a hydrolytic condensate of at least one silane compound having the formula (C-1) and at least one silane compound having the formula (C-2).

6. A pattern forming process comprising the steps of coating the negative resist composition of claim 1 onto a substrate, prebaking the composition to form a resist film, exposing the resist film to high-energy radiation, baking, and developing the resist film in a developer.

7. The process of claim 6 wherein the developer comprises an organic solvent.

8. The process of claim 6 wherein the developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

9. The process of claim 6 wherein the high-energy radiation is EUV of wavelength 3 to 15 nm.

10. The process of claim 6 wherein the high-energy radiation is EB at an accelerating voltage of 1 to 150 kV.

\* \* \* \* \*